US009524725B2

(12) United States Patent
Moriya et al.

(10) Patent No.: US 9,524,725 B2
(45) Date of Patent: Dec. 20, 2016

(54) ENCODING METHOD, ENCODER, PROGRAM AND RECORDING MEDIUM

(71) Applicant: NIPPON TELEGRAPH AND TELEPHONE CORPORATION, Chiyoda-ku (JP)

(72) Inventors: Takehiro Moriya, Kanagawa (JP); Yutaka Kamamoto, Kanagawa (JP); Noboru Harada, Kanagawa (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 0 days.

(21) Appl. No.: 14/423,581

(22) PCT Filed: Sep. 30, 2013

(86) PCT No.: PCT/JP2013/076480
§ 371 (c)(1),
(2) Date: Feb. 24, 2015

(87) PCT Pub. No.: WO2014/054556
PCT Pub. Date: Apr. 10, 2014

(65) Prior Publication Data
US 2015/0187366 A1    Jul. 2, 2015

(30) Foreign Application Priority Data

Oct. 1, 2012 (JP) .................................. 2012-219153

(51) Int. Cl.
*G10L 19/02* (2013.01)
*H03M 7/30* (2006.01)
(Continued)

(52) U.S. Cl.
CPC ............. *G10L 19/02* (2013.01); *G10L 19/032* (2013.01); *G10L 19/20* (2013.01); *G10L 19/265* (2013.01);
(Continued)

(58) Field of Classification Search
USPC .................................................. 704/200–230
See application file for complete search history.

(56) References Cited

U.S. PATENT DOCUMENTS 6,961,698 B1*  11/2005  Gao ..................... G10L 19/167
                                                      341/67
2010/0217584 A1*  8/2010  Hirose ................ G10L 21/0208
                                                      704/206

FOREIGN PATENT DOCUMENTS

WO    2012/046685 A1    4/2012

OTHER PUBLICATIONS

3rd Generation Partnership Project (3GPP), Technical Specification (TS) 26.290, "Extended Adaptive Multi-Rate—Wideband (AMR-WB+) codec; Transcoding functions," Version 10.0.0, Mar. 2011, pp. 1-85.

(Continued)

Primary Examiner — Abul Azad
(74) Attorney, Agent, or Firm — Oblon, McClelland, Maier & Neustadt, L.L.P.

(57) ABSTRACT

Between a method in which an integer signal code is obtained by using an encoding method based on periodicity and a method in which an integer signal code is obtained using an encoding method which is not based on periodicity using an index indicating a degree of periodicity of a sample sequence in a frequency domain, processing of a first coder is executed only in a method for which the number of bits of the integer signal code is expected to be reduced, and a gain obtained through the processing of the first coder in the
(Continued)

method for which the number of bits of the integer signal code is expected to be reduced is utilized in a method for which the number of bits of the integer signal code is not expected to be reduced.

28 Claims, 14 Drawing Sheets

(51) Int. Cl.
    *H03M 7/40*     (2006.01)
    *G10L 19/26*     (2013.01)
    *G10L 19/032*     (2013.01)
    *G10L 19/20*     (2013.01)
    *G10L 19/002*     (2013.01)

(52) U.S. Cl.
    CPC ............. *H03M 7/3059* (2013.01); *H03M 7/40* (2013.01); *G10L 19/002* (2013.01)

(56) References Cited

OTHER PUBLICATIONS

International Search Report issued Dec. 17, 2013 in PCT/JP2013/076480 filed Sep. 30, 2013.

\* cited by examiner

ENCODING METHOD, ENCODER, PROGRAM AND RECORDING MEDIUM

TECHNICAL FIELD

The present invention relates to an encoding technique for an acoustic signal. Particularly, the present invention relates to an encoding technique for a sequence obtained by dividing a sample sequence deriving from an acoustic signal by a gain.

BACKGROUND ART

As a coding method for a speech signal and an acoustic signal of a low bit (for example, approximately from 10 kbit/s to 20 kbit/s), adaptive coding for an orthogonal transform coefficient, such as DFT (Discrete Fourier Transform) and MDCT (Modified Discrete Cosine Transform) is known. For example, AMR-WB+(Extended Adaptive Multi-Rate Wideband) which is a standard technique of Non-patent literature 1, involves a TCX (Transform Coded Excitation) coding mode. In the TCX coding mode, a gain is determined so as to enable encoding of a sequence obtained by dividing each coefficient in a coefficient sequence by a gain for each predetermined number of bits so as to realize coding at a total number of bits provided for each frame, the coefficient sequence being obtained by normalizing an acoustic signal sequence in a frequency domain with a power spectral envelope coefficient sequence.

<Encoder 1000>

A configuration example of an encoder 1000 for conventional TCX coding is shown in FIG. 1. Components in FIG. 1 will be explained below.

<Frequency Domain Transformation Unit 1001>

A frequency domain transformation unit 1001 transforms an input speech acoustic digital signal (hereinafter, an input acoustic signal) in a time domain into a MDCT coefficient sequence $X(1), \ldots, X(N)$ at N points, where N is a positive integer, in a frequency domain for each frame which is a predetermined time segment and outputs the MDCT coefficient sequence.

<Power Spectral Envelope Coefficient Sequence Calculation Unit 1002>

A power spectral envelope coefficient sequence calculation unit 1002 performs linear prediction analysis on the input acoustic signal for each frame to obtain a linear predictive coefficient, and obtains and outputs a power spectral envelope coefficient sequence $W(1), \ldots, W(N)$ of the input acoustic signal at N points using the linear predictive coefficient. Further, the linear predictive coefficient is encoded using, for example, a conventional coding technique, and a predictive coefficient code is transmitted to a decoding side.

<Weighted Envelope Normalizing Unit 1003>

A weighted envelope normalizing unit 1003 normalizes each of the coefficients $X(1), \ldots, X(N)$ of the MDCT coefficient sequence obtained by the frequency domain transformation unit 1001 using the power spectral envelope coefficient sequence $W(1), \ldots, W(N)$ obtained by the power spectral envelope coefficient sequence calculation unit 1002, and outputs the weighted normalized MDCT coefficient sequence $X_N(1), X_N(N)$. Here, in order to realize quantization so as to reduce auditory distortion, the weighted envelope normalizing unit 1003 normalizes each coefficient of the MDCT coefficient sequence for each frame using the weighted power spectral envelope coefficient sequence in which a power spectral envelope is smoothed. As a result, while the weighted normalized MDCT coefficient sequence $X_N(1), \ldots, X_N(N)$ does not have as large slope of an amplitude or as large fluctuation of the amplitude as that of the input MDCT coefficient sequence $X(1), \ldots, X(N)$, the weighted normalized MDCT coefficient sequence $X_N(1), \ldots, X_N(N)$ has a magnitude relationship similar to that of the power spectral envelope coefficient sequence of the input acoustic signal, that is, has a slightly large amplitude in a domain at a coefficient corresponding to a low frequency side and has a microstructure resulting from a pitch period.

<Gain Adjustment Coder 1100>

A gain adjustment coder 1100 outputs an integer signal code and a gain code corresponding to a gain g (global gain) such that the number of bits of the integer signal code becomes as large as possible while being equal to or smaller than the number of allocated bits B which is the number of bits allocated in advance, the integer signal code obtained by encoding the quantized and normalized coefficient sequence $X_Q(1), \ldots, X_Q(N)$ which is a sequence of integer values each obtained by quantizing the result obtained by dividing each coefficient of the input weighted normalized MDCT coefficient sequence $X_N(1), \ldots, X_N(N)$ by the gain g.

The gain adjustment coder 1100 includes an initializing unit 1104, a frequency domain sequence quantizer 1105, a variable-length coder 1106, a decision unit 1107, a gain lower bound setter 1108, a first branching unit 1109, a first gain updating unit 1110, a gain amplifier 1111, a gain upper bound setter 1112, a second branching unit 1113, a second gain updating unit 1114, a gain reducer 1115, a truncation unit 1116 and a gain coder 1117.

<Initializing Unit 1104>

The initializing unit 1104 sets an initial value of the gain g. The initial value of the gain can be determined from energy of the weighted normalization MDCT coefficient sequence $X_N(1), X_N(N)$ and the number of bits allocated in advance to the code output from the variable-length coder 1106. Hereinafter, the number of bits allocated in advance to the code output from the variable-length coder 1106 will be referred to as the number of allocated bits B. Further, the initializing unit 1104 sets 0 as an initial value of the number of times of updating of the gain.

<Frequency Domain Sequence Quantizer 1105>

The frequency domain sequence quantizer 1105 quantizes values obtained by dividing each coefficient of the weighted normalized MDCT coefficient sequence $X_N(1), X_N(N)$ by the gain g and obtains and outputs the quantized and normalized coefficient sequence $X_Q(1), X_Q(N)$ which is a sequence of integer values.

<Variable-Length Coder 1106>

The variable-length coder 1106 performs variable-length encoding of the input quantized and normalized coefficient sequence $X_Q(1), \ldots, X_Q(N)$ to obtain a code and outputs the code. This code is referred to as an integer signal code. This variable-length encoding is performed using, for example, a method in which a plurality of coefficients in the quantized and normalized coefficient sequence are collectively encoded. Further, the variable-length coder 1106 counts the number of bits of the integer signal code obtained through the variable-length encoding. Hereinafter, this number of bits will be referred to as the number of consumed bits c.

<Decision Unit 1107>

The decision unit 1107 outputs the gain, the integer signal code and the number of consumed bits c if the number of times of updating of the gain is a predetermined number of times, or if the number of consumed bits c counted by the variable-length coder 1106 is equal to the number of allocated bits B.

If the number of times of updating of the gain is smaller than the predetermined number of times, it is controlled that, if the number of consumed bits c counted by the variable-length coder 1106 is larger than the number of allocated bits B, the gain lower bound setter 1108 performs the following processing, and, if the number of consumed bits c counted by the variable-length coder 1106 is smaller than the number of allocated bits B, the gain upper bound setter 1112 performs the following processing.

<Gain Lower Bound Setter 1108>

The gain lower bound setter 1108 sets a value of the current gain g as a gain lower bound $g_{min}$ ($g_{min} \leftarrow g$). This gain lower bound $g_{min}$ means that the value of the gain should be at least this value or greater.

<First Branching Unit 1109>

Next, the first branching unit 1109 performs control so that if a gain upper bound $g_{max}$ has been already set, the first gain updating unit 1110 performs the following processing, otherwise, the gain amplifier 1111 performs the following processing. Further, the first branching unit 1109 adds 1 to the number of times of updating of the gain.

<First Gain Updating Unit 1110>

The first gain updating unit 1110 sets, for example, an average value of the value of the current gain g and the gain upper bound $g_{max}$ as a new value of the gain g ($g \leftarrow (g+g_{max})/2$), because an optimal gain value exists between the value of the current gain g and the gain upper bound $g_{max}$. Because the value of the current gain g is set as the gain lower bound $g_{min}$, it can be said that an average value of the gain upper bound $g_{max}$ and the gain lower bound $g_{min}$ is set as a new value of the gain g ($g \leftarrow (g_{max}+g_{mm})/2$). The newly set gain g is input to the frequency domain sequence quantizer 1105.

<Gain Amplifier 1111>

The gain amplifier 1111 sets a value greater than the value of the current gain g as a new value of the gain g. For example, a value obtained by adding a gain change amount Δg which is a positive value defined in advance to the value of the current gain g is set as a new value of the gain g ($g \leftarrow g+\Delta g$). Further, for example, if the gain upper bound $g_{max}$ is not set and a case occurs a plurality of times in which the number of consumed bits c is larger than the number of allocated bits B, a value greater than the value defined in advance is used as the gain change amount Δg. The newly set gain g is input to the frequency domain sequence quantizer 1105.

<Gain Upper Bound Setter 1112>

The gain upper bound setter 1112 sets the value of the current gain g as the gain upper bound $g_{max}$ ($g_{max} \leftarrow g$). This gain upper bound $g_{max}$ means that the value of the gain should be at least this value or smaller.

<Second Branching Unit 1113>

Next, the second branching unit 1113 performs control so that if the gain lower bound $g_{min}$ has been already set, the second gain updating unit 1114 performs the following processing, otherwise, the gain reducer 1115 performs the following processing. Further, the second branching unit 1113 adds 1 to the number of times of updating of the gain.

<Second Gain Updating Unit 1114>

The second gain updating unit 1114 sets, for example, an average value of the value of the current gain g and the gain lower bound $g_{min}$ as a new value of the gain g ($g \leftarrow (g+g_{min})/2$), because an optimal gain value exists between the value of the current gain g and the gain lower bound $g_{min}$. Because the value of the current gain g is set as the gain upper bound $g_{max}$, it can be said that an average value of the gain upper bound $g_{max}$ and the gain lower bound $g_{min}$ is set as a new value of the gain g ($g \leftarrow (g_{max}+g_{min})/2$). The newly set gain g is input to the frequency domain sequence quantizer 1105.

<Gain Reducer 1115>

The gain reducer 1115 sets a value smaller than the value of the current gain g as a new value of the gain g. For example, a value obtained by subtracting a gain change amount Δg which is a positive value defined in advance from the value of the current gain g is set as a new value of the gain g ($g \leftarrow g-\Delta g$). Further, for example, if the gain lower bound $g_{min}$ is not set and a case occurs a plurality of times in which the number of consumed bits c is smaller than the number of allocated bits B, a value greater than the value defined in advance is used as the gain change amount Δg. The newly set gain g is input to the frequency domain sequence quantizer 1105.

<Truncation Unit 1116>

If the number of consumed bits c output from the decision unit 1107 is larger than the number of allocated bits B, the truncation unit 1116 removes a code corresponding to the number of bits by which the number of consumed bits c exceeds the number of allocated bits B from a code corresponding to the quantized and normalized coefficients at a higher frequency side in the integer signal code output from the decision unit 1107 and outputs the resultant as a new integer signal code. For example, the truncation unit 1116 outputs as a new integer signal code, the remaining code obtained by removing the code corresponding to the quantized and normalized coefficients at a higher frequency side corresponding to the number of bits c-B by which the number of consumed bits c exceeds the number of allocated bits B from the integer signal code. Meanwhile, if the number of consumed bits c output from the decision unit 1107 is not larger than the number of allocated bits B, the truncation unit 1116 outputs the integer signal code output from the decision unit 1107.

<Gain Coder 1117>

The gain coder 1117 encodes the gain output from the decision unit 1107 using a predetermined number of bits to obtain a gain code and outputs the gain code.

Meanwhile, as a method for efficiently performing variable-length encoding of an integer signal, there is an encoding method based on periodicity disclosed in Patent literature 1. In this method, the quantized and normalized coefficient sequence is rearranged so that one or a plurality of successive samples comprising a sample corresponding to a basic frequency and one or a plurality of successive samples comprising a sample corresponding to an integral multiple of the basic frequency are gathered, and variable-length encoding is performed on the rearranged sample sequence to obtain an integer signal code. By this means, a change of the amplitude between adjacent samples becomes small, so that it is possible to improve efficiency of variable-length encoding.

Further, Patent literature 1 discloses a method of obtaining an integer signal code by selecting a method which realizes a smaller number of bits of the integer signal code or a method which is expected to realize a smaller number of bits of the integer signal code, between an encoding method based on periodicity in which an integer signal code is obtained by performing variable-length encoding of the rearranged sample sequence and an encoding method which is not based on periodicity and in which an integer signal code is obtained by performing variable-length encoding of a sample sequence before rearrangement. By this means, it is possible to obtain an integer signal code with a smaller number of bits under the same encoding distortion.

PRIOR ART LITERATURE

Patent Literature

Patent literature 1: International Publication No. WO 2012/046685

Non-Patent Literature

Non-patent literature 1: 3rd Generation Partnership Project (3GPP), Technical Specification (TS) 26.290, "Extended Adaptive Multi-Rate-Wideband (AMR-WB+) codec; Transcoding functions", Version 10.0.0 (2011-03)

SUMMARY OF THE INVENTION

Problems to be Solved by the Invention

With the conventional technique disclosed in Patent literature 1, a gain is determined before variable-length encoding both in a case where an integer signal code is obtained using an encoding method based on periodicity and in a case where an integer signal code is obtained using an encoding method which is not based on periodicity. Therefore, while it is possible to reduce the number of bits of the integer signal code under the same distortion, it is not taken into account to realize both reduction of the number of bits by variable-length encoding and reduction of quantization distortion by using as small a gain value as possible under the conditions that the code amount is kept within the given number of bits.

In order to reduce distortion due to variable-length encoding, it is necessary to combine the conventional technique disclosed in Patent literature 1 with the conventional technique disclosed in Non-patent literature 1.

However, with the combined method, it is necessary to perform the above-described processing of the gain adjustment coder each in the encoding method based on periodicity and in the encoding method which is not based on periodicity, which causes a problem that the amount of operation processing becomes extremely large.

Means to Solve the Problems

To solve the above-described problem, in the present invention, between a method in which an integer signal code is obtained by performing variable-length encoding of a sample sequence using an encoding method based on periodicity and a method in which an integer signal code is obtained by performing variable-length encoding of a sample sequence using an encoding method which is not based on periodicity, processing of the gain adjustment coder is executed only in the method for which the number of bits of the integer signal code is expected to be reduced, and a gain obtained through the processing of the gain adjustment coder in the method for which the number of bits of the integer signal code is expected to be reduced is utilized in the method for which the number of bits of the integer signal code is not expected to be reduced.

Effects of the Invention

According to the present invention, it is possible to realize both reduction of quantization distortion by using as small a gain value as possible and reduction of the number of bits of the integer signal code obtained through variable-length encoding under the conditions that the code amount is kept within a given number of bits, with a small amount of operation processing.

DETAILED DESCRIPTION OF THE EMBODIMENTS

Figure 1:
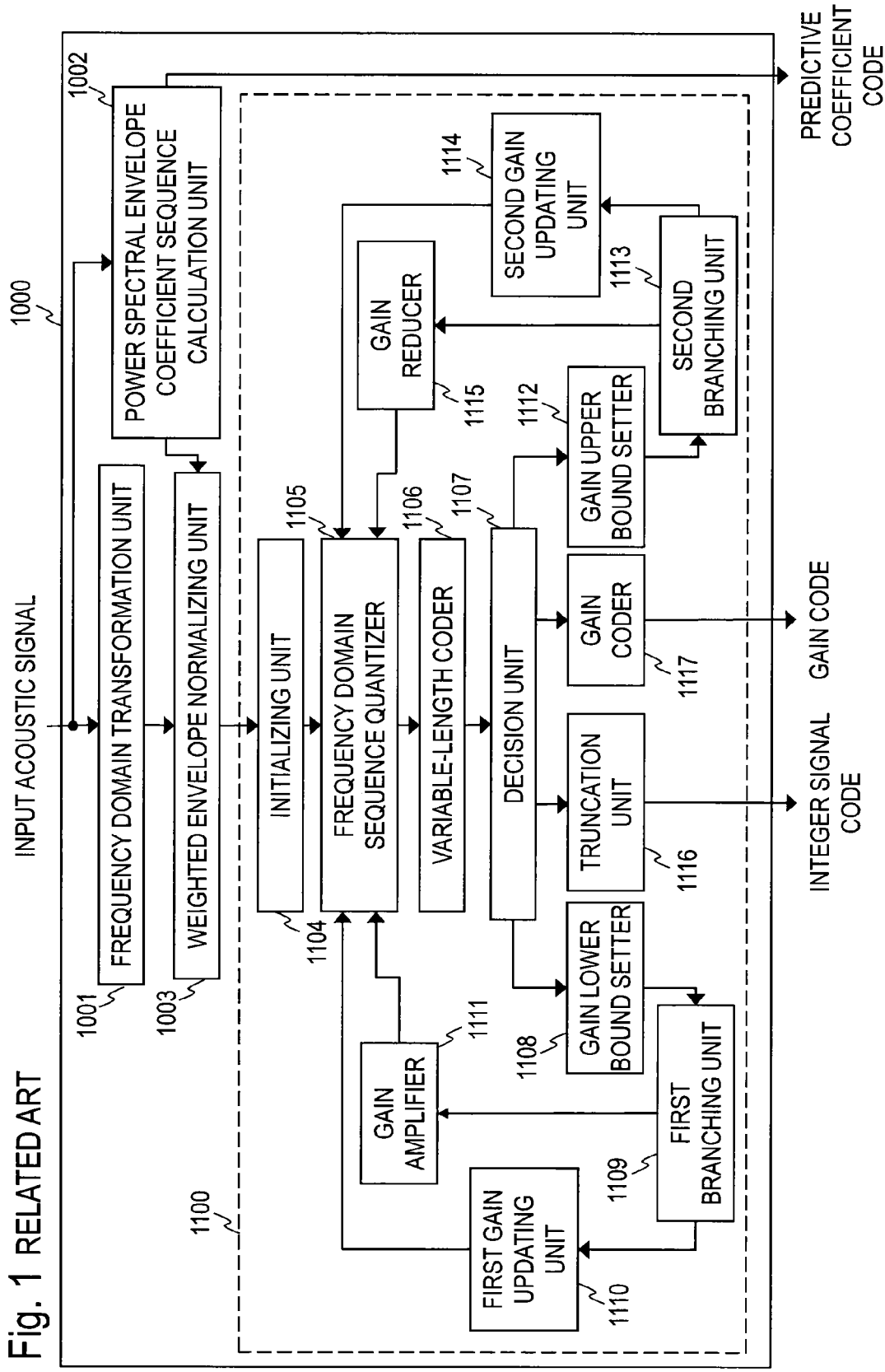
FIG. 1 is a block diagram illustrating a configuration of a conventional encoder.

Embodiments of the present invention will be explained with reference to the drawings. It should be noted that the same reference numerals are assigned to the overlapped components and the explanation thereof will be omitted.

First Embodiment

Encoder 100

Encoding processing performed by an encoder 100 of the first embodiment will be explained with reference to FIG. 2 and FIG. 3.

<Frequency Domain Transformation Unit 1001>

A frequency domain transformation unit 1001 transforms an input acoustic digital signal (hereinafter, an input acoustic signal) in a time domain into a MDCT coefficient sequence $X(1), \ldots, X(N)$ at N points, where N is a positive integer, in a frequency domain for each frame which is a predetermined time segment and outputs the MDCT coefficient sequence.

<Power Spectral Envelope Coefficient Sequence Calculation Unit 1002>

A power spectral envelope coefficient sequence calculation unit 1002 performs linear prediction analysis on the input acoustic signal for each frame to obtain a linear predictive coefficient, and obtains and outputs a power spectral envelope coefficient sequence W(1), . . . , W(N) at N points of the input acoustic signal using the linear predictive coefficient. Each of the coefficients W(1), . . . , W(N) of the power spectral envelope coefficient sequence at N points can be obtained by transforming the linear predictive coefficient into a frequency domain. For example, through a p-th order autoregressive process which is an all-pole model (where p is a positive integer), an input acoustic signal x(t) at time t can be expressed by Formula (1) using values x(t−1), . . . , x(t−p) of the input acoustic signal in the past at a time point p, a prediction residual e(t) and linear predictive coefficients $\alpha_1, \ldots, \alpha_p$. At this time, each coefficient W(n) [1≤n≤N] of the power spectral envelope coefficient sequence can be expressed by Formula (2), where exp(•) is an exponential function to the base Napier number, j is an imaginary unit and $\sigma^2$ is a prediction residual energy.

$$x(t) + \alpha_1 x(t-1) + \ldots + \alpha_p x(t-p) = e(t) \quad (1)$$

$$W(n) = \frac{\sigma^2}{2\pi} \frac{1}{|1 + \alpha_1 \exp(-jn) + \alpha_2 \exp(-2jn) + \ldots + \alpha_p \exp(-pjn)|^2} \quad (2)$$

Instead of the power spectral envelope coefficient sequence calculation unit 1002 obtaining a linear predictive coefficient, another part within the encoder 100, which is not illustrated, may obtain a linear predictive coefficient. Further, because it is necessary for a decoder to obtain the same value as a value obtained at the encoder 100, a quantized linear predictive coefficient and/or a power spectral envelope coefficient sequence are utilized. In the following description, unless otherwise noted, a "linear predictive coefficient" and a "power spectral envelope coefficient sequence" respectively mean a quantized linear predictive coefficient and a power spectral envelope coefficient sequence. Further, the linear predictive coefficient is encoded using, for example, a conventional coding technique, and its predictive coefficient code is transmitted to a decoding side. The conventional coding technique comprises, for example, a coding technique in which a code corresponding to the linear predictive coefficient itself is used as the predictive coefficient code, a coding technique in which the linear predictive coefficient is converted into an LSP parameter, and a code corresponding to the LSP parameter is used as the predictive coefficient code, and a coding technique in which a linear predictive coefficient is converted into a PARCOR coefficient, and a code corresponding to the PARCOR coefficient is used as the predictive coefficient code.

<Weighted Envelope Normalizing Unit 1003>

A weighted envelope normalizing unit 1003 normalizes each of the coefficients X(1), . . . , X(N) of the MDCT coefficient sequence obtained by the frequency domain transformation unit 1001 using the power spectral envelope coefficient sequence W(1), . . . , W(N) obtained by the power spectral envelope coefficient sequence calculation unit 1002 and outputs the weighted normalized MDCT coefficient sequence $X_N(1), X_N(N)$. Here, in order to realize quantization in which auditory distortion is reduced, the weighted envelope normalizing unit 1003 normalizes each coefficient of the MDCT coefficient sequence for each frame using the weighted power spectral envelope coefficient sequence in which a power spectral envelope is smoothed. As a result, while the weighted normalized MDCT coefficient sequence $X_N(1), X_N(N)$ does not have as large slope of an amplitude or as large fluctuation of the amplitude as that of the input MDCT coefficient sequence X(1), . . . , X(N), the weighted normalized MDCT coefficient sequence $X_N(1), X_N(N)$ has a magnitude relationship similar to that of the power spectral envelope coefficient sequence of the input acoustic signal, that is, has a slightly large amplitude in a domain at a coefficient corresponding to a low frequency side and has a microstructure resulting from a pitch period.

[Specific Example of Weighted Envelope Normalization Processing]

While two examples will be described here as a specific example of the weighted envelope normalization processing, the present invention is not limited to these examples.

<Example 1>

The weighted envelope normalizing unit 1003 performs processing of obtaining each of coefficients $X(1)/W_\gamma(1)$, $X(N)/W_\gamma(N)$ of the weighted normalized MDCT coefficient sequence by dividing each of the coefficients X(1), . . . , X(N) of the MDCT coefficient sequence by correction values $W_\gamma(1), \ldots, W_\gamma(N)$ of each of the coefficients W(1), . . . , W(N) of the power spectral envelope coefficient sequence corresponding to each coefficient. The correction value $W_\gamma(n)[1≤n≤N]$ can be given by Formula (3). In the formula, γ is a positive constant of 1 or less, which smoothes the power spectrum coefficient.

$$W_\gamma(n) = \frac{\sigma^2}{2\pi\left(1 + \sum_{i=1}^{p} \alpha_i \gamma^i \exp(ijn)\right)^2} \quad (3)$$

<Example 2>

The weighted envelope normalizing unit 1003 performs processing of obtaining each of coefficients $X(1)/W(1)^\beta$, $X(N)/W(N)^\beta$ of the weighted normalized MDCT coefficient sequence by dividing each of the coefficients X(1), . . . , X(N) of the MDCT coefficient sequence by values $W(1)^\beta, \ldots, W(N)^\beta$ which are the β power (0<β<1) of the coefficients W(1), . . . , W(N) of the power spectral envelope coefficient sequence corresponding to each coefficient.

As a result, the weighted normalized MDCT coefficient sequence for each frame can be obtained. While the weighted normalized MDCT coefficient sequence does not have as large slope of an amplitude or as large fluctuation of the amplitude as that of the input MDCT coefficient sequence, the weighted normalized MDCT coefficient sequence has a magnitude relationship similar to that of the power spectral envelope of the input MDCT coefficient sequence, that is, has a slightly large amplitude in a domain at a coefficient side corresponding to a low frequency and has a microstructure resulting from a pitch period.

It should be noted that because inverse processing corresponding to the weighted envelope normalization processing, that is, processing for restoring the MDCT coefficient sequence from the weighted normalized MDCT coefficient sequence is performed at a decoding side, it is necessary to make common settings for a method for calculating a weighted power spectral envelope coefficient sequence from a power spectral envelope coefficient sequence between the encoding side and the decoding side.

<Rearrangement Unit 110>

While the weighted normalized MDCT coefficient sequence for each frame obtained at the weighted envelope normalizing unit 1003 is input to the rearrangement unit 110, the input to the rearrangement unit 110 is not limited to the weighted normalization MDCT coefficient sequence obtained at the weighted envelope normalizing unit 1003. To explicitly indicate this, input to the rearrangement unit 110 will be hereinafter referred to as a "sample sequence in a frequency domain" deriving from an acoustic signal, or simply a "sample sequence". In this embodiment, the weighted normalized MDCT coefficient sequence obtained at the weighted envelope normalizing unit 1003 corresponds to a "sample sequence in a frequency domain", and, in this case, samples constituting the sample sequence in a frequency domain correspond to coefficients comprised in the weighted normalized MDCT coefficient sequence.

The rearrangement unit 110 outputs as the rearranged sample sequence, a sample sequence (1) which comprises all samples of the sample sequence in the frequency domain and (2) in which at least part of samples comprised in the sample sequence in the frequency domain are rearranged so that samples having an equal or the same degree of an index which reflects a magnitude of the sample are gathered, or outputs the input sample sequence as a sample sequence before rearrangement. Here, the "index which reflects a magnitude of the sample" is, for example, an absolute value or a power (square value) of the amplitude of the sample, but not limited to these.

[Details of Rearrangement Processing]

A specific example of the rearrangement processing will be described. For example, the rearrangement unit 110 uses as the rearranged sample sequence, a sample sequence (1) which comprises all the samples of the sample sequence and (2) in which at least part of samples comprised in the sample sequence are rearranged so that all or part of one or a plurality of successive samples comprising a sample corresponding to periodicity or a basic frequency of an acoustic signal in the sample sequence and one or a plurality of successive samples comprising a sample corresponding to an integral multiple of the periodicity or the basic frequency of the acoustic signal in the sample sequence are gathered. That is, samples of at least part of the input sample sequence are rearranged so that one or a plurality of successive samples comprising a sample corresponding to the periodicity or the basic frequency of the acoustic signal and one or a plurality of successive samples comprising a sample corresponding to the integral multiple of the periodicity or the basic frequency of the acoustic signal are gathered.

This is because an acoustic signal, particularly, speech, music sound, or the like, has outstanding characteristics that absolute values or powers of amplitudes of the samples corresponding to the basic frequency and a harmonic (a wave of an integral multiple of the basic frequency) and samples in the vicinity are larger than absolute values or powers of amplitudes of the samples corresponding to a frequency domain other than the basic frequency and the harmonic. Here, because a characteristic amount (for example, a pitch period) of periodicity of an acoustic signal extracted from an acoustic signal such as speech and music sound is equivalent to the basic frequency, it can be acknowledged that the acoustic signal has characteristics that absolute values or powers of the amplitudes of the samples corresponding to the characteristic amount (for example, a pitch period) of the periodicity of the acoustic signal and the integral multiple thereof and the samples in the vicinity are larger than the absolute values or the powers of the amplitudes of the samples corresponding to a frequency domain other than the characteristic amount of the periodicity and the integral multiple thereof.

One or a plurality of successive samples comprising a sample corresponding to periodicity or the basic frequency of the acoustic signal and one or a plurality of successive samples comprising a sample corresponding to the integral multiple of the periodicity or the basic frequency of the acoustic signal are gathered as a group at a lower frequency side. Hereinafter, an interval between the sample corresponding to periodicity or the basic frequency of the acoustic signal and the sample corresponding to the integral multiple of the periodicity or the basic frequency of the acoustic signal (hereinafter, simply referred to as an interval) is represented by T.

As a specific example, the rearrangement unit 110 selects three samples $F(nT-1)$, $F(nT)$ and $F(nT+1)$ comprising samples $F(nT-1)$ and $F(nT+1)$ before and after the sample $F(nT)$ corresponding to the integral multiple of the interval T from the input sample sequence. $F(j)$ is a sample corresponding to number j indicating a sample index corresponding to a frequency. n is an integer falling within a range where 1 to nT+1 do not exceed an upper bound N of a target sample set in advance. n=1 corresponds to the basic frequency, and n>1 corresponds to the harmonic. A maximum value of the number j indicating the sample index corresponding to the frequency is set as jmax. A group of samples selected according to n is referred to as a sample group. While the upper bound N may be made equal to jmax, because it is often the case that in an acoustic signal such as speech and music sound, an index of a sample in a high frequency is typically sufficiently small, N may be smaller than jmax so that samples having large indices are gathered at a lower frequency side to improve coding efficiency, which will be described later. For example, N may be a value about half of jmax. When a maximum value of n determined based on the upper bound N is indicated as nmax, samples corresponding to frequencies from the lowest frequency to a first predetermined frequency nmax×T+1 become a target of rearrangement among the samples comprised in the input sample sequence. Symbol × indicates multiplication.

The rearrangement unit 110 sequentially arranges the selected samples $F(j)$ from the head of the sample sequence while maintaining the magnitude relationship of the original number j to generate a sample sequence U. For example, when n indicates each integer from 1 to 5, the rearrangement unit 110 rearranges a first sample group $F(T-1)$, $F(T)$ and $F(T+1)$, a second sample group $F(2T-1)$, $F(2T)$ and $F(2T+1)$, a third sample group $F(3T-1)$, $F(3T)$ and $F(3T+1)$, a fourth sample group $F(4T-1)$, $F(4T)$ and $F(4T+1)$ and a fifth sample group $F(5T-1)$, $F(5T)$ and $F(5T+1)$ from the head of the sample sequence. That is, fifteen samples $F(T-1)$, $F(T)$, $F(T+1)$, $F(2T-1)$, $F(2T)$, $F(2T+1)$, $F(3T-1)$, $F(3T)$, $F(3T+1)$, $F(4T-1)$, $F(4T)$, $F(4T+1)$, $F(5T-1)$, $F(5T)$ and $F(5T+1)$ are arranged from the head of the sample sequence in this order and these fifteen samples constitute the sample sequence U.

Further, the rearrangement unit 110 sequentially arranges samples $F(j)$ which are not selected from the end of the sample sequence U while maintaining the magnitude relationship of the original number. The samples $F(j)$ which are not selected are samples positioned between the sample groups constituting the sample sequence U, and such a group of successive samples is referred to as a sample set. That is, in the above-described example, a first sample set $F(1)$, $F(T-2)$, a second sample set $F(T+2)$, $F(2T-2)$, a third sample set $F(2T+2)$, $F(3T-2)$, a fourth sample set $F(3T+2)$, $F(4T-2)$, a fifth sample set $F(4T+2)$, $F(5T-2)$, and a sixth sample set $F(5T+2)$, $F(jmax)$ are sequentially arranged from the end of the sample sequence U, and these samples constitute a sample sequence V.

Figure 8:
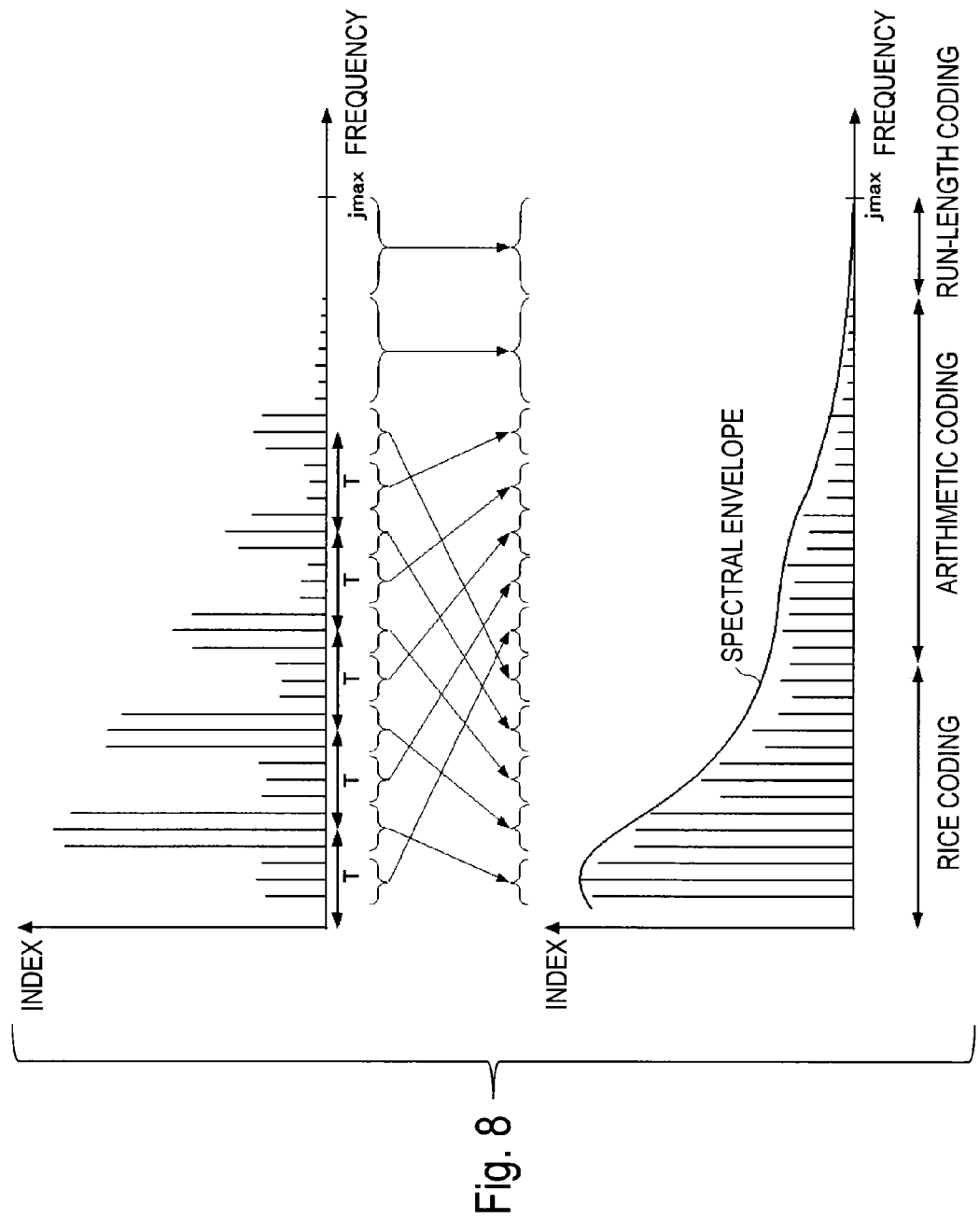
FIG. 8 is a conceptual diagram for explaining an example of rearrangement of samples comprised in a sample sequence.

In conclusion, in this example, the input sample sequence F(j) (1≤j≤jmax) is rearranged as F(T−1), F(T), F(T+1), F(2T−1), F(2T), F(2T+1), F(3T−1), F(3T), F(3T+1), F(4T−1), F(4T), F(4T+1), F(5T−1), F(5T), F(5T+1), F(1), ..., F(T−2), F(T+2), F(2T−2), F(2T+2), F(3T−2), F(3T+2), F(4T−2), F(4T+2), F(5T−2), F(5T+2), F(jmax) (see FIG. 8).

It should be noted that, it is often the case that, in a low frequency range, values of amplitudes and powers of samples other than the sample corresponding to the periodicity or the basic frequency of the acoustic signal and the sample of the integer multiple thereof are large. Therefore, samples corresponding to frequencies from the lowest frequency to a predetermined frequency f may not be rearranged. For example, if the predetermined frequency f is nT+α, samples F(1), ..., F(nT+α) before rearrangement are not rearranged and samples after F(nT+α+1) before rearrangement are set as a target of rearrangement. α is set in advance to be an integer of 0 or greater and smaller than T to some extent (for example, an integer that does not exceed T/2). Here, n may be an integer of 2 or greater. Alternatively, p samples F(1), F(P) successive from the sample corresponding to the lowest frequency before rearrangement may not be rearranged, and samples after F(P+1) before rearrangement may be set as a target of rearrangement. In this case, the predetermined frequency f is P. A criterion of rearrangement with respect to a group of samples which are set as a target of rearrangement is as described above. It should be noted that if the first predetermined frequency is set, the predetermined frequency f (second predetermined frequency) is smaller than the first predetermined frequency.

Figure 9:
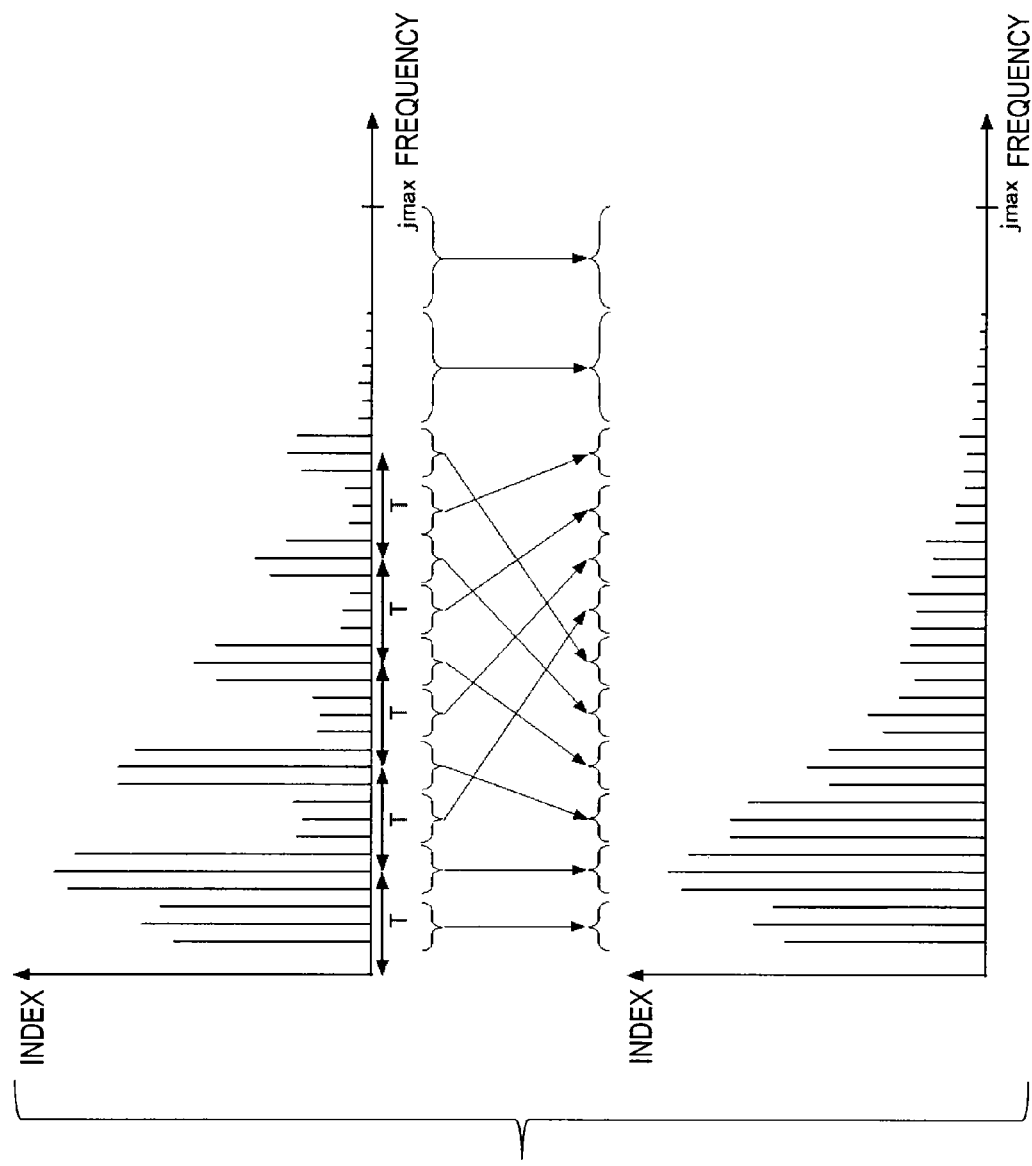
FIG. 9 is a conceptual diagram for explaining an example of rearrangement of samples comprised in the sample sequence.

For example, if the samples F(1), ..., F(T+1) before rearrangement are not rearranged and samples after F(T+2) before rearrangement are set as a target of rearrangement, if the above-described criterion of rearrangement is applied, the input sample sequence F(j) (1≤j≤jmax) is rearranged as F(1), ..., F(T+1), F(2T−1), F(2T), F(2T+1), F(3T−1), F(3T), F(3T+1), F(4T−1), F(4T), F(4T+1), F(5T−1), F(5T), F(5T+1), F(T+2), F(2T−2), F(2T+2), F(3T−2), F(3T+2), ..., F(4T−2), F(4T+2), ..., F(5T−2), F(5T+2), ..., F(jmax) (see FIG. 9).

An upper bound N or a first predetermined frequency which determines a maximum value of the number j which is a target of rearrangement may be set different for each frame instead of being common to all frames. In this case, it is only necessary to transmit information indicating the upper bound N or the first predetermined frequency for each frame to the decoding side. Further, it is also possible to designate the number of sample groups to be rearranged instead of designating the maximum value of the number j which is a target of rearrangement, and, in this case, the number of sample groups may be set for each frame and information indicating the number of sample groups may be transmitted to the decoding side. Of course, the number of sample groups to be rearranged may be made common to all frames. Further, the second predetermined frequency f may be also set different for each frame instead of being common to all the frames. In this case, it is only necessary to transmit information indicating the second predetermined frequency for each frame to the decoding side.

The sample sequence rearranged in this manner exhibits tendency that an envelope of an index of a sample declines in accordance with increase of a frequency when the horizontal axis indicates the frequency and the vertical axis indicates the index of the sample, because there is a fact that the acoustic signal, particularly, a speech signal and a music signal has characteristics that the sample sequence in the frequency domain typically has a few high frequency component. In other words, it can be said that the rearrangement unit 110 rearranges at least part of samples comprised in the input sample sequence so that the envelope of the index of the sample declines in accordance with increase of a frequency. It should be noted that FIG. 8 and FIG. 9 illustrate an example where all the samples comprised in the sample sequence in the frequency domain take positive values in order to illustrate that samples having larger amplitudes are disproportionately placed at a lower frequency side by the rearrangement of the samples. Actually, it is often the case that the samples comprised in the sample sequence in the frequency domain take positive, negative or zero value. Also in such a case, it is only necessary to execute the above-described rearrangement processing or rearrangement processing which will be described later.

Further, while, in this embodiment, rearrangement is performed so that one or a plurality of successive samples comprising a sample corresponding to the periodicity or the basic frequency and one or a plurality of successive samples comprising a sample corresponding to the integral multiple of the periodicity or the basic frequency are gathered at a lower frequency side, inversely, it is also possible to perform rearrangement so that one or a plurality of successive samples comprising a sample corresponding to the periodicity or the basic frequency and one or a plurality of successive samples comprising a sample corresponding to the integral multiple of the periodicity or the basic frequency are gathered at a higher frequency side. In this case, in the sample sequence U, the sample groups are arranged in the inverse order, in the sample sequence V, the sample sets are arranged in the inverse order, the sample sequence V is arranged at a lower frequency side, and the sample sequence U is arranged after the sample sequence V. That is, when this is applied to the above-described example, the samples are arranged in the order of the sixth sample set F(5T+2), F(jmax), the fifth sample set F(4T+2), ..., F(5T−2), the fourth sample set F(3T+2), ..., F(4T−2), the third sample set F(2T+2), ..., F(3T−2), the second sample set F(T+2), ..., F(2T−2), the first sample set F(1), ..., F(T−2), the fifth sample group F(5T−1), F(5T), F(5T+1), the fourth sample group F(4T−1), F(4T), F(4T+1), the third sample group F(3T−1), F(3T), F(3T+1), the second sample group F(2T−1), F(2T), F(2T+1), and the first sample group F(T−1), F(T), F(T+1) from the lower frequency side.

The sample sequence rearranged in this manner exhibits tendency that an envelope of an index of a sample increases in accordance with increase of a frequency when the horizontal axis indicates the frequency and the vertical axis indicates the index of the sample. In other words, it can be said that the rearrangement unit 110 rearranges at least part of samples comprised in the input sample sequence so that the envelope of the index of the sample increases in accordance with increase of the frequency.

The interval T may be a decimal (for example, 5.0, 5.25, 5.5, 5.75) instead of an integer. In this case, for example, F(R(nT−1)), F(R(nT)) and F(R(nT+1)) are selected using a value obtained by rounding off nT as R(nT).

[Method for Determining Interval T]

The interval T is preferably set at a value according to the input sample sequence, that is, for each frame. As a method for determining the interval T for each frame, it is also possible to employ a method in which periodicity of indices (absolute values or square values) of the samples is searched and the interval T is set so that bias of an average absolute value or an average square value becomes large.

While there are various possible methods for determining an interval T, one example of specific procedure for determining an interval T will be described here. T is set as a parameter candidate of a period (interval) in the frequency domain, and indices of all the samples comprised in the sample group selected in accordance with T are added to obtain E(T). Here, the indices of the samples are indicated as |F(j)|. When a set of numbers j of all the samples comprised in the sample group selected in accordance with T is set as M, $E(T)=\Sigma_{j \in M}|F(j)|$. When this is applied to the above-described specific example, $E(T)=\Sigma_{j \in M}|F(j)|=F(T-1)+F(T)+F(T+1)+F(2T-1)+F(2T)+F(2T+1)+F(3T-1)+F(3T)+F(3T+1)+F(4T-1)+F(4T)+F(4T+1)+F(5T-1)+F(5T)+F(5T+1)$. On the other hand, a sum D of indices of all the samples is obtained. That is, $D=\Sigma_{j=1}^{jmax}|F(j)|$. Further, as a determination criterion of the interval T, an average absolute value amplitude of the samples AVE_E=E(T)/card(M) and an average absolute value amplitude of the whole sample sequence AVE_D=D/jmax are obtained. Here, card(M) indicates the number of elements (density) of the set M. Then, T_MAX which maximizes AVE_E is searched, and, if a maximum value AVE_E_MAX of AVE_E satisfies AVE_E_MAX>AVE_D×2, it is judged that convergence to a periodicity component obviously occurs, and T_MAX at this time is set as an interval T.

The method for determining an interval T is not limited to this method, and, for example, it is also possible to obtain the period (interval) T in the frequency domain by converting the basic frequency or a pitch period in the time domain obtained by another part within the encoder 100, which is not illustrated. Further, the method is not limited to determination of the interval T based on periodicity as described above, and it is also possible to employ a method for determining an interval T so that more samples having an amplitude of 0 are successive in the higher frequency side of the sample sequence V when the sample groups are gathered at a lower frequency side, or more samples having an amplitude of 0 are successive in the lower frequency side of the sample sequence V when the sample groups are gathered at a higher frequency side.

Further, it is also possible to employ a method in which the sample sequence is rearranged based on each of a plurality of values T set in advance at the rearrangement unit 110, an index indicating appropriateness of rearrangement, corresponding to each value T, which will be described later (that is, an index indicating a degree of periodicity of the sample sequence, in other words, an index indicating a degree that an amplitude of the sample sequence periodically increases) is obtained, and an interval T with the largest index indicating appropriateness of the rearrangement is selected. Further, it is also possible to set one value defined in advance for an interval T for all the frames.

[Side Information that Specifies Rearrangement of Sample Sequence]

The rearrangement unit 110 outputs side information that specifies rearrangement of the sample sequence (first side information: information that specifies rearrangement, the information comprising at least a period of the sample sequence in the frequency domain), that is, information representing periodicity of the acoustic signal or information representing the basic frequency, or information representing an interval T between the sample corresponding to the periodicity or the basic frequency of the acoustic signal and the sample corresponding to the integral multiple of the periodicity or the basic frequency of the acoustic signal. For example, if the interval T is determined for each frame, side information that specifies rearrangement of the sample sequence is also output for each frame. The side information that specifies rearrangement of the sample sequence can be obtained by encoding the periodicity, the basic frequency or the interval T for each frame. This encoding may be fixed length encoding, or may be variable-length encoding to reduce an average code amount. In the case of variable-length encoding, information obtained by performing variable-length encoding of a difference between an interval T of the previous frame and an interval T of the current frame may be set as information representing the interval T. In a similar manner, information obtained by performing variable-length encoding of a difference between a basic frequency of the previous frame and a basic frequency of the current frame may be set as information representing the basic frequency. It should be noted that when the information representing the basic frequency can be obtained by another part within the encoder 100 which is not illustrated, the information representing the basic frequency obtained by the other part instead of the arrangement part 110, may be used as the side information that specifies rearrangement of the sample sequence. Further, if n can be selected from a plurality of options, an upper bound of n or the above-described upper bound N may be comprised in the side information that specifies rearrangement of the sample sequence.

[The Number of Samples to be Gathered]

Further, while an example has been described in this embodiment where the number of samples comprised in each sample group is a fixed number, that is, a total of three samples comprising a sample corresponding to the periodicity, the basic frequency or the integral multiple thereof (hereinafter, referred to as a center sample) and one sample before and one sample after the sample, and, if the number of samples comprised in the sample group or a sample index is made variable, information representing one selected from a plurality of options with different combinations of the number of samples comprised in the sample group and the sample index is also comprised in the side information that specifies rearrangement of the sample sequence.

For example, when the set options comprise
(1) only the center sample F(nT)
(2) a total of three samples comprising the center sample and one sample before and one sample after the center sample F(nT−1), F(nT), F(nT+1)
(3) a total of three samples comprising the center sample and two samples before the center sample F(nT−2), F(nT−1), F(nT)
(4) a total of four samples comprising the center sample and three samples before the center sample F(nT−3), F(nT−2), F(nT−1), F(nT)
(5) a total of three samples comprising the center sample and two samples after the center sample F(nT), F(nT+1), F(nT+2)
(6) a total of four samples comprising the center sample and three samples after the center sample F(nT), F(nT+1), F(nT+2), F(nT+3),
if (4) is selected, information indicating that (4) is selected is comprised in the side information that specifies rearrangement of the sample sequence. In this example, three bits are sufficient as information indicating the selected option.

As a method for determining which option among these options should be selected, it may employ a method in which rearrangement according to each option is performed, an index indicating appropriateness of the rearrangement which will be described later is obtained, and an option with the largest index indicating appropriateness of the rearrangement is selected. This method can be also applied in a case where n is selectable.

The options comprise, for example, options regarding the interval T, options regarding a combination of the number of samples comprised in the sample group and the sample index, and options regarding n, and it is also possible to select an optimal combination from all the combinations of these options. It may obtain an index indicating appropriateness of rearrangement for all the combinations of the options, which will be described later, and select an option with the largest index indicating appropriateness of the rearrangement.

As the index indicating appropriateness of rearrangement, for example, a degree of concentration of an index indicating the magnitude of the sample in a lower frequency, or the number of successive samples having an amplitude of 0 from the highest frequency toward a lower frequency side on a frequency axis is used. Specifically, a sum of absolute values of amplitudes of the rearranged sample sequence is obtained for a region ¼ from a lower frequency side of the whole sample sequence, and this sum is, for example, used as the index indicating appropriateness of rearrangement because a larger sum assumes more preferable rearrangement. Further, a larger number of successive samples having an amplitude of 0 from the highest frequency toward a lower frequency side of the rearranged sample sequence means concentration of samples having larger indices indicating the magnitude of the samples in the low frequency, which assumes preferable arrangement, and therefore this number of successive samples is, for example, used as the index indicating appropriateness of rearrangement.

[Whether or not Sample Sequence to be Output is Rearranged]

The rearrangement unit 110 outputs the rearranged sample sequence when the index indicating appropriateness of rearrangement corresponding to the rearranged sample sequence, obtained through the above-described processing, is equal to or greater than a predetermined threshold or greater than the predetermined threshold, that is, when an index indicating a degree of periodicity of the sample sequence represents that the periodicity is high, and, otherwise, that is, when the index indicating the degree of periodicity of the sample sequence represents that the periodicity is low, outputs the sample sequence before the rearrangement.

[Gain Adjustment Coder 120]

The gain adjustment coder 120 receives input of the sample sequence (the sample sequence before the rearrangement or the rearranged sample sequence) $X_N'(1), \ldots, X_N'(N)$ output from the rearrangement unit 110. The gain adjustment coder 120 outputs an integer signal code, a quantized and normalized coefficient sequence, and a gain code corresponding to a gain g (global gain) such that the number of bits of the integer signal code becomes as large as possible while being equal to or smaller than the number of allocated bits B (an amount of allocated code defined in advance) which is the number of bits allocated in advance, the integer signal code obtained by encoding the quantized and normalized coefficient sequence $X_Q'(1), \ldots, X_Q'(N)$ which is a sequence of integer values each obtained by quantizing the result obtained by dividing each coefficient of the input sample sequence by the gain g.

Figure 3:
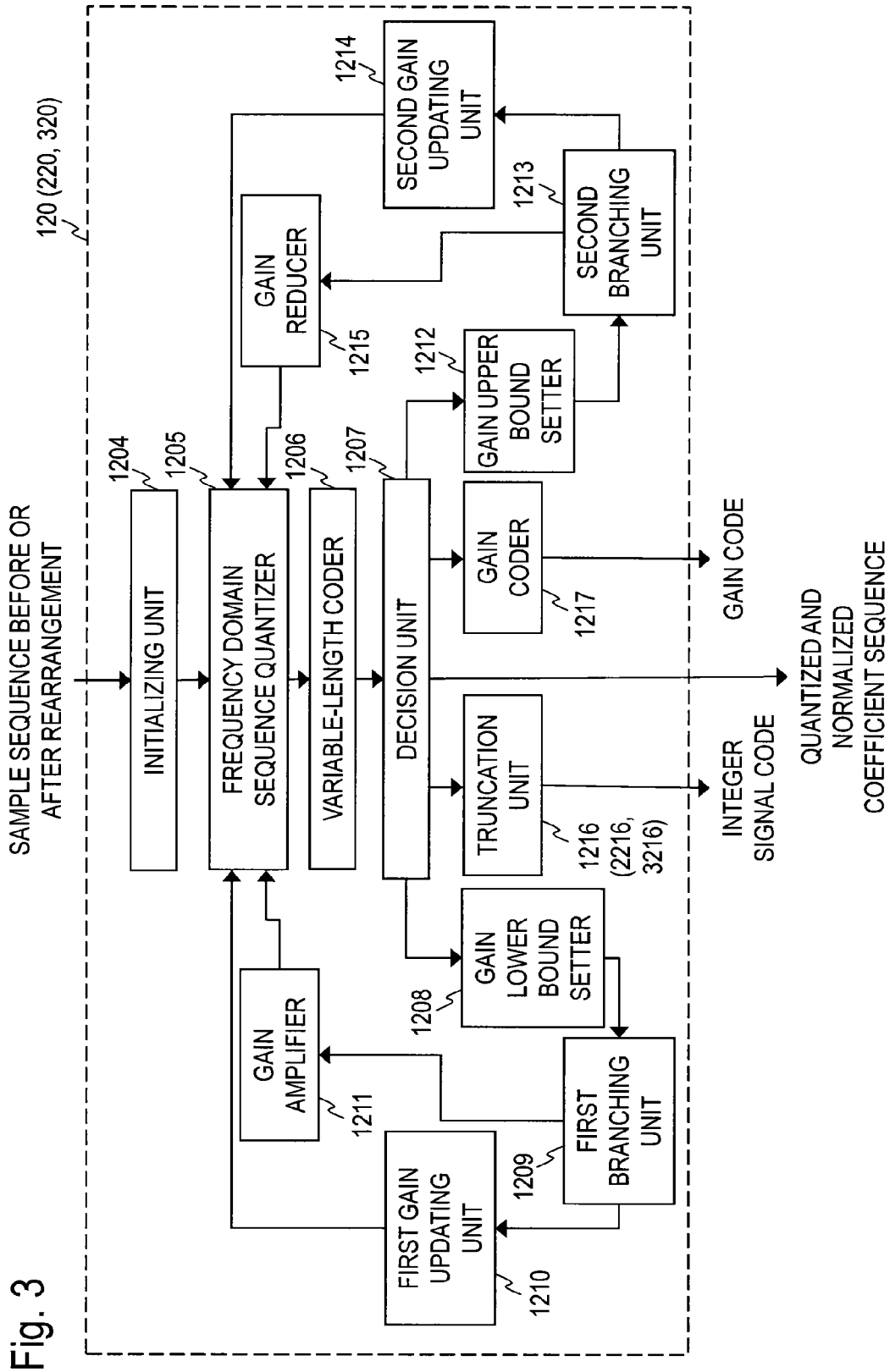
FIG. 3 is a block diagram illustrating a configuration of a gain adjustment coder of an embodiment.

As illustrated in FIG. 3, the gain adjustment coder 120 includes, for example, an initializing unit 1204, a frequency domain sequence quantizer 1205, a variable-length coder 1206, a decision unit 1207, a gain lower bound setter 1208, a first branching unit 1209, a first gain updating unit 1210, a gain amplifier 1211, a gain upper bound setter 1212, a second branching unit 1213, a second gain updating unit 1214, a gain reducer 1215, a truncation unit 1216 and a gain coder 1217.

<Initializing Unit 1204>

The initializing unit 1204 sets an initial value of the gain g. The initial value of the gain can be determined from an energy of a sample sequence $X_N'(1), \ldots, X_N'(N)$ and the number of bits allocated in advance to the code output from the variable-length coder 1206. The initial value of the gain g is a positive value. Hereinafter, the number of bits allocated in advance to the code output from the variable-length coder 1206 will be referred to as the number of allocated bits B. Further, the initializing unit 1204 sets 0 as an initial value of the number of times of updating of the gain.

<Frequency Domain Sequence Quantizer 1205>

The frequency domain sequence quantizer 1205 quantizes values $X_N'(1)/g, \ldots, X_N'(N)/g$ obtained by dividing each sample sequence $X_N'(1), \ldots, X_N'(N)$ by the gain g and obtains and outputs the quantized and normalized coefficient sequence $X_Q(1), \ldots, X_Q(N)$ which is a sequence comprised of integer values.

<Variable-Length Coder 1206>

The variable-length coder 1206 performs variable-length encoding of the input quantized and normalized coefficient sequence $X_Q(1), \ldots, X_Q(N)$ to obtain a code and outputs the obtained code and the quantized and normalized coefficient sequence $X_Q(1), \ldots, X_Q(N)$. This code is referred to as an integer signal code. This variable-length encoding is performed using, for example, a method in which a plurality of coefficients in the quantized and normalized coefficient sequence are collectively encoded. Further, the variable-length coder 1206 counts the number of bits of the integer signal code obtained through the variable-length encoding. Hereinafter, this number of bits will be referred to as the number of consumed bits c.

<Decision Unit 1207>

The decision unit 1207 outputs the gain, the integer signal code, the quantized and normalized coefficient sequence $X_Q(1), \ldots, X_Q(N)$ corresponding to the integer signal code, and the number of consumed bits c if the number of times of updating of the gain is a predetermined number of times, or if the number of consumed bits c counted by the variable-length coder 1206 is equal to the number of allocated bits B.

If the number of times of updating of the gain is smaller than the predetermined number of times, it is controlled that, if the number of consumed bits c counted by the variable-length coder 1206 is larger than the number of allocated bits B, the gain lower bound setter 1208 performs the following processing, while, if the number of consumed bits c counted by the variable-length coder 1206 is smaller than the number of allocated bits B, the gain upper bound setter 1212 performs the following processing.

<Gain Lower Bound Setter 1208>

The gain lower bound setter 1208 sets a value of the current gain g as a gain lower bound $g_{min}$ ($g_{min} \leftarrow g$). This gain lower bound $g_{min}$ means that the value of the gain should be at least this value or greater.

<First Branching Unit 1209>

Next, the first branching unit 1209 performs control so that if a gain upper bound $g_{max}$ has been already set, the first gain updating unit 1210 performs the following processing, otherwise, the gain amplifier 1211 performs the following processing. Further, the first branching unit 1209 adds 1 to the number of times of updating of the gain.

<First Gain Updating Unit 1210>

The first gain updating unit 1210 sets, for example, an average value of the value of the current gain g and the gain upper bound $g_{max}$ as a new value of the gain g (g←(g+$g_{max}$)/2), because an optimal gain value exists between the value of the current gain g and the gain upper bound $g_{max}$. Because the value of the current gain g is set as the gain lower bound $g_{min}$, it can be said that an average value of the gain upper bound $g_{max}$ and the gain lower bound $g_{min}$ is set as a new value of the gain g (g←($g_{max}$+$g_{min}$)/2). The newly set gain g is input to the frequency domain sequence quantizer 1205.

<Gain Amplifier 1211>

The gain amplifier 1211 sets a value greater than the value of the current gain g as a new value of the gain g. For example, a value obtained by adding a gain change amount Δg which is a positive value defined in advance to the value of the current gain g is set as a new value of the gain g (g–g+Δg). Further, for example, if the gain upper bound $g_{max}$ is not set and a case occurs a plurality of times in which the number of consumed bits c is larger than the number of allocated bits B, a value greater than the value defined in advance is used as the gain change amount Δg. The newly set gain g is input to the frequency domain sequence quantizer 1205.

<Gain Upper Bound Setter 1212>

The gain upper bound setter 1212 sets the value of the current gain g as the gain upper bound $g_{max}$ ($g_{max}$←g). This gain upper bound $g_{max}$ means that the value of the gain should be at least this value or smaller.

<Second Branching Unit 1213>

Next, the second branching unit 1213 performs control so that if the gain lower bound $g_{min}$ has been already set, the second gain updating unit 1214 performs the following processing, otherwise, the gain reducer 1215 performs the following processing. The second branching unit 1213 adds 1 to the number of times of updating of the gain.

<Second Gain Updating Unit 1214>

The second gain updating unit 1214 sets, for example, an average value of the value of the current gain g and the gain lower bound $g_{min}$ as a new value of the gain g (g←(g+$g_{min}$)/2), because an optimal gain value exists between the value of the current gain g and the gain lower bound $g_{min}$. Because the value of the current gain g is set as the gain upper bound $g_{max}$, it can be said that an average value of the gain upper bound $g_{max}$ and the gain lower bound $g_{mm}$ is set as a new value of the gain g (g←($g_{max}$+$g_{min}$)/2). The newly set gain g is input to the frequency domain sequence quantizer 1205.

<Gain Reducer 1215>

The gain reducer 1215 sets a value smaller than the value of the current gain g as a new value of the gain g. For example, a value obtained by subtracting a gain change amount Δg which is a positive value defined in advance from the value of the current gain g is set as a new value of the gain g (g←g−Δg). Further, for example, if the gain lower bound $g_{min}$ is not set and a case occurs a plurality of times in which the number of consumed bits c is smaller than the number of allocated bits B, a value greater than the value defined in advance is used as the gain change amount Δg. The newly set gain g is input to the frequency domain sequence quantizer 1205.

<Truncation Unit 1216>

If the number of consumed bits c output from the decision unit 1207 is larger than the number of allocated bits B, the truncation unit 1216 removes a code corresponding to the number of bits by which the number of consumed bits c exceeds the number of allocated bits B from the integer signal code output from the decision unit 1207 and outputs the resultant as a new integer signal code (an integer signal code having a code amount equal to or less than the amount of the allocated code). For example, the truncation unit 1216 outputs as a new integer signal code, the remaining code obtained by removing the code corresponding to the quantized and normalized coefficients at a higher frequency side corresponding to the number of bits c-B by which the number of consumed bits c exceeds the number of allocated bits B from the integer signal code. Meanwhile, if the number of consumed bits c output from the decision unit 1207 is not larger than the number of allocated bits B, the truncation unit 1216 outputs the integer signal code output from the decision unit 1207.

<Gain Coder 1217>

The gain coder 1217 encodes the gain output from the decision unit 1207 using a predetermined number of bits to obtain a gain code and outputs the gain code.

The above-described gain adjustment coder 120 is one example and does not bound the present invention. That is, the gain adjustment coder 120 may be any unit which divides each coefficient of the input sample sequence (the sample sequence before rearrangement or the rearranged sample sequence) by a gain and searches a gain through loop processing, the gain being such that the number of bits of an integer signal code obtained by encoding the quantized and normalized coefficient sequence which is a sequence comprised of integer values obtained by quantizing the result of division becomes as large as possible while being equal to or smaller than the number of allocated bits B which is the number of bits allocated in advance, and outputs a gain code corresponding to the gain g obtained by the processing, the integer signal code and the quantized and normalized coefficient sequence. In other words, the configuration of the gain adjustment coder 120 is not limited as long as the gain code, the integer signal code and the quantized and normalized coefficient sequence can be obtained through loop processing (that is, based on gain search processing or gain optimization processing). For example, the gain may be updated using the amount of updating according to a difference between the number of bits (or the estimated number of bits) of the integer signal code corresponding to the gain and the number of allocated bits B. For example, when the number of bits or the estimated number of bits (hereinafter, the number of consumed bits) of the integer signal code corresponding to the gain is larger than the number of allocated bits B, and the gain upper bound is not set, the gain value may be updated such that an increment from the value before updating of the gain to the value after updating of the gain becomes greater for a greater value obtained by subtracting the number of remaining samples after removal of quantized and normalized samples corresponding to a truncation code which corresponds to the number of bits by which the number of consumed bits c exceeds the number of allocated bits B from the quantized and normalized sample sequence, from the number of samples of part or all of the sample sequence. Further, when the number of consumed bits is smaller than the number of allocated bits B, and the gain lower bound is not set, the gain value may be updated such that a decline from the value before updating of the gain to the value after updating of the gain becomes greater for a greater value obtained by subtracting the number of consumed bits from the number of allocated bits B. Further, the "loop processing" means processing of executing predetermined processing once or more until predetermined conditions are satisfied. In the loop processing, there is a case where the predetermined processing is repeated, or a case where the predetermined processing is not repeated.

Further, if the sample sequence before rearrangement is input to the gain adjustment coder 120, the integer signal code output from the gain adjustment coder 120 corresponds to an "integer signal code obtained by performing encoding using an encoding method which is not based on periodicity". If the rearranged sample sequence is input to the gain adjustment coder 120, the integer signal code output from the gain adjustment coder 120 corresponds to an "integer signal code obtained by performing encoding using an encoding method based on periodicity".

That is, when an "index indicating a degree that an amplitude periodically increases (an index indicating a degree of periodicity)" is equal to or greater than a predetermined threshold or greater than the predetermined threshold (that is, when the index indicating the degree of periodicity represents that the periodicity is high), the gain adjustment coder 120 obtains through loop processing, a gain code corresponding to a gain used for dividing each sample of the sample sequence in the frequency domain and an integer signal code obtained by encoding an integer value sequence (sequence comprised of integer value samples) obtained by dividing each sample of the sample sequence in the frequency domain by the gain using an "encoding method based on periodicity". Otherwise, (that is, when the index indicating the degree of periodicity represents that the periodicity is low), the gain adjustment coder 120 obtains through loop processing, a gain code corresponding to a gain used for dividing each sample of the sample sequence in the frequency domain and an integer signal code obtained by encoding an integer value sequence obtained by dividing each sample of the sample sequence in the frequency domain by the gain using an "encoding method which is not based on periodicity".

<Second Coder 130>

Figure 2:
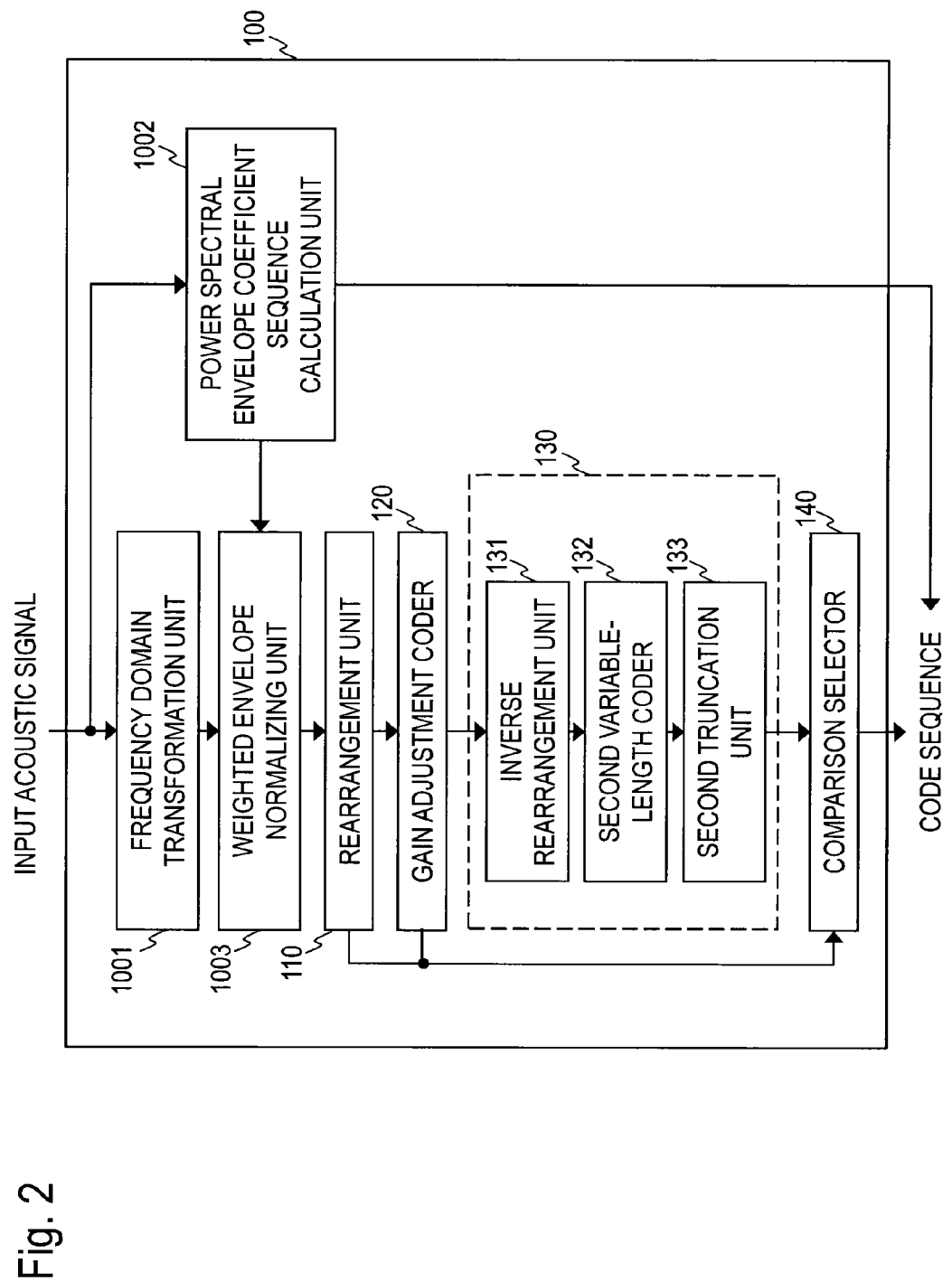
FIG. 2 is a block diagram illustrating a configuration of an encoder of an embodiment.

As illustrated in FIG. 2, the second coder 130 includes an inverse rearrangement unit 131, a second variable-length coder 132 and a second truncation unit 133.

<Inverse Rearrangement Unit 131>

When the rearrangement unit 110 outputs the sample sequence before rearrangement, the inverse rearrangement unit 131 generates and outputs the rearranged sample sequence by performing rearrangement corresponding to the side information which is output from the rearrangement unit 110 and which specifies rearrangement on the quantized and normalized coefficient sequence $X_Q(1), \ldots, X_Q(N)$ output from the gain adjustment coder 120.

When the rearrangement unit 110 outputs the rearranged sample sequence, the inverse rearrangement unit 131 generates and outputs a sample sequence before rearrangement by performing rearrangement inverse to the rearrangement performed by the rearrangement unit 110 on the quantized and normalized coefficient sequence $X_Q(1), \ldots, X_Q(N)$ output from the gain adjustment coder 120. When the rearrangement unit 110 outputs the rearranged sample sequence, the gain adjustment coder 120 may output a gain corresponding to the gain code, and the inverse rearrangement unit 131 may generate and output a sample sequence obtained by dividing each sample of the weighted normalized MDCT coefficient sequence output from the weighted envelope normalizing unit 1003 by the gain output from the gain adjustment coder 120 as the sample sequence before rearrangement.

The point is that the inverse rearrangement unit 131 outputs a sample sequence comprised of samples obtained by dividing each sample of the weighted normalized MDCT coefficient sequence output from the weighted envelope normalizing unit 1003 by the gain generated by the gain adjustment coder 120, and the sample sequence becomes inverse to the sample sequence output from the gain adjustment coder 120 as to whether or not rearrangement has been performed.

<Second Variable-Length Coder 132>

The second variable-length coder 132 receives input of the sample sequence output from the inverse rearrangement unit 131. The second variable-length coder 132 performs variable-length encoding of the sample sequence output from the inverse rearrangement unit 131 to obtain a code and outputs the code. This code is referred to as a second integer signal code. This variable-length encoding is performed, for example, using a method in which a plurality of coefficients within the sample sequence are collectively encoded. Further, the second variable-length coder 132 counts the number of bits of the second integer signal code obtained through the variable-length encoding. Hereinafter, this number of bits will be referred to as a second number of consumed bits $c_2$.

<Second Truncation Unit 133>

When the second number of consumed bits $c_2$ is larger than the number of allocated bits B, the second truncation unit 133 removes a code corresponding to the number of bits by which the second number of consumed bits $c_2$ exceeds the number of allocated bits B from the input second integer signal code and outputs the resultant as a new second integer signal code (second integer signal code having a code amount equal to or less than the amount of allocated code). For example, the second truncation unit 133 outputs as the new second integer signal code, the remaining code obtained by removing a code corresponding to a sample sequence at a higher frequency side (sample sequence output from the inverse rearrangement unit 131) corresponding to the number of bits by which the second number of consumed bits $c_2$ exceeds the number of allocated bits B $c_2$-B from the second integer signal code. Meanwhile, when the second number of consumed bits $c_2$ is not larger than the number of allocated bits B, the second truncation unit 133 outputs the input second integer signal code.

When the rearrangement unit 110 outputs the rearranged sample sequence, the second integer signal code output from the second truncation unit 133 corresponds to an "integer signal code obtained by performing encoding using an encoding method which is not based on periodicity". When the rearrangement unit 110 outputs the sample sequence before rearrangement, the second integer signal code output from the second truncation unit 133 corresponds to an "integer signal code obtained by performing encoding using an encoding method based on periodicity". That is, when an "index indicating a degree that amplitude periodically increases (that is, an index indicating a degree of periodicity)" is equal to or greater than a predetermined threshold or greater than the predetermined threshold (that is, when an index indicating the degree of periodicity represents that the periodicity is high), the second coder 130 outputs the second integer signal code obtained by encoding an integer value sequence obtained by dividing each sample of the sample sequence in the frequency domain by a gain corresponding to a gain code obtained at the gain adjustment coder 120 using an "encoding method which is not based on periodicity". Otherwise (that is, when the index indicating the degree of periodicity represents that the periodicity is low), the second coder 130 outputs the second integer signal code obtained by encoding an integer value sequence obtained by dividing each sample of the sample sequence in the frequency domain by a gain corresponding to a gain code obtained at the gain adjustment coder 120 using an "encoding method based on periodicity".

<Comparison Selector 140>

The comparison selector 140 outputs a code with a smaller total code amount between a case where the rearranged sample sequence is set as a target of variable-length encoding and a case where the sample sequence before rearrangement is set as a target of variable-length encoding.

First, specific processing in a case where the rearrangement unit 110 outputs the rearranged sample sequence, that is, in a case where an index which indicates appropriateness of rearrangement and which is generated by the rearrangement unit 110 is equal to or greater than a predetermined threshold or greater than the predetermined threshold will be described.

The comparison selector 140 obtains a total of a code amount of the integer signal code output from the gain adjustment coder 120 and a code amount of the side information which specifies rearrangement and which is output from the rearrangement unit 110 as CA. Further, the comparison selector 140 obtains a code amount of the second integer signal code output from the second coder 130 as CB. If CA>CB, the comparison selector 140 outputs the second integer signal code output from the second coder 130 and the gain code output from the gain adjustment coder 120, otherwise, the comparison selector 140 outputs the integer signal code output from the gain adjustment coder 120, the gain code output from the gain adjustment coder 120 and the side information which specifies rearrangement and which is output from the rearrangement unit 110.

If CA=CB, the comparison selector 140 may output the second integer signal code output from the second coder 130 and the gain code output from the gain adjustment coder 120, or may output the integer signal code output from the gain adjustment coder 120, the gain code output from the gain adjustment coder 120 and the side information which specifies rearrangement and which is output from the rearrangement unit 110.

Next, specific processing in a case where the rearrangement unit 110 outputs the sample sequence before rearrangement, that is, in a case where the index which indicates appropriateness of rearrangement and which is generated by the rearrangement unit 110 is less than a predetermined threshold or equal to or less than the predetermined threshold will be described.

The comparison selector 140 obtains a code amount of the integer signal code output from the gain adjustment coder 120 as CB. Further, the comparison selector 140 obtains a total of a code amount of the second integer signal code output from the second coder 130 and a code amount of the side information which specifies rearrangement and which is output from the rearrangement unit 110 as CA. If CA>CB, the comparison selector 140 outputs the integer signal code output from the gain adjustment coder 120 and the gain code output from the gain adjustment coder 120, otherwise, the comparison selector 140 outputs the second integer signal code output from the second coder 130, the gain code output from the gain adjustment coder 120 and the side information which specifies rearrangement and which is output from the rearrangement unit 110.

If CA=CB, the comparison selector 140 may output the second integer signal code output from the second coder 130, the gain code output from the gain adjustment coder 120 and the side information which specifies rearrangement and which is output from the rearrangement unit 110 or may output the integer signal code output from the gain adjustment coder 120 and the gain code output from the gain adjustment coder 120.

It should be noted that an actual total code amount comprises the code amount of the gain code output from the gain adjustment coder 120 in both cases of a case where the rearrangement unit 110 outputs the rearranged sample sequence and a case where the rearrangement unit 110 outputs the sample sequence before rearrangement. However, the code amount of the gain code in a case where the rearranged sample sequence is set as a target of variable-length encoding is the same as the code amount of the gain code in a case where the sample sequence before rearrangement is set as a target of variable-length encoding. Therefore, neither the above-described CA nor CB comprises the code amount of the gain code. Of course, CA and CB may each comprise the code amount of the gain code.

A code sequence comprising a code output from the comparison selector 140 (hereinafter, a sample code) and a predictive coefficient code output from the power spectral envelope coefficient sequence calculation unit 1002 is input to a decoder which is not illustrated. The decoder decodes the code sequence to obtain an acoustic signal. An example of a method of decoding the code sequence by the decoder will be described below.

The decoder decodes the predictive coefficient code for each frame to obtain coefficients $W(1), \ldots, W(N)$ of the power spectral envelope coefficient sequence. Further, the decoder decodes the gain code to obtain a gain, decodes the integer signal code or the second integer signal code to obtain a sequence comprised of integer values, and multiplies the gain by the obtained sequence comprised of integer values to obtain a sample sequence $X_N''(1), \ldots, X_N''(N)$ (the sample sequence before rearrangement or the rearranged sample sequence).

When the sample code does not comprise side information that specifies rearrangement of the sample sequence, the decoder de-normalizes the sample sequence $X_N''(1), \ldots, X_N''(N)$ using the power spectral envelope coefficient sequence $W(1), \ldots, W(N)$ to obtain an MDCT coefficient sequence $X'(1), \ldots, X'(N)$. De-normalization means inverse processing of normalization performed at the weighted envelope normalizing unit 1003. For example, if normalization of <Example 1> is performed at the weighted envelope normalizing unit 1003, the decoder transforms $X_N''(1) \times W_\gamma(1), \ldots, X_N''(N) \times W_\gamma(N)$ into the MDCT coefficient sequence $X'(1), \ldots, X'(N)$.

On the other hand, if the sample code comprises the above-described side information, the decoder performs rearrangement inverse to the rearrangement corresponding to the side information, on the sample sequence $X_N''(1), \ldots, X_N''(N)$ and de-normalizes the obtained sample sequence to obtain the MDCT coefficient sequence $X'(1), \ldots, X'(N)$.

The decoder transforms the MDCT coefficient sequence $X'(1), \ldots, X'(N)$ for each frame into a time domain to obtain an acoustic signal for each frame.

[Modified Example of the First Embodiment]

In the first embodiment, a code is selected using an actual code amount. However, it is also possible to select a code using an estimate value of the code amount. An example where a code is selected using an estimate value of the code amount will be described as a modified example of the first embodiment. Only a difference between the first embodiment and the modified example will be described below.

<Encoder 100'>

Figure 4:
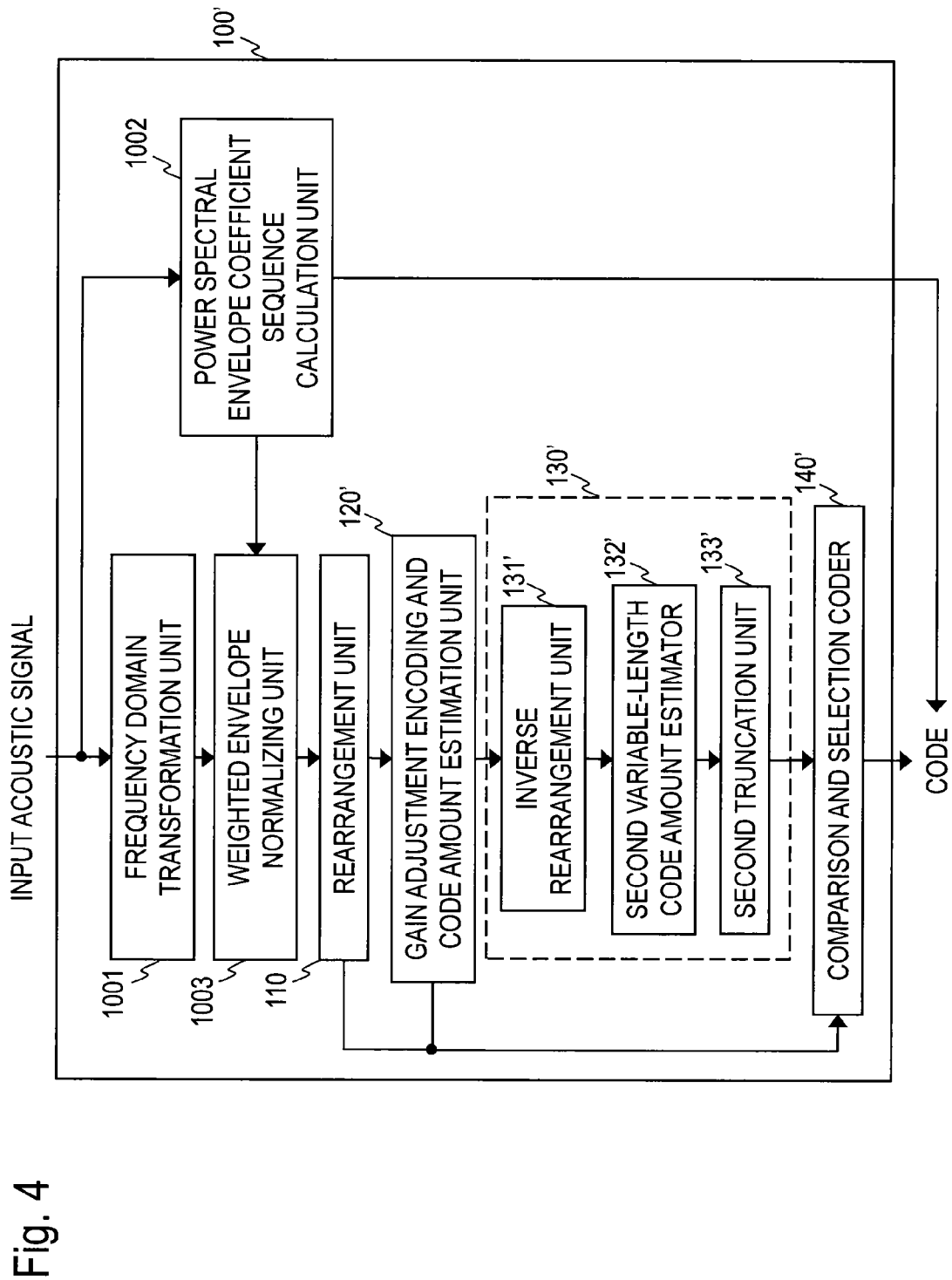
FIG. 4 is a block diagram illustrating a configuration of an encoder in a modified example of the embodiment.

An encoder 100' in the modified example of the first embodiment will be illustrated in FIG. 4.

The encoder 100' is the same as the encoder 100 except that the encoder 100' comprises a gain adjustment encoding and code amount estimation unit 120' in place of the gain adjustment coder 120, a second code amount estimator 130' in place of the second coder 130, and a comparison and selection coder 140' in place of the comparison selector 140.

<Gain Adjustment Encoding and Code Amount Estimation Unit 120'>

Figure 5:
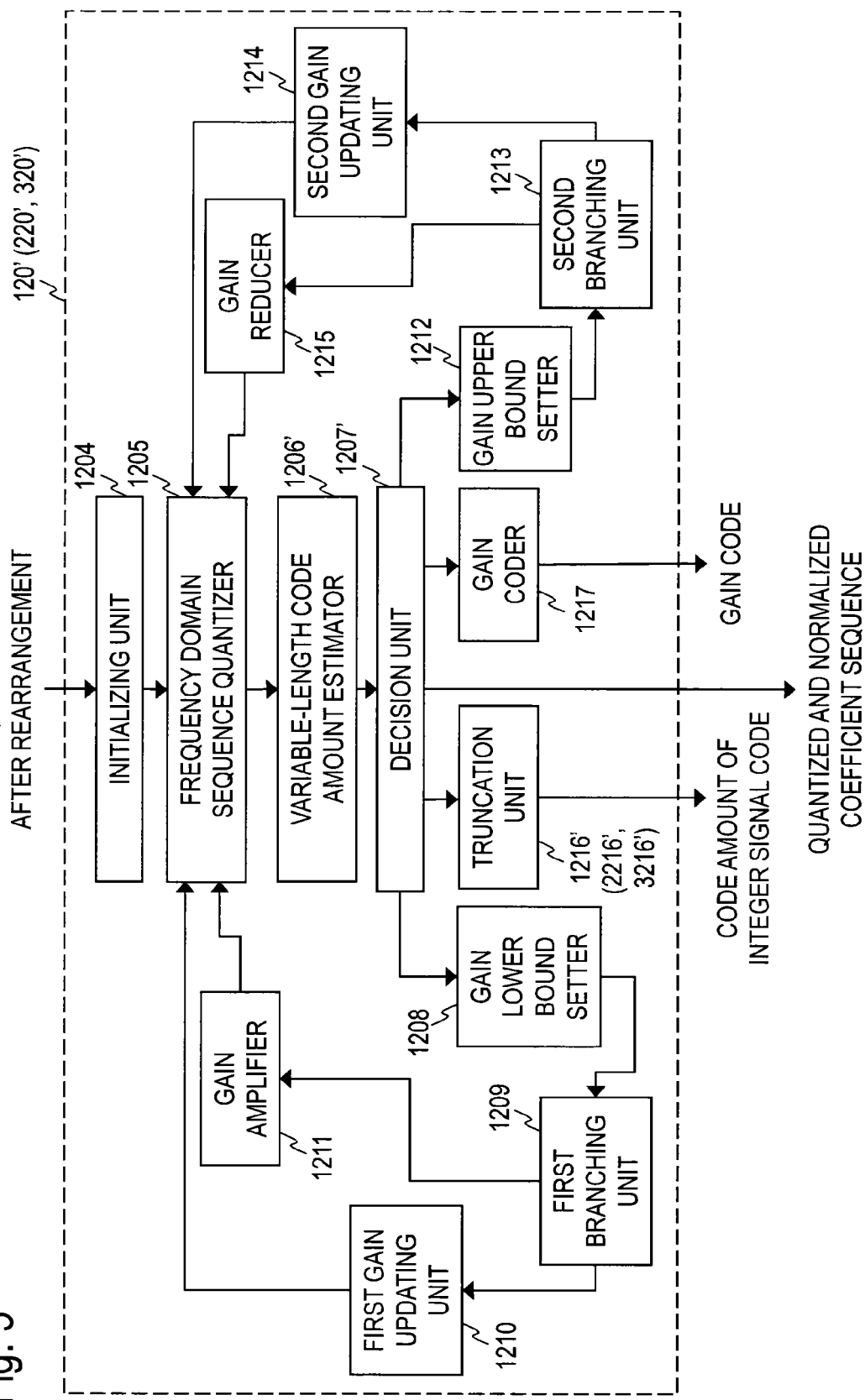
FIG. 5 is a block diagram illustrating a configuration of a gain adjustment encoding and code amount estimation unit in a modified example of the embodiment.

The gain adjustment encoding and code amount estimation unit 120' in the modified example of the first embodiment is illustrated in FIG. 5.

The gain adjustment encoding and code amount estimation unit 120' is the same as the gain adjustment coder 120 except that the gain adjustment encoding and code amount estimation unit 120' comprises a variable-length code amount estimator 1206' in place of the variable-length coder 1206, a decision unit 1207' in place of the decision unit 1207 and a truncation unit 1216' in place of the truncation unit 1216.

<Variable-Length Code Amount Estimator 1206'>

The variable-length code amount estimator 1206' obtains an estimated number of bits (an estimate value of the code amount) of the integer signal code obtained by performing variable-length encoding of the input quantized and normalized coefficient sequence $X_Q(1), \ldots, X_Q(N)$ and outputs the estimated number of bits and the quantized and normalized coefficient sequence $X_Q(1), \ldots, X_Q(N)$. In the modified example of the first embodiment, the estimated number of bits of the integer signal code obtained at the variable-length code amount estimator 1206' is referred to as a number of consumed bits c.

<Decision Unit 1207'>

When the number of times of updating of the gain is a predetermined number of times or when the number of consumed bits c counted at the variable-length code amount estimator 1206' is equal to the number of allocated bits B, the decision unit 1207' outputs a gain g and the quantized and normalized coefficient sequence $X_Q(1), \ldots, X_Q(N)$. When the number of times of updating of the gain is smaller than the predetermined number of times, the decision unit 1207' performs control so that if the number of consumed bits c output from the variable-length code amount estimator 1206' is larger than the number of allocated bits B, the gain lower bound setter 1208 performs the processing described in the first embodiment, and, if the number of consumed bits c is smaller than the number of allocated bits B, the gain upper bound setter 1212 performs the processing described in the first embodiment. In the modified example of the first embodiment, the number of bits allocated in advance to the code output from the comparison and selection coder 140' is referred to as the number of allocated bits B.

<Truncation Unit 1216'>

When the number of consumed bits c output from the variable-length code amount estimator 1206' is not larger than the number of allocated bits B, the truncation unit 1216' outputs the number of consumed bits c as an estimate value of the code amount of the integer signal code, and, when the number of consumed bits c is larger than the number of allocated bits B, the truncation unit 1216' outputs the number of allocated bits B as an estimate value of the integer signal code.

<Second Code Amount Estimator 130'>

The second code amount estimator 130' includes an inverse rearrangement unit 131', a second variable-length code amount estimator 132' and a second truncation unit 133'.

<Inverse Rearrangement Unit 131'>

When the rearrangement unit 110 outputs the sample sequence before rearrangement, the inverse rearrangement unit 131' generates and outputs the rearranged sample sequence by performing rearrangement corresponding to the side information which specifies rearrangement and which is output from the rearrangement unit 110 on the quantized and normalized coefficient sequence $X_Q(1), \ldots, X_Q(N)$ output from the gain adjustment encoding and code amount estimation unit 120'.

When the rearrangement unit 110 outputs the rearranged sample sequence, the inverse rearrangement unit 131' generates and outputs the sample sequence before rearrangement by performing rearrangement inverse to the rearrangement performed by the rearrangement unit 110 on the quantized and normalized coefficient sequence $X_Q(1), \ldots, X_Q(N)$ output from the gain adjustment encoding and code amount estimation unit 120'. When the rearrangement unit 110 outputs the rearranged sample sequence, the gain adjustment encoding and code amount estimation unit 120' may output a gain corresponding to a gain code, and the inverse rearrangement unit 131 may generate and output a sample sequence obtained by dividing each sample of the weighted normalized MDCT coefficient sequence output from the weighted envelope normalizing unit 1003 by the gain output from the gain adjustment encoding and code amount estimation unit 120' as the sample sequence before rearrangement.

The point is that the inverse rearrangement unit 131' outputs a sample sequence comprised of samples obtained by dividing each sample of the weighted normalized MDCT coefficient sequence output from the weighted envelope normalizing unit 1003 by the gain generated by the gain adjustment encoding and code amount estimation unit 120', and the sample sequence is inverse to the sample sequence output from the gain adjustment encoding and code amount estimation unit 120' as to whether or not rearrangement has been performed.

<Second Variable-Length Code Amount Estimator 132'>

The second variable-length code amount estimator 132' receives input of the sample sequence output from the inverse rearrangement unit 131'. The second variable-length code amount estimator 132' obtains an estimated number of bits (an estimate value of the code amount) of the integer signal code obtained by performing variable-length encoding of the sample sequence output from the inverse rearrangement unit 131' and outputs the estimated number of bits. In the modified example of the first embodiment, the estimated number of bits of the integer signal code obtained at the second variable-length code amount estimator 132' is referred to as the second number of consumed bits $c_2$.

<Second Truncation Unit 133'>

When the second number of consumed bits $c_2$ obtained at the second variable-length code amount estimator 132' is not larger than the number of allocated bits B, the second truncation unit 133' outputs the second number of consumed bits $c_2$ obtained at the second variable-length code amount estimator 132' as an estimate value of the code amount of the second integer signal code, and, when the second number of consumed bits $c_2$ obtained at the second variable-length code amount estimator 132' is larger than the number of allocated bits B, the second truncation unit 133' outputs the number of allocated bits B as the estimate value of the code amount of the second integer signal code.

<Comparison and Selection Coder 140'>

The comparison and selection coder 140' outputs a code with a smaller estimate value of the total code amount between a case where the rearranged sample sequence is set as a target of variable-length encoding and a case where the sample sequence before rearrangement is set as the target of variable-length encoding.

First, specific processing in a case where the rearrangement unit 110 outputs the rearranged sample sequence, that is, in a case where an index which indicates appropriateness of rearrangement and which is generated by the rearrangement unit 110 is equal to or greater than a predetermined threshold or greater than the predetermined threshold will be described.

The comparison and selection coder 140' obtains a total of an estimate value (the number of consumed bits c) of the code amount of the integer signal code output from the gain adjustment encoding and code amount estimation unit 120' and the code amount of the side information which specifies rearrangement and which is output from the rearrangement unit 110, as CA. Further, the comparison and selection coder 140' obtains an estimate value (the second number of consumed bits $c_2$) of the code amount of the second integer signal code output from the second variable-length code amount estimator 132' as CB. If CA>CB, the comparison and selection coder 140' performs variable-length encoding of the sample sequence generated by the inverse rearrangement unit 131', which is the integer value sequence obtained by dividing each sample of the sample sequence in the frequency domain by a gain corresponding to the gain code obtained at the gain adjustment encoding and code amount estimation unit 120', to obtain a second integer signal code and outputs the obtained second integer signal code and the gain code output from the gain adjustment encoding and code amount estimation unit 120'. Otherwise, the comparison and selection coder 140' performs variable-length encoding of the sample sequence (quantized and normalized coefficient sequence $X_Q(1), \ldots, X_Q(N)$) generated at the gain adjustment encoding and code amount estimation unit 120', which is the integer value sequence obtained by dividing each sample of the sample sequence obtained by rearranging the sample sequence in the frequency domain by the gain corresponding to the gain code obtained at the gain adjustment encoding and code amount estimation unit 120', to obtain an integer signal code and outputs the obtained integer signal code, the gain code output from the gain adjustment encoding and code amount estimation unit 120' and the side information which specifies rearrangement and which is output from the rearrangement unit 110.

If CA=CB, the comparison and selection coder 140' may output the second integer signal code obtained as described above, and the gain code output from the gain adjustment encoding and code amount estimation unit 120' or may output the integer signal code obtained as described above, the gain code output from the gain adjustment encoding and code amount estimation unit 120' and the side information which specifies rearrangement and which is output from the rearrangement unit 110.

Next, specific processing in a case where the rearrangement unit 110 outputs the sample sequence before rearrangement, that is, the index which indicates appropriateness of rearrangement and which is generated by the rearrangement unit 110 is less than a predetermined threshold or equal to or less than the predetermined threshold will be described.

The comparison and selection coder 140' obtains an estimate value (the number of consumed bits c) of the code amount of the integer signal code output from the gain adjustment encoding and code amount estimation unit 120' as CB. Further, the comparison and selection coder 140' obtains a total of an estimate value (the second number of consumed bits $c_2$) of the code amount of the second integer signal code output from the second variable-length code amount estimator 132' and a code amount of the side information which specifies rearrangement and which is output from the rearrangement unit 110 as CA. If CA>CB, the comparison and selection coder 140' performs variable-length encoding of the sample sequence (quantized and normalized coefficient sequence $X_Q(1), \ldots, X_Q(N)$) generated at the gain adjustment encoding and code amount estimation unit 120', which is the integer value sequence obtained by dividing each sample of the sample sequence in the frequency domain by a gain corresponding to the gain code obtained at the gain adjustment encoding and code amount estimation unit 120', to obtain an integer signal code and outputs the obtained integer signal code and the gain code output from the gain adjustment encoding and code amount estimation unit 120'. Otherwise, the comparison and selection coder 140' performs variable-length encoding of the sample sequence generated at the inverse rearrangement unit 131', which is the integer value sequence obtained by dividing each sample of the sample sequence obtained by rearranging the sample sequence in the frequency domain by the gain corresponding to the gain code obtained at the gain adjustment encoding and code amount estimation unit 120', to obtain a second integer signal code and outputs the obtained second integer signal code, the gain code output from the gain adjustment encoding and code amount estimation unit 120' and the side information which specifies rearrangement and which is output from the rearrangement unit 110.

If CA=CB, the comparison and selection coder 140' may output the second integer signal code obtained as described above, the gain code output from the gain adjustment coder 120 and the side information which specifies rearrangement and which is output from the rearrangement unit 110 or may output the integer signal code obtained as described above and the gain code output from the gain adjustment coder 120.

It should be noted that an actual total code amount comprises the code amount of the gain code output from the gain adjustment encoding and code amount estimation unit 120'. However, the code amount of the gain code in a case where the rearranged sample sequence is set as a target of variable-length encoding is the same as the code amount of the gain code in a case where the sample sequence before rearrangement is set as a target of variable-length encoding. Therefore, neither the above-described CA nor CB comprises the code amount of the gain code. Of course, CA and CB may each comprise the code amount of the gain code.

Further, when the number of bits of the integer signal code obtained through variable-length encoding is larger than the number of allocated bits, the comparison and selection coder 140' removes a code corresponding to the number of bits by which the number of bits of the integer signal code exceeds the number of allocated bits B from the integer signal code obtained through variable-length encoding and outputs the resultant as the integer signal code. In a similar manner, when the number of bits of the second integer signal code obtained through variable-length encoding is larger than the number of allocated bits, the comparison and selection coder 140' removes a code corresponding to the number of bits by which the number of bits of the second integer signal code exceeds the number of allocated bits B from the second integer signal code obtained through variable-length encoding and outputs the resultant as the second integer signal code.

Second Embodiment

In the first embodiment, a code is selected using an actual code amount. In the second embodiment, a code is selected also taking into account an amount of encoded information. Because the amount of encoded information is obtained by subtracting an amount of information which has not been encoded from the original information amount, it can be said that the second embodiment is an example where a code is selected also taking into account the amount of information which has not been encoded. Further, in the second embodiment, when the number of bits of at least one of the integer signal code and the second integer signal code is smaller than the number of allocated bits B, some kind of information may be encoded using bits corresponding to the difference. If some kind of information is encoded using bits corresponding to the difference, it is possible to realize an encoder with less distortion than that of the conventional art under the conditions that the number of bits is smaller than the number of allocated bits B. Further, if encoding is not performed using bits corresponding to the difference, it is possible to realize an encoder with a less code amount than that of the conventional art for the same distortion. Only a difference between the second embodiment and the first embodiment will be described below.

<Encoder 200>

Figure 6:
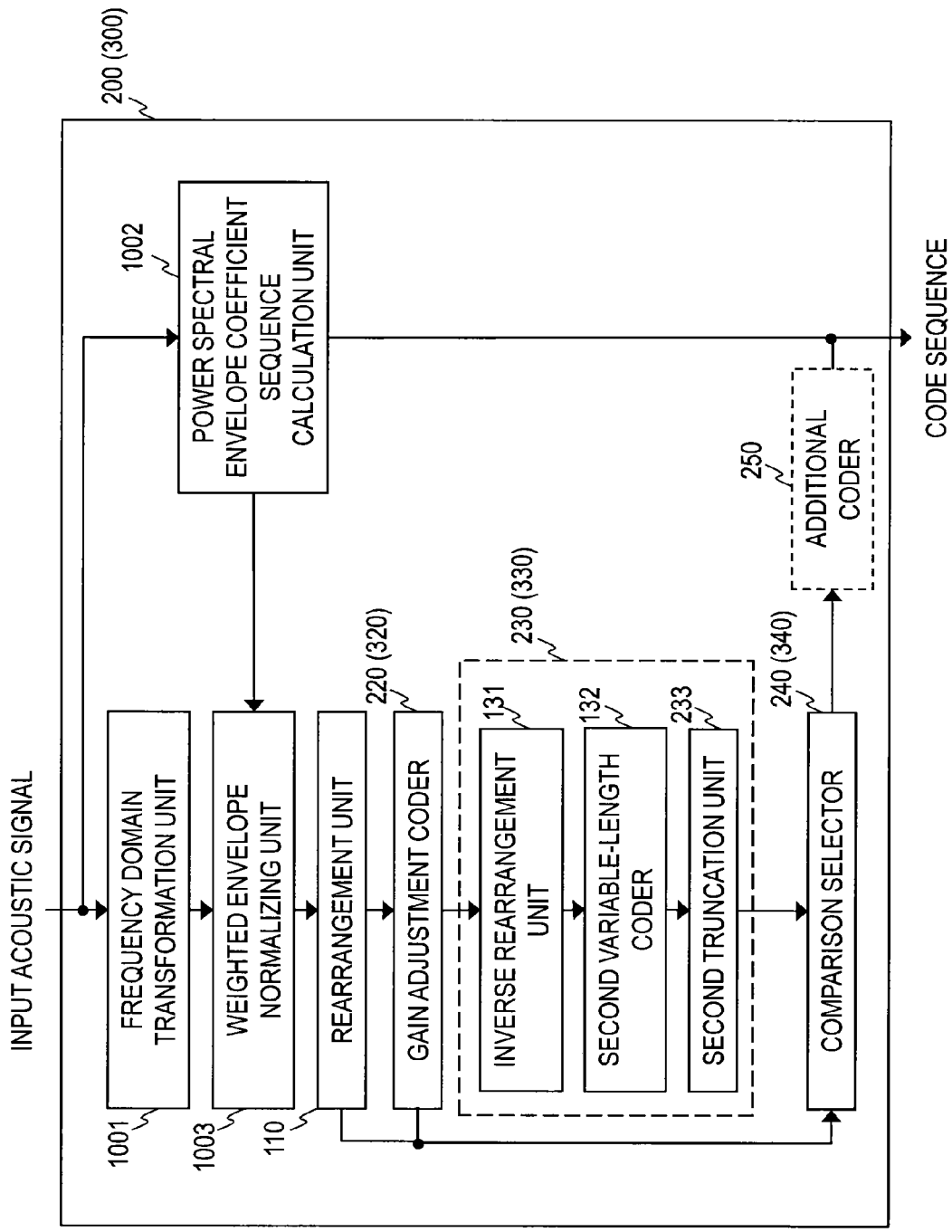
FIG. 6 is a block diagram illustrating a configuration of an encoder of an embodiment.

The encoder 200 in the second embodiment is illustrated in FIG. 6.

The encoder 200 is the same as the encoder 100 in the first embodiment except that the encoder 200 comprises a gain adjustment coder 220 in place of the gain adjustment coder 120, comprises a second coder 230 in place of the second coder 130, comprises a comparison selector 240 in place of the comparison selector 140, and additionally comprises an additional coder 250. It is not essential that the additional coder 250 should be provided.

<Gain Adjustment Coder 220>

As illustrated in FIG. 3, the gain adjustment coder 220 of the second embodiment is the same as the gain adjustment coder 120 in the first embodiment except that the gain adjustment coder 220 comprises a truncation unit 2216 in place of the truncation unit 1216.

<Truncation Unit 2216>

When the number of consumed bits c output from the decision unit 1207 is larger than the number of allocated bits B, the truncation unit 2216 removes a code corresponding to the number of bits (that is, c-B bits) by which the number of consumed bits c exceeds the number of allocated bits B from the integer signal code output from the decision unit 1207 and outputs the resultant as a new integer signal code (an integer signal code having a code amount equal to or less than the amount of allocated code). On the other hand, when the number of consumed bits c output from the decision unit 1207 is not larger than the number of allocated bits B, the truncation unit 2216 outputs the integer signal code output from the decision unit 1207. Further, the truncation unit 2216 also outputs a sum of absolute values of amplitudes of the samples corresponding to the integer signal code output from the truncation unit 2216 (samples corresponding to a code not removed at the truncation unit 2216 from the quantized and normalized coefficient sequence $X_Q(1), \ldots, X_Q(N)$).

<Second Coder 230>

As illustrated in FIG. 6, the second coder 230 in the second embodiment is the same as the second coder 130 in the first embodiment except that the second coder 230 comprises a second truncation unit 233 in place of the second truncation unit 133.

<Second Truncation Unit 233>

When the second number of consumed bits $c_2$ output from the second variable-length coder 132 is larger than the number of allocated bits B, the second truncation unit 233 removes a code corresponding to the number of bits (that is, $c_2$-B bits) by which the second number of consumed bits $c_2$ exceeds the number of allocated bits B from the second integer signal code output from the second variable-length coder 132 and outputs the resultant as a new second integer signal code (a second integer signal code having a code amount equal to or less than the amount of allocated code). On the other hand, when the second number of consumed bits $c_2$ is not larger than the number of allocated bits B, the second truncation unit 233 outputs the second integer signal code output from the second variable-length coder 132. Further, the second truncation unit 233 also outputs a sum of absolute values of amplitudes of the samples corresponding to the second integer signal code output from the second truncation unit 233 (samples corresponding to a code not removed at the second truncation unit 233 from the sample sequence output from the inverse rearrangement unit 131).

<Comparison Selector 240>

The comparison selector 240 outputs a code estimated to have smaller encoding distortion in the whole encoder comprising the additional coder 250 between a case where the rearranged sample sequence is set as a target of variable-length encoding and a case where the sample sequence before rearrangement is set as a target of variable-length encoding.

First, specific processing in a case where the rearrangement unit 110 outputs the rearranged sample sequence, that is, an index which indicates appropriateness of rearrangement and which is generated by the rearrangement unit 110 is equal to or greater than a predetermined threshold or greater than the predetermined threshold, will be described.

The comparison selector 240 obtains a total of a code amount of the integer signal code output from the gain adjustment coder 220 and a code amount of the side information which specifies rearrangement and which is output from the rearrangement unit 110 as CA. Further, the comparison selector 240 obtains a code amount of the second integer signal code output from the second coder 230 as CB. If a value of an evaluation indicator $G1=-FA\times(B-CA)+FB\times(B-CB)$ is 0 or greater, where FA is a sum of the absolute values output from the gain adjustment coder 220, and FB is a sum of the absolute values output from the second coder 230, the comparison selector 240 outputs the second integer signal code output from the second coder 230 and the gain code output from the gain adjustment coder 220, and, if the value of the evaluation indicator G1 is negative, the comparison selector 240 outputs the integer signal code output from the gain adjustment coder 220, the gain code output from the gain adjustment coder 220 and the side information which specifies rearrangement and which is output from the rearrangement unit 110.

If the evaluation indicator G1=0, the comparison selector 240 may output the second integer signal code output from the second coder 230 and the gain code output from the gain adjustment coder 220 or may output the integer signal code output from the gain adjustment coder 220, the gain code output from the gain adjustment coder 220 and the side information which specifies rearrangement and which is output from the rearrangement unit 110.

Next, specific processing in a case where the rearrangement unit 110 outputs the sample sequence before rearrangement, that is, in a case where the index which indicates appropriateness of rearrangement and which is generated by the rearrangement unit 110 is less than the predetermined threshold or equal to or less than the predetermined threshold will be described.

The comparison selector 240 obtains a code amount of the integer signal code output from the gain adjustment coder 220 as CB. Further, the comparison selector 240 obtains a total of a code amount of the second integer signal code output from the second coder 230 and a code amount of the side information which specifies rearrangement and which is output from the rearrangement unit 110 as CA. If a value of an evaluation indicator G1=−FA×(B−CA)+FB×(B−CB) is negative, where FA is a sum of the absolute values output from the second coder 230, and FB is a sum of the absolute values output from the gain adjustment coder 220, the comparison selector 240 outputs the second integer signal code output from the second coder 230, the gain code output from the gain adjustment coder 220 and the side information which specifies rearrangement and which is output from the rearrangement unit 110, and if the value of the evaluation indicator G1 is 0 or greater, the comparison selector 240 outputs the integer signal code output from the gain adjustment coder 220 and the gain code output from the gain adjustment coder 220.

If the evaluation indicator G1=0, the comparison selector 240 may output the second integer signal code output from the second coder 230, the gain code output from the gain adjustment coder 220 and the side information which specifies rearrangement and which is output from the rearrangement unit 110, or may output the integer signal code output from the gain adjustment coder 220 and the gain code output from the gain adjustment coder 220.

It should be noted that actually, a total code amount comprises the code amount of the gain code output from the gain adjustment coder 220. However, a code amount of the gain code in a case where the rearranged sample sequence is set as a target of variable-length encoding is the same as a code amount of the gain code in a case where the sample sequence before rearrangement is set as a target of variable-length encoding. Therefore, neither the above-described CA nor CB comprises the code amount of the gain code. Of course, CA and CB may each comprise the code amount of the gain code.

The point is that if the evaluation indicator G1 is negative, it is inferred that encoding distortion of the whole encoder 200 is smaller when the rearranged sample sequence is set as an encoding target. This principle will be described below.

When the code amount CA in a case where rearrangement is performed is compared with the code amount CB in a case where rearrangement is not performed, the number of samples which are removed without being encoded at the truncation unit 2216 or the second truncation unit 233 is also taken into account. In this case, it is preferable that the number of samples encoded without being removed be larger and the code amount be smaller.

First, given that the number of remaining bits (B−CA) in a case where the rearranged sample sequence is set as an encoding target is assigned to a code indicating an encoding error of the integer signal code or the second integer signal code or correction of the gain, encoding distortion EA of the integer code sequence or the second integer code sequence can be expressed as in Formula (4) and can be approximated as in Formula (5).

$$EA = DA + FA \times \exp(-(B-CA) \times \delta) \quad (4)$$

$$EA \approx DA + FA \times (1-(B-CA) \times \delta) \quad (5)$$

where DA indicates a sum of absolute values of the amplitudes of the samples removed at the truncation unit 2216 or the second truncation unit 233 from the integer value sequence obtained by dividing the rearranged sample sequence output from the rearrangement unit 110 by a gain, DB indicates a sum of absolute values of the amplitudes of the samples removed at the truncation unit 2216 or the second truncation unit 233 from the integer value sequence obtained by dividing the sample sequence before arrangement output from the rearrangement unit 110 by a gain, and δ indicates a positive value defined in advance.

Next, given that the number of remaining bits (B−CB) in a case where the sample sequence before rearrangement is set as an encoding target is assigned to a code indicating an encoding error of the integer signal code or the second integer signal code or correction of the gain, encoding distortion EB of the integer code sequence or the second integer code sequence can be expressed as in Formula (6), and can be approximated as in Formula (7).

$$EB = DB + FB \times \exp(-(B-CB) \times \delta) \quad (6)$$

$$EB \approx DB + FB \times (1-(B-CB) \times \delta) \quad (7)$$

If EA−EB<0, it can be said that encoding distortion of the whole encoder 200 becomes smaller in a case where the rearranged sample sequence is set as an encoding target than in a case where the sample sequence before rearrangement is set as an encoding target.

Here, a sum of the absolute values of the amplitudes of the integer value sequence obtained by dividing the sample sequence by a gain is equal regardless of before or after rearrangement of the sample sequence. Therefore, the following holds.

$$DA + FA - DB - FB = 0 \quad (8)$$

When EA−EB is deformed using Formulas (5), (7) and (8), the following formula can be obtained.

$$DA + FA \times (1-(B-CA) \times \delta) - DB + FB \times (1-(B-CB) \times \delta) = \quad (9)$$
$$DA + FA - FA \times (B-CA) \times \delta - DB - FB + FB \times (B-CB) \times \delta =$$
$$\delta \times (-FA \times (B-CA) + FB \times (B-CB))$$

From Formula (9), it can be understood that if −FA×(B−CA)+FB×(B−CB) is negative, it is preferable to use the rearranged sample sequence as an encoding target.

<Additional Coder 250>

The additional coder 250 encodes an encoding error generated until the comparison selector 240, that is, information which is not comprised in the gain corresponding to the code output from the comparison selector 240 or the integer signal sequence (the sample sequence in the quantized and normalized coefficient sequence or the sample sequence in the sequence subjected to rearrangement inverse to the rearrangement performed by the rearrangement unit 110 on the quantized and normalized coefficient sequence) among the information comprised in the weighted normalized MDCT coefficient sequence to obtain a code and outputs the obtained code as an additional code. That is, the additional coder 250 outputs an additional code obtained by encoding information which corresponds to neither the integer signal code nor the second integer signal code and the gain code output from the comparison selector 240 among the information comprised in the weighted normalized MDCT coefficient sequence.

For example, the additional coder 250 obtains a code by encoding one or a plurality of samples comprised in the sample sequence generated by an encoding error until the comparison selector 240 to obtain a code and outputs the obtained code as an additional code. Here, the sample sequence generated by the encoding error until the comparison selector 240 is a sample sequence obtained by subtracting from values of the samples of the weighted normalized MDCT coefficient sequence, values obtained by multiplying a gain by samples of the integer signal sequence corresponding to the samples.

Alternatively, for example, the additional coder 250 outputs as an additional code, a code corresponding to a gain correction value which minimizes an error between the values of the samples of the weighted normalized MDCT coefficient sequence and a sample sequence obtained by multiplying the gain and additional values of the gain correction value by the samples in the integer signal sequence corresponding to the samples.

The number of bits of the additional code is, for example, equal to or smaller than a value obtained by subtracting the number of bits of the integer signal code or the second integer signal code output from the comparison selector 240 from the number of allocated bits B.

[Modified Example of the Second Embodiment]

In the second embodiment, a code is selected using an actual code amount. However, a code may be selected using an estimate value of the code amount. An example of selecting a code using an estimate value of the code amount will be described as a modified example of the second embodiment. Only a difference between the modified example of the second embodiment, and the modified example of the first embodiment and the second embodiment will be described below.

<Encoder 200'>

Figure 7:
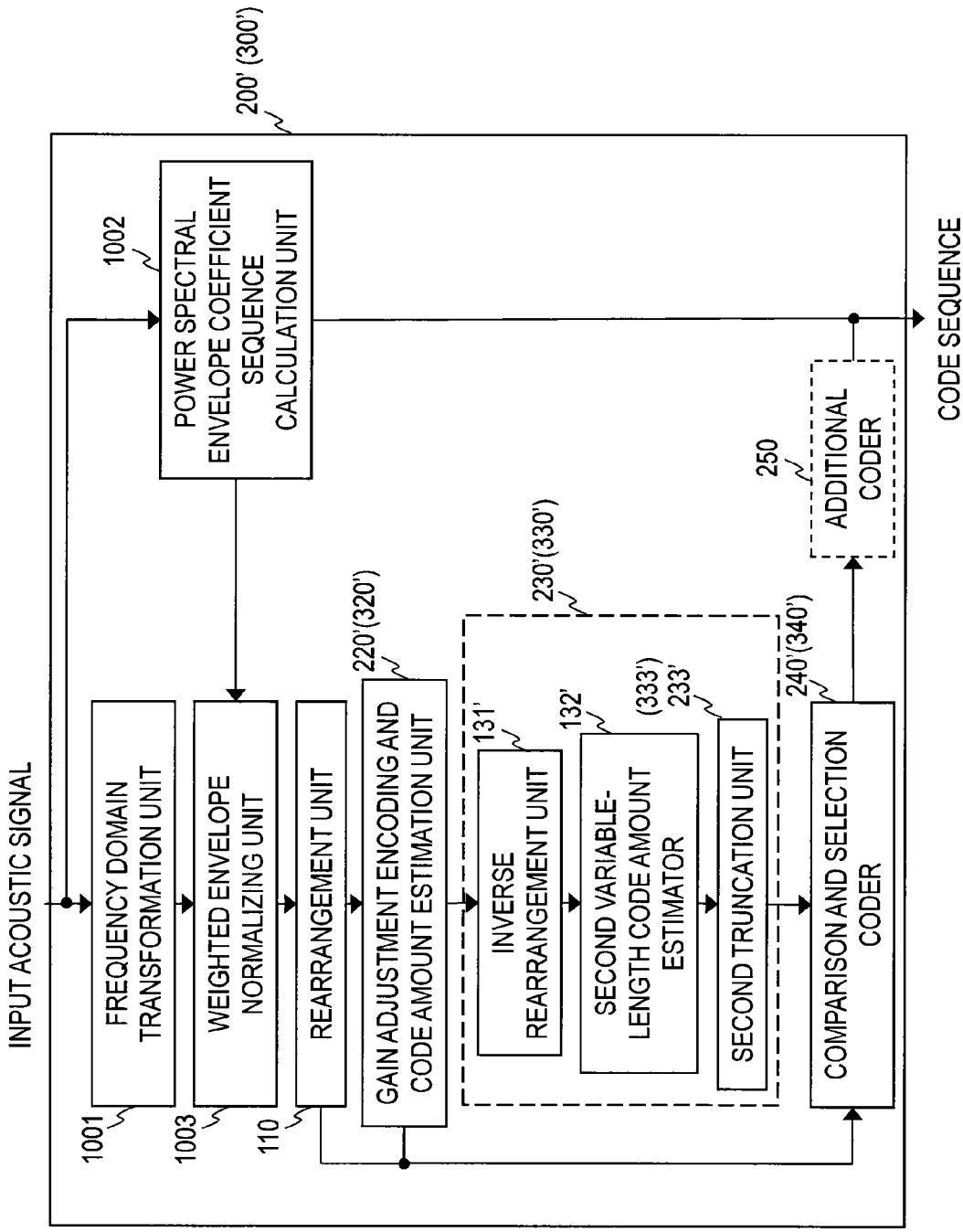
FIG. 7 is a block diagram illustrating a configuration of an encoder in the modified example of the embodiment.

An encoder 200' in the modified example of the second embodiment is illustrated in FIG. 7.

The encoder 200' is the same as the encoder 200 except that the encoder 200' comprises a gain adjustment encoding and code amount estimation unit 220' in place of the gain adjustment coder 220, a second code amount estimator 230' in place of the second coder 230 and a comparison and selection coder 240' in place of the comparison and selection coder 240.

<Gain Adjustment Encoding and Code Amount Estimation Unit 220'>

As illustrated in FIG. 5, the gain adjustment encoding and code amount estimation unit 220' in the modified example of the second embodiment is the same as the gain adjustment coder 220 in the second embodiment except that the gain adjustment encoding and code amount estimation unit 220' comprises a variable-length code amount estimator 1206' in place of the variable-length coder 1206, a decision unit 1207' in place of the decision unit 1207 and a truncation unit 2216' in place of the truncation unit 2216.

<Truncation Unit 2216'>

When the number of consumed bits c output from the variable-length code amount estimator 1206' is not larger than the number of allocated bits B, the truncation unit 2216' outputs the number of consumed bits c as an estimate value of the code amount of the integer signal code, and, when the number of consumed bits c is larger than the number of allocated bits B, the truncation unit 2216' outputs the number of allocated bits B as an estimate value of the code amount of the integer signal code. Further, the truncation unit 2216' also outputs a sum of absolute values of the amplitudes of the samples corresponding to the estimate value of the code amount of the integer signal code output from the truncation unit 2216' (that is, samples to be encoded into the integer signal code).

<Second Code Amount Estimator 230'>

As illustrated in FIG. 7, the second code amount estimator 230' includes an inverse rearrangement unit 131', a second variable-length code amount estimator 132' and a second truncation unit 233'.

<Second Truncation Unit 233'>

When the second number of consumed bits $c_2$ obtained at the second variable-length code amount estimator 132' is not larger than the number of allocated bits B, the second truncation unit 233' outputs the second number of consumed bits $c_2$ obtained at the second variable-length code amount estimator 132' as an estimate value of the code amount of the second integer signal code, and, when the second number of consumed bits $c_2$ obtained at the second variable-length code amount estimator 132' is larger than the number of allocated bits B, the second truncation unit 233' outputs the number of allocated bits B as an estimate value of the code amount of the second integer signal code. Further, the second truncation unit 233' also outputs a sum of absolute values of the amplitudes of the samples corresponding to the estimate value of the code amount of the integer signal code output from the second truncation unit 233' (that is, samples to be encoded into the integer signal code).

<Comparison and Selection Coder 240'>

The comparison and selection coder 240' outputs a code estimated to have smaller encoding distortion of the whole encoder 200' comprising the additional coder between a case where the rearranged sample sequence is set as a target of variable-length encoding and a case where the sample sequence before rearrangement is set as a target of variable-length encoding.

First, specific processing in a case where the rearrangement unit 110 outputs the rearranged sample sequence, that is, in a case where an index which indicates appropriateness of rearrangement and which is generated by the rearrangement unit 110 is equal to or greater than a predetermined threshold or greater than the predetermined threshold will be described.

The comparison and selection coder 240' obtains a total of an estimate value of the code amount of the integer signal code output from the gain adjustment encoding and code amount estimation unit 220' and the code amount of the side information which specifies rearrangement and which is output from the rearrangement unit 110 as CA. Further, the comparison and selection coder 240' obtains an estimate value of the code amount of the second integer signal code output from the second code amount estimator 230' as CB.

If a value of an evaluation indicator $G1=-FA\times(B-CA)+FB\times(B-CB)$ is 0 or greater, where FA is a sum of the absolute values output from the gain adjustment encoding and code amount estimation unit 220', and FB is a sum of the absolute values output from the second code amount estimator 230', the comparison and selection coder 240' performs variable-length encoding of the sample sequence generated by the inverse rearrangement unit 131', which is the integer value sequence obtained by dividing each sample of the sample sequence in the frequency domain by a gain corresponding to the gain code obtained at the gain adjustment encoding and code amount estimation unit 220', to obtain a second integer signal code and outputs the obtained second integer signal code and the gain code output from the gain adjustment encoding and code amount estimation unit 220'. If the value of the evaluation indicator G1 is negative, the comparison and selection coder 240' performs variable-length encoding of the sample sequence generated by the gain adjustment encoding and code amount estimation unit 220', which is the integer value sequence obtained by dividing each sample of the sample sequence obtained by rearranging the sample sequence in the frequency domain by a gain corresponding to the gain code obtained at the gain adjustment encoding and code amount estimation unit 220', to obtain an integer signal code and outputs the obtained integer signal code, the gain code output from the gain adjustment encoding and code amount estimation unit 220' and the side information which specifies rearrangement and which is output from the rearrangement unit 110.

If the evaluation indicator G1=0, the comparison and selection coder 240' may output the second integer signal code obtained as described above, and the gain code output from the gain adjustment encoding and code amount estimation unit 220' or may output the integer signal code obtained as described above, the gain code output from the gain adjustment encoding and code amount estimation unit 220' and the side information which specifies rearrangement and which is output from the rearrangement unit 110.

Next, specific processing in a case where the rearrangement unit 110 outputs the sample sequence before rearrangement, that is, the index which indicates appropriateness of rearrangement and which is generated by the rearrangement unit 110 is less than the predetermined threshold or equal to or less than the predetermined threshold will be described.

The comparison and selection coder 240' obtains an estimate value of the code amount of the integer signal code output from the gain adjustment encoding and code amount estimation unit 220' as CB. Further, the comparison and selection coder 240' obtains a total of an estimate value of the code amount of the second integer signal code output from the second code amount estimator 230' and the code amount of the side information which specifies rearrangement and which is output from the rearrangement unit 110 as CA. If a value of an evaluation indicator G1=−FA×(B−CA)+FB×(B−CB) is negative, where FA is a sum of the absolute values output from the second code amount estimator 230', and FB is a sum of the absolute values output from the gain adjustment encoding and code amount estimation unit 220', the comparison and selection coder 240' performs variable-length encoding of the sample sequence generated at the inverse rearrangement unit 131', which is the integer value sequence obtained by dividing each sample of the sample sequence obtained by rearranging the sample sequence in the frequency domain by a gain corresponding to the gain code obtained at the gain adjustment encoding and code amount estimation unit 220', to obtain a second integer signal code, and outputs the obtained second integer signal code, the gain code output from the gain adjustment encoding and code amount estimation unit 220' and the side information which specifies rearrangement and which is output from the rearrangement unit 110. If the value of the evaluation indicator G1 is 0 or greater, the comparison and selection coder 240' performs variable-length encoding of the sample sequence generated at the gain adjustment encoding and code amount estimation unit 220', which is the integer value sequence obtained by dividing the sample sequence in a frequency domain by a gain corresponding to the gain code obtained at the gain adjustment encoding and code amount estimation unit 220', to obtain an integer signal code and outputs the obtained integer signal code ant the gain code output from the gain adjustment encoding and code amount estimation unit 220'.

If the evaluation indicator G1=0, the comparison and selection coder 240' may output the second integer signal code obtained as described above, the gain code output from the gain adjustment encoding and code amount estimation unit 220' and the side information which specifies rearrangement and which is output from the rearrangement unit 110 or may output the integer signal code obtained as described above and the gain code output from the gain adjustment encoding and code amount estimation unit 220'.

It should be noted that actually, a total code amount comprises the code amount of the gain code output from the gain adjustment encoding and code amount estimation unit 220'. However, the code amount of the gain code in a case where the rearranged sample sequence is set as a target of variable-length encoding is the same as the code amount of the gain code in a case where the sample sequence before rearrangement is set as a target of variable-length encoding. Therefore, neither the above-described CA nor CB comprises the code amount of the gain code. Of course, CA and CB may each comprise the code amount of the gain code.

Further, when the number of bits of the integer signal code obtained through variable-length encoding is larger than the number of allocated bits, the comparison and selection coder 240' removes a code corresponding to the number of bits by which the number of bits of the integer signal code exceeds the number of allocated bits B from the integer signal code obtained through variable-length encoding and outputs the resultant as an integer signal code.

In a similar manner, when the number of bits of the second integer signal code obtained through variable-length encoding is larger than the number of allocated bits, the comparison and selection coder 240' removes a code corresponding to the number of bits by which the number of bits of the second integer signal code exceeds the number of allocated bits B from the second integer signal code obtained through variable-length encoding and outputs the resultant as a second integer signal code.

Third Embodiment

In a similar manner to the second embodiment, a code is also selected taking into account an amount of encoded information in the third embodiment. However, in the third embodiment, a code is selected using an evaluation indicator different from that of the second embodiment. Only a difference between the third embodiment and the second embodiment will be described below.

As illustrated in FIG. 6, the encoder 300 in the third embodiment is the same as the encoder 200 in the second embodiment except that the encoder 300 comprises a gain adjustment coder 320 in place of the gain adjustment coder 220, a second coder 330 in place of the second coder 230 and a comparison selector 340 in place of the comparison selector 240.

<Gain Adjustment Coder 320>

As illustrated in FIG. 3, the gain adjustment coder 320 in the third embodiment is the same as the gain adjustment coder 220 in the second embodiment except that the gain adjustment coder 320 comprises a truncation unit 3216 in place of the truncation unit 2216.

<Truncation Unit 3216>

When the number of consumed bits c output from the decision unit 1207 is larger than the number of allocated bits B, the truncation unit 3216 removes a code corresponding to the number of bits by which the number of consumed bits c exceeds the number of allocated bits B (that is, c-B bits) from the integer signal code output from the decision unit 1207 and outputs the resultant as a new integer signal code (an integer signal code having a code amount equal to or less than an amount of allocated code). On the other hand, when the number of consumed bits c output from the decision unit 1207 is not larger than the number of allocated bits B, the truncation unit 3216 outputs the integer signal code output from the decision unit 1207. Further, the truncation unit 3216 also outputs a sum of the absolute values of the amplitudes of the samples corresponding to the code removed by the truncation unit 3216.

<Second Coder 330>

As illustrated in FIG. 6, the second coder 330 in the third embodiment is the same as the second coder 230 in the second embodiment except that the second coder 330 comprises a second truncation unit 233 in place of the second truncation unit 233.

<Second Truncation Unit 333>

When the second number of consumed bits $c_2$ output from the second variable-length coder 132 is larger than the number of allocated bits B, the second truncation unit 333 removes a code corresponding to the number of bits by which the second number of consumed bits $c_2$ exceeds the number of allocated bits B (that is, $c_2$-B bits) from the second integer signal code output from the second variable-length coder 132 and outputs the resultant as a new second integer signal code (a second integer signal code having a code amount equal to or less than an amount of allocated code). On the other hand, if the second number of consumed bits $c_2$ is not larger than the number of allocated bits B, the second truncation unit 333 outputs the second integer signal code output from the second variable-length coder 132. Further, the second truncation unit 333 also outputs a sum of the absolute values of the amplitudes of the samples corresponding to the code removed by the second truncation unit 333.

<Comparison Selector 340>

The comparison selector 340 outputs a code estimated to have smaller encoding distortion of the whole encoder 300 comprising the additional coder 250 between a case where the rearranged sample sequence is set as a target of variable-length encoding and a case where the sample sequence before rearrangement is set as a target of variable-length encoding.

First, specific processing in a case where the rearrangement unit 110 outputs the rearranged sample sequence, that is, in a case where an index which indicates appropriateness of rearrangement and which is generated by the rearrangement unit 110 is equal to or greater than a predetermined threshold or greater than the predetermined threshold will be described.

The comparison selector 340 obtains a total of a code amount of the integer signal code output from the gain adjustment coder 320 and the code amount of the side information which specifies rearrangement and which is output from the rearrangement unit 110 as CA. The comparison selector 340 obtains a code amount of the second integer signal code output from the second coder 330 as CB. If a value of an evaluation indicator G2=DA−DB+γ(CB−CA) is 0 or greater, where DA is a sum of the absolute values of the amplitudes of the samples corresponding to the code removed at the truncation unit 3216, DB is a sum of the absolute values of the amplitudes of the samples corresponding to the code removed at the second truncation unit 333 and γ is a positive value defined in advance, the comparison selector 340 outputs the second integer signal code output from the second coder 330 and the gain code output from the gain adjustment coder 320, and, if the value of the evaluation indicator G2 is negative, the comparison selector 340 outputs the integer signal code output from the gain adjustment coder 320, the gain code output from the gain adjustment coder 320 and the side information which specifies rearrangement and which is output from the rearrangement unit 110.

If the evaluation indicator G2=0, the comparison selector 340 may output the second integer signal code output from the second coder 330 and the gain code output from the gain adjustment coder 320 or may output the integer signal code output from the gain adjustment coder 320, the gain code output from the gain adjustment coder 320 and the side information which specifies rearrangement and which is output from the rearrangement unit 110.

Next, specific processing in a case where the rearrangement unit 110 outputs the sample sequence before rearrangement, that is, the index which indicates appropriateness of rearrangement and which is generated by the rearrangement unit 110 is less than the predetermined threshold or equal to or less than the predetermined threshold will be described.

The comparison selector 340 obtains a code amount of the integer signal code output from the gain adjustment coder 320 as CB. Further, the comparison selector 340 obtains a total of a code amount of the second integer signal code output from the second coder 330 and a code amount of the side information which specifies rearrangement and which is output from the rearrangement unit 110 as CA. If a value of an evaluation indicator G2=DA−DB+γ(CB−CA) is negative, where DA is a sum of the absolute values of the amplitudes of the samples corresponding to the code removed at the second truncation unit 333, DB is a sum of the absolute values of the amplitudes of the samples corresponding to the code removed at the truncation unit 3216, and γ is a positive value defined in advance, the comparison selector 340 outputs the second integer signal code output from the second coder 330, the gain code output from the gain adjustment coder 320 and the side information which specifies rearrangement and which is output from the rearrangement unit 110, and, if the value of the evaluation indicator G2 is 0 or greater, the comparison selector 340 outputs the integer signal code output from the gain adjustment coder 320 and the gain code output from the gain adjustment coder 320.

If the evaluation indicator G2=0, the comparison selector 340 may output the second integer signal code output from the second coder 330, the gain code output from the gain adjustment coder 320 and the side information which specifies rearrangement and which is output from the rearrangement unit 110 or may output the integer signal code output from the gain adjustment coder 320 and the gain code output from the gain adjustment coder 320.

It should be noted that actually, a total code amount comprises the code amount of the gain code output from the gain adjustment coder 320. However, the code amount of the gain code in a case where the rearranged sample sequence is set as a target of variable-length encoding is the same as the code amount of the gain code in a case where the sample sequence before rearrangement is set as a target of variable-length encoding. Therefore, neither the above-described CA nor CB comprises the code amount of the gain code. Of course, CA and CB may each comprise the code amount of the gain code.

The point is that if the evaluation indicator G2 is negative, it is inferred that encoding distortion of the whole encoder 300 is smaller when the rearranged sample sequence is used as an encoding target. It should be noted that the evaluation indicator G2 can be derived as follows assuming that FA=FB and using Formulas (5) and (7).

$$DA + FA \times (1 - (B-CA) \times \delta) - DB + FB \times (1 - (B-CB) \times \delta) =$$
$$DA - FA \times (B-CA) \times \delta - DB + FB \times (B-CB) \times \delta =$$
$$DA - DB - FA \times (CB - CA) \times \delta = DA - DB + \gamma(CB - CA) \quad (10)$$

where γ=FA×δ. It should be noted that the assumption FA=FB is based on assumption that the amount of information encoded through variable-length encoding is the same regardless of whether or not the sequence is rearranged because encoding is performed on a sequence divided by the same gain.

[Modified Example of the Third Embodiment]

While, in the third embodiment, a code is selected using an actual code amount, a code may be selected using an estimate value of the code amount. An example of selecting a code using an estimate value of the code amount will be described as a modified example of the third embodiment. Only a difference between the modified example of the third embodiment, and the modified example of the first embodiment and the third embodiment will be described below.

<Encoder 300'>

As illustrated in FIG. 7, the encoder 300' in the modified example of the third embodiment is the same as the encoder 300 except that the encoder 300' comprises a gain adjustment encoding and code amount estimation unit 320' in place of the gain adjustment coder 320, a second code amount estimator 330' in place of the second coder 330 and a comparison and selection coder 340' in place of the comparison and selection coder 340.

<Gain Adjustment Encoding and Code Amount Estimation Unit 320'>

As illustrated in FIG. 5, the gain adjustment encoding and code amount estimation unit 320' in the modified example of the third embodiment is the same as the gain adjustment coder 320 in the third embodiment except that the gain adjustment encoding and code amount estimation unit 320' comprises a variable-length code amount estimator 1206' in place of the variable-length coder 1206, a decision unit 1207' in place of the decision unit 1207 and a truncation unit 3216' in place of the truncation unit 3216.

<Truncation Unit 3216'>

When the number of consumed bits c output from the variable-length code amount estimator 1206' is not larger than the number of allocated bits B, the truncation unit 3216' outputs the number of consumed bits c as an estimate value of the code amount of the integer signal code, and, when the number of consumed bits c is larger than the number of allocated bits B, the truncation unit 3216' outputs the number of allocated bits B as an estimate value of the code amount of the integer signal code. Further, the truncation unit 3216' also outputs a sum of absolute values of the amplitudes of the samples obtained by removing the samples corresponding to the estimate value of the code amount of the integer signal code output from the truncation unit 3216' (that is, samples to be encoded into the integer signal code) from the samples corresponding to the number of consumed bits c output from the variable-length code amount estimator 1206' (that is, samples to be encoded into the integer signal code corresponding to the number of consumed bits c).

<Second Code Amount Estimator 330'>

As illustrated in FIG. 7, the second code amount estimator 330' includes an inverse rearrangement unit 131', a second variable-length code amount estimator 132' and a second truncation unit 333'.

<Second Truncation Unit 333'>

When the second number of consumed bits $c_2$ obtained by the second variable-length code amount estimator 132' is not larger than the number of allocated bits B, the second truncation unit 333' outputs the second number of consumed bits $c_2$ obtained by the second variable-length code amount estimator 132' as an estimate value of the code amount of the second integer signal code, and, when the second number of consumed bits $c_2$ obtained by the second variable-length code amount estimator 132' is larger than the number of allocated bits B, the second truncation unit 333' outputs the number of allocated bits B as an estimate value of the code amount of the second integer signal code. Further, the second truncation unit 333' also outputs a sum of absolute values of the amplitudes of the samples obtained by removing samples corresponding to the estimate value of the code amount of the second integer signal code output from the second truncation unit 333' (that is, samples to be encoded into the second integer signal code) from the samples corresponding to the second number of consumed bits $c_2$ output from the second variable-length code amount estimator 132' (that is, samples to be encoded into the second integer signal code corresponding to the second number of consumed bits $c_2$).

<Comparison and Selection Coder 340'>

The comparison and selection coder 340' outputs a code estimated to have smaller encoding distortion of the whole encoder 300' comprising the additional coder 250 between a case where the rearranged sample sequence is set as a target of variable-length encoding and a case where the sample sequence before rearrangement is set as a target of variable-length encoding.

First, specific processing in a case where the rearrangement unit 110 outputs the rearranged sample sequence, that is, in a case where an index which indicates appropriateness of rearrangement and which is generated by the rearrangement unit 110 is equal to or greater than a predetermined threshold or greater than the predetermined threshold will be described.

The comparison and selection coder 340' obtains a total of an estimate value of the code amount of the integer signal code output from the gain adjustment encoding and code amount estimation unit 320' and the code amount of the side information which specifies rearrangement and which is output from the rearrangement unit 110 as CA. Further, the comparison and selection coder 340' obtains an estimate value of the code amount of the second integer signal code output from the second code amount estimator 330' as CB. If a value of an evaluation indicator G2=DA−DB+γ(CB−CA) is 0 or greater, where DA is a sum of the absolute values output from the truncation unit 3216', DB is a sum of the absolute values output from the second truncation unit 333' and γ is a positive value defined in advance, the comparison and selection coder 340' performs variable-length encoding of the sample sequence generated by the inverse rearrangement unit 131', which is the integer value sequence obtained by dividing each sample of the sample sequence in the frequency domain by a gain corresponding to the gain code obtained at the gain adjustment encoding and code amount estimation unit 320', to obtain a second integer signal code and outputs the obtained second integer signal code and the gain code output from the gain adjustment encoding and code amount estimation unit 320'. If the value of the evaluation indicator G2 is negative, the comparison and selection coder 340' performs variable-length encoding of the sample sequence generated by the gain adjustment encoding and code amount estimation unit 320', which is the integer value sequence obtained by dividing each sample of the sample sequence obtained by rearranging the sample sequence in the frequency domain by a gain corresponding to the gain code obtained at the gain adjustment encoding and code amount estimation unit 320', to obtain an integer signal code and outputs the obtained integer signal code, the gain code output from the gain adjustment encoding and code amount estimation unit 320' and the side information which specifies rearrangement and which is output from the rearrangement unit 110.

If the evaluation indicator G2=0, the comparison and selection coder 340' may output the second integer signal code obtained as described above and the gain code output from the gain adjustment encoding and code amount estimation unit 320' or may output the integer signal code obtained as described above, the gain code output from the gain adjustment encoding and code amount estimation unit 320' and the side information which specifies rearrangement and which is output from the rearrangement unit 110.

Next, specific processing in a case where the rearrangement unit 110 outputs the sample sequence before rearrangement, that is, the index which indicates appropriateness of rearrangement and which is generated by the rearrangement unit 110 is less than the predetermined threshold or equal to or less than the predetermined threshold will be described.

The comparison and selection coder 340' obtains an estimate value of the code amount of the integer signal code output from the gain adjustment encoding and code amount estimation unit 320' as CB. Further, the comparison and selection coder 340' obtains a total of an estimate value of the code amount of the second integer signal code output from the second code amount estimator 330' and the code amount of the side information which specifies rearrangement and which is output from the rearrangement unit 110 as CA. If a value of an evaluation indicator G2=DA−DB+ γ(CB−CA) is negative, where DA is a sum of the absolute values output from the second truncation unit 333', DB is a sum of the absolute values output from the truncation unit 3216' and γ is a positive value defined in advance, the comparison and selection coder 340' performs variable-length encoding of the sample sequence generated at the inverse rearrangement unit 131', which is the integer value sequence obtained by dividing each sample of the sample sequence obtained by rearranging the sample sequence in the frequency domain by a gain corresponding to the gain code obtained at the gain adjustment encoding and code amount estimation unit 320', to obtain an integer signal code and outputs the obtained integer signal code, the gain code output from the gain adjustment encoding and code amount estimation unit 320' and the side information which specifies rearrangement and which is output from the rearrangement unit 110. If the value of the evaluation indicator G2 is 0 or greater, the comparison and selection coder 340' performs variable-length encoding of the sample sequence generated at the gain adjustment encoding and code amount estimation unit 320', which is the integer value sequence obtained by dividing each sample of the sample sequence in the frequency domain by a gain corresponding to the gain code obtained at the gain adjustment encoding and code amount estimation unit 320', to obtain a second integer signal code and outputs the obtained second integer signal code and the gain code output from the gain adjustment encoding and code amount estimation unit 320'.

If the evaluation indicator G2=0, the comparison and selection coder 340' may output the second integer signal code obtained as described above, the gain code output from the gain adjustment encoding and code amount estimation unit 320' and the side information which specifies rearrangement and which is output from the rearrangement unit 110 or may output the integer signal code obtained as described above and the gain code output from the gain adjustment encoding and code amount estimation unit 320'.

It should be noted that actually, a total code amount comprises the code amount of the gain code output from the gain adjustment encoding and code amount estimation unit 320'. However, the code amount of the gain code in a case where the rearranged sample sequence is used as a target of variable-length encoding is the same as the code amount of the gain code in a case where the sample sequence before rearrangement is used as a target of variable-length encoding. Therefore, neither the above-described CA nor CB comprises the code amount of the gain code. Of course, CA and CB may each comprise the code amount of the gain code.

Further, when the number of bits of the integer signal code obtained through variable-length encoding is larger than the number of allocated bits, the comparison and selection coder 340' removes a code corresponding to the number of bits by which the number of bits of the integer signal code exceeds the number of allocated bits B from the integer signal code obtained through variable-length encoding and outputs the resultant as an integer signal code.

In a similar manner, when the number of bits of the second integer signal code obtained through variable-length encoding is larger than the number of allocated bits, the comparison and selection coder 340' removes a code corresponding to the number of bits by which the number of bits of the second integer signal code exceeds the number of allocated bits B from the second integer signal code obtained through variable-length encoding and outputs the resultant as a second integer signal code.

[Modified Examples, or the Like]

The present invention is not limited to the above-described embodiments. For example, in the first embodiment and the modified example thereof, at least one of CA and CB may not comprise the code amount of the side information that specifies rearrangement. Further, in the first embodiment and the modified example thereof, the processing executed in a case where CA>CB may be executed when CA≥CB, and the processing executed in a case where CA>CB does not hold may be executed when CA≥CB does not hold. Further, in the second and third embodiments and the modified examples thereof, the processing executed in a case where the value of the evaluation indicator is negative may be executed when the value of the evaluation indicator is 0 or less, and the processing executed in a case where the value of the evaluation indicator is 0 or greater may be executed when the value of the evaluation indicator is positive. Further, while in the above-described embodiments, the processing by the gain upper bound setter is performed when the number of consumed bits is smaller than the number of allocated bits and the decision unit outputs the gain, or the like, when the number of consumed bits is equal to the number of allocated bits; the processing by the gain upper bound setter may be performed when the number of consumed bits is not larger than the number of allocated bits.

In the description of the rearrangement unit 110 and the gain adjustment coder 120 in the above-described embodiments, an example has been described as an "encoding method based on periodicity", where the sample sequence in the frequency domain is encoded by dividing by a gain, a sample sequence obtained by rearranging the sample sequence in the frequency domain so that samples corresponding to the characteristic amount of periodicity and integral multiple thereof and samples in the vicinity of the samples are gathered as a group at a lower frequency side. For example, the encoder 100 of the first embodiment which comprises these eventually has a configuration equivalent to that in FIG. 10.

Figure 10:
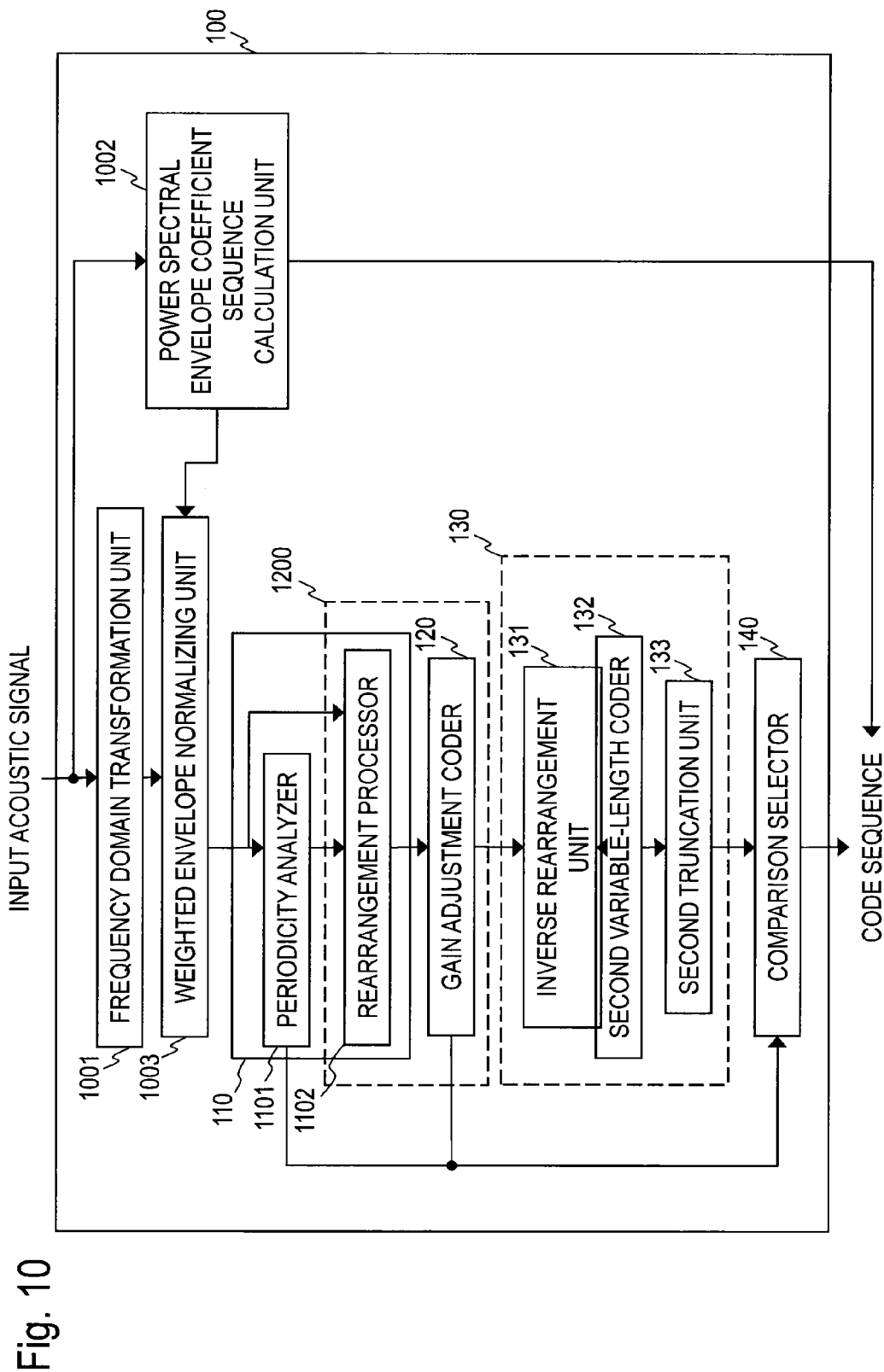
FIG. 10 is a block diagram illustrating a configuration of an encoder of an embodiment.

As illustrated in FIG. 10, the rearrangement unit 10 comprises a periodicity analyzer 1101 and a rearrangement processor 1102. The periodicity analyzer 1101 calculates an index indicating a degree of periodicity using the weighted normalized MDCT coefficient sequence ("sample sequence in the frequency domain" or simply "sample sequence") output from the weighted envelope normalizing unit 1003. When the index indicating the degree of periodicity calculated at the periodicity analyzer 1101 is greater than a predetermined threshold (the index represents that the periodicity is high), the rearrangement processor 1102 outputs the sample sequence obtained through rearrangement processing being performed on the sample sequence by the rearrangement unit 110 as explained in the first embodiment. Meanwhile, when the index indicating the degree of periodicity is equal to or smaller than the predetermined threshold (the index represents that the periodicity is low), the rearrangement processor 1102 outputs the sample sequence before rearrangement, that is, the sample sequence output from the weighted envelope normalizing unit 1003.

When the index indicating the degree of periodicity calculated at the periodicity analyzer 1101 is greater than the predetermined threshold (the index represents that the periodicity is high), the gain adjustment coder 120 outputs the integer signal code obtained by encoding the sample sequence using an encoding method based on periodicity and the gain code, and, when the index indicating the degree of periodicity calculated at the periodicity analyzer 1101 is equal to or smaller than the predetermined threshold (the index represents that the periodicity is low), the gain adjustment coder 120 outputs the integer signal code obtained by encoding the sample sequence using an encoding method which is not based on periodicity, and the gain code.

That is, when the index indicating the degree of periodicity represents that the periodicity is high, the first coder 1200 including the rearrangement processor 1102 and the gain adjustment coder 120 obtains through loop processing, a gain code corresponding to the gain used for dividing each sample of the sample sequence in the frequency domain and the integer signal code obtained by encoding using an encoding method based on periodicity, the sequence comprised of integer value samples obtained by dividing each sample of the sample sequence in the frequency domain by the gain. Further, when the index indicating the degree of periodicity represents that the periodicity is low, the first coder 1200 obtains through loop processing, a gain code corresponding to the gain used for dividing each sample of the sample sequence in the frequency domain and the integer signal code obtained by encoding using an encoding method which is not based on periodicity, the sequence comprised of integer value samples obtained by dividing each sample of the sample sequence in the frequency domain by the gain.

When the index indicating the degree of periodicity calculated at the periodicity analyzer 1101 is equal to or smaller than the predetermined threshold (the index represents that the periodicity is low), the inverse rearrangement unit 131 outputs the sample sequence obtained by performing rearrangement processing on the sample sequence as explained in the explanation of the rearrangement unit 110. Meanwhile, when the index indicating the degree of periodicity is greater than the predetermined threshold (the index represents that the periodicity is high), the inverse rearrangement unit 131 outputs the sample sequence before rearrangement, that is, the sample sequence output from the weighted envelope normalizing unit 1003. That is, a relationship of the output sample sequence and the index indicating the degree of periodicity is inverse between the inverse rearrangement unit 131 and the rearrangement processor 1102.

That is, when the index indicating the degree of periodicity represents that the periodicity is low, the second coder 130 including the inverse rearrangement unit 131, the second variable-length coder 132 and the second truncation unit 133 obtains through loop processing, a gain code corresponding to the gain used for dividing each sample of the sample sequence in the frequency domain, and an integer signal code obtained by encoding using an encoding method based on periodicity, a sequence comprised of integer value samples obtained by dividing each sample of the sample sequence in the frequency domain by the gain. Meanwhile, when the index indicating the degree of periodicity represents that the periodicity is high, the second coder 130 obtains through loop processing, a gain code corresponding to the gain used for dividing each sample of the sample sequence in the frequency domain, and an integer signal code obtained by encoding using an encoding method which is not based on periodicity, a sequence comprised of integer value samples obtained by dividing each sample of the sample sequence in the frequency domain by the gain.

That is, a relationship of the implemented encoding method (the encoding method based on periodicity or the encoding method which is not based on periodicity) and the index indicating the degree of periodicity is inverse between the first coder 1200 and the second coder 130.

While a method in which the sample sequence obtained by rearranging the sample sequence in the frequency domain is encoded has been described in the above-described example as an "encoding method based on periodicity", it is also possible to use other encoding methods based on periodicity. For example, it is also possible to employ a configuration as illustrated in FIG. 11.

Figure 11:
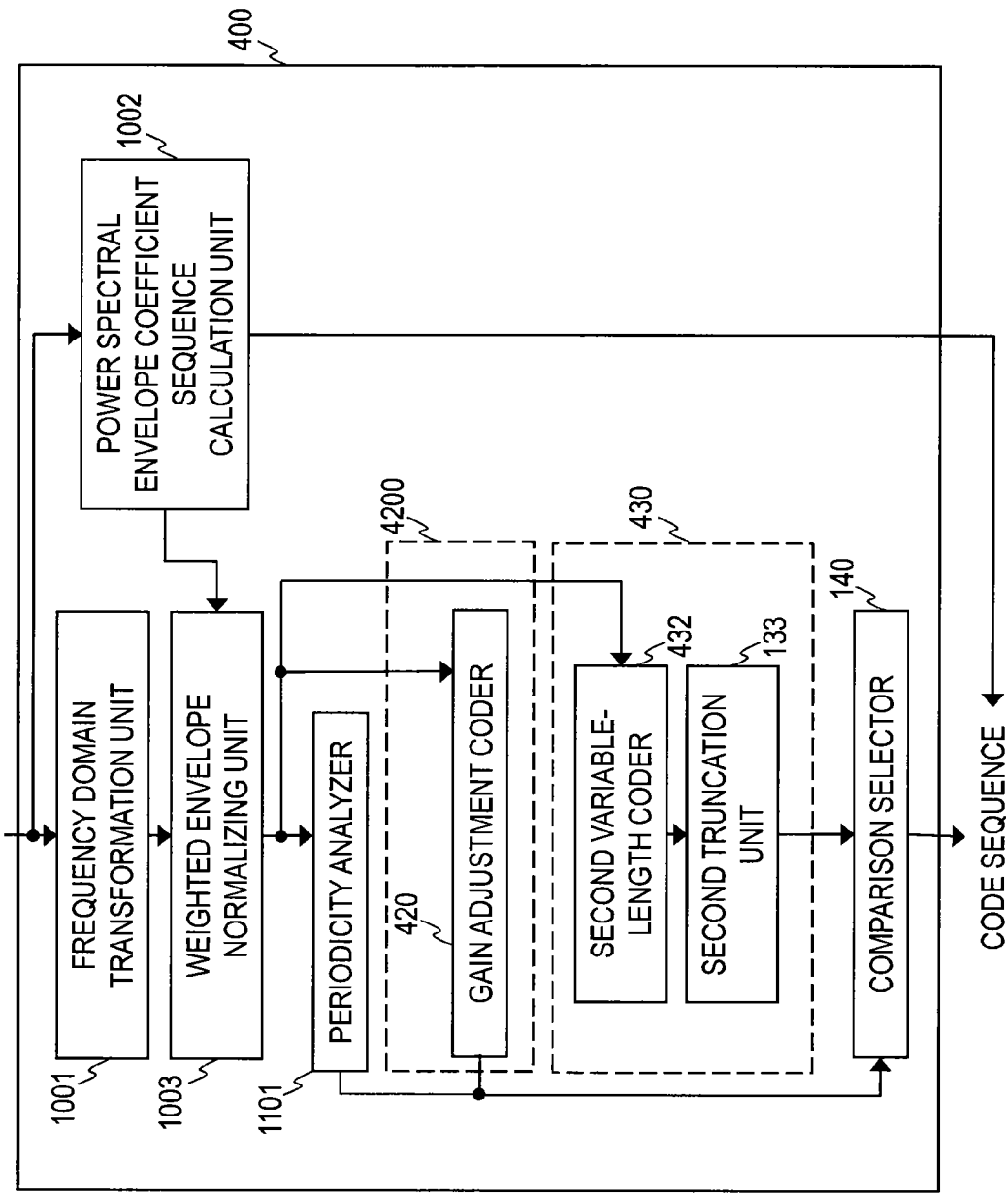
FIG. 11 is a block diagram illustrating a configuration of an encoder of an embodiment.

In an encoder 400 illustrated in FIG. 11, the first coder 1200 in the encoder 100 illustrated in FIG. 10 is replaced by a first coder 4200, and the second coder 130 is replaced by a second coder 430. The first coder 4200 comprises a gain adjustment coder 420, and the second coder 430 comprises a second variable-length coder 432 and a second truncation unit 133, but does not comprise a rearrangement processor or an inverse rearrangement unit.

Figure 12:
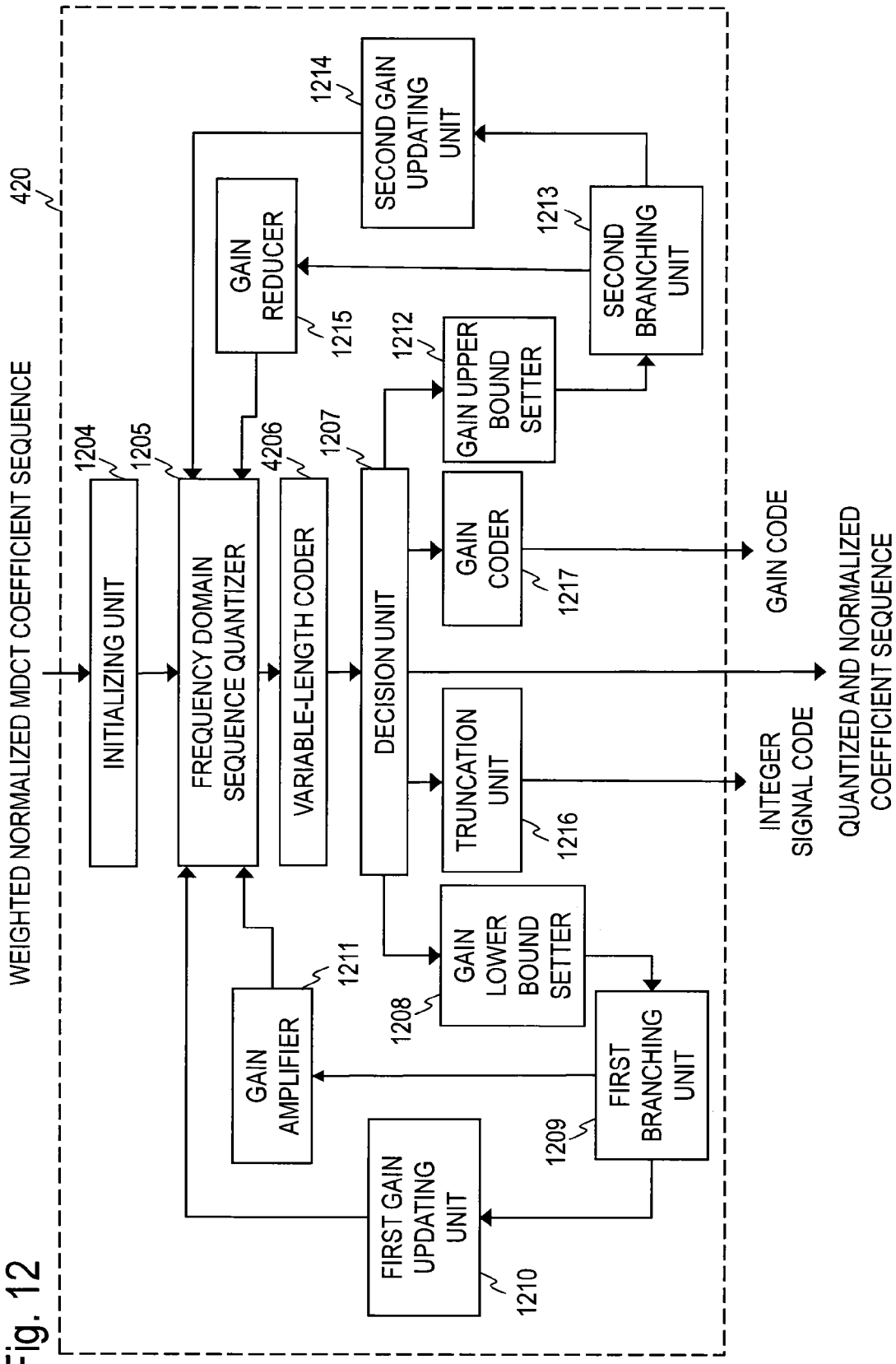
FIG. 12 is a block diagram illustrating a configuration of a gain adjustment coder of an embodiment.

FIG. 12 illustrates a detailed configuration of the gain adjustment coder 420 in FIG. 11. In the gain adjustment coder 420, the variable-length coder 1206 in the gain adjustment coder 120 in FIG. 3 is replaced by a variable-length coder 4206. When the index indicating appropriateness of rearrangement is greater than a threshold (the index indicating the degree of periodicity represents that the periodicity is high), the variable-length coder 4206 performs encoding based on periodicity, and, otherwise, performs the same processing as that performed in the variable-length coder 1206 in FIG. 3.

The encoding method based on periodicity described here is an encoding method based on an interval T and a method in which the input sample sequence in the frequency domain is encoded without being rearranged, and a code sequence obtained by the encoding is output. This encoding method based on periodicity will be described below.

The variable-length coder 4206 encodes a sample group Gr1 comprised of samples of all or part of one or a plurality of successive samples comprising a sample corresponding to the interval T in the input sample sequence in the frequency domain, and one or a plurality of successive samples comprising a sample corresponding to the integer multiple of the interval T in the sample sequence in the frequency domain, and a sample group Gr2 comprised of samples not comprised in the sample group Gr1 in the sample sequence in the frequency domain, (while distinguishing the groups) according to different standards, and outputs the obtained code sequence.

[Specific Examples of Sample Groups Gr1 and Gr2]

A specific example of the "samples of all or part of one or a plurality of successive samples comprising a sample corresponding to the interval T in the sample sequence in the frequency domain, and one or a plurality of successive samples comprising a sample corresponding to the integer multiple of the interval T in the sample sequence in the frequency domain" is the same as that in the first embodiment, and a group comprised of such samples is a sample group Gr1. As described in the first embodiment, there are various options for a method for setting such sample group Gr1. For example, in the sample sequence input to the variable-length coder 4206, a set of a sample group comprised of three samples F(nT−1), F(nT), F(nT+1) comprising samples F(nT−1) and F(nT+1) before and after the sample F(nT) which corresponds to the integer multiple of the interval T is an example of the sample group Gr1. For example, when n indicates each integer from 1 to 5, the sample group Gr1 is a group comprised of a first sample group F(T−1), F(T), F(T+1), a second sample group F(2T−1), F(2T), F(2T+1), a third sample group F(3T−1), F(3T), F(3T+1), a fourth sample group F(4T−1), F(4T), F(4T+1), and a fifth sample group F(5T−1), F(5T), F(5T+1).

A group comprised of samples not comprised in the sample group Gr1 in the sample sequence input to the variable-length coder 4206 is the sample group Gr2. For example, when n indicates each integer from 1 to 5, the sample group Gr2 is a group comprised of a first sample set F(1), . . . , F(T−2), a second sample set F(T+2), . . . , F(2T−2), a third sample set F(2T+2), . . . , F(3T−2), a fourth sample set F(3T+2), . . . , F(4T−2), a fifth sample set F(4T+2), . . . , F(5T−2), and a sixth sample set F(5T+2), . . . , F(jmax).

Alternatively, as illustrated in the first embodiment, when the interval T is a decimal, for example, the sample group Gr1 may be a set of sample groups comprised of F(R(nT−1)), F(R(nT)), F(R(nT+1)), where R(nT) is a value obtained by rounding off nT. Further, the number of samples or a sample index comprised in each sample group constituting the sample group Gr1 may be variable, or information indicating one of a plurality of options with different combinations of the number of samples and a sample index comprised in each sample group constituting the sample group Gr1 may be output as side information (first side information).

In the encoding method based on periodicity described here, the sample group Gr1 and the sample group Gr2 are encoded according to standards different from each other without samples comprised in the sample groups Gr1 and Gr2 being rearranged, and the code sequence obtained thorough the encoding is output.

The samples comprised in the sample group Gr1 have a larger average amplitude than that of the samples comprised in the sample group Gr2. At this time, for example, the samples comprised in the sample group Gr1 are subjected to variable-length encoding according to a standard corresponding to a magnitude of the amplitude of the samples comprised in the sample group Gr1 or an estimate value of the magnitude, and the samples comprised in the sample group Gr2 are subjected to variable-length encoding according to a standard corresponding to a magnitude of the amplitude of the samples comprised in the sample group Gr2 or an estimate value of the magnitude. With this configuration, it is possible to improve estimation accuracy of the amplitude of the samples, so that it is possible to reduce an average code amount of the variable length code compared to a case where all the samples comprised in the sample sequence are subjected to variable-length encoding according to the same standard. That is, if the sample group Gr1 and the sample group Gr2 are encoded according to standards different from each other, it is possible to obtain an advantage that the code amount of the sample sequence can be reduced without rearrangement operation. Examples of the magnitude of the amplitude comprise an absolute value of the amplitude and an energy of the amplitude.

[Example of Rice Coding]

An example of using Rice coding for each sample in variable-length encoding will be described.

In this case, the variable-length coder 4206 performs Rice coding for each sample on the samples comprised in the sample group Gr1 using a Rice parameter corresponding to the magnitude of the amplitudes of the samples comprised in the sample group Gr1 or an estimate value of the magnitude. Further, the variable-length coder 4206 performs Rice coding for each sample on the samples comprised in the sample group Gr2 using a Rice parameter corresponding to the magnitude of the amplitudes of the samples comprised in the sample group Gr2 or an estimate value of the magnitude, and outputs the code sequence obtained through Rice coding and side information for specifying the Rice parameter.

For example, the variable-length coder 4206 obtains a Rice parameter of the sample group Gr1 in the frame from an average of the magnitude of the amplitudes of the samples comprised in the sample group Gr1 in each frame. For example, the variable-length coder 4206 obtains a Rice parameter of the sample group Gr2 in the frame from an average of the magnitude of the amplitudes of the samples comprised in the sample group Gr2 in each frame. The Rice parameter is an integer of 0 or greater. The variable-length coder 4206 performs Rice coding on the samples comprised in the sample group Gr1 using the Rice parameter of the sample group Gr1 in each frame and performs Rice coding on the samples comprised in the sample group Gr2 using the Rice parameter of the sample group Gr2. By this means, it is possible to reduce an average code amount. This will be described in detail below.

First, a case where Rice coding is performed on the samples comprised in the sample group Gr1 for each sample will be described.

A code obtained by performing Rice coding on the samples $X(k)$ comprised in the sample group Gr1 for each sample comprises prefix (k) obtained by performing unary coding on a quotient $q(k)$ obtained by dividing the samples $X(k)$ by a value corresponding to the Rice parameter s of the sample group Gr1 and sub(k) which specifies the remainder. That is, a code corresponding to the samples $X(k)$ in this example comprises prefix(k) and sub(k). It should be noted that the samples $X(k)$ to be subjected to Rice coding are expressed by integers.

A method for calculating $q(k)$ and sub(k) will be illustrated below.

If a Rice parameter s>0, a quotient q(k) is generated as follows, where floor($\chi$) is a maximum integer equal to or less than $\chi$.

$$q(k)=\text{floor}(X(k)/2^{s-1})(\text{for } X(k)\geq 0) \quad (B1)$$

$$q(k)=\text{floor}\{(-X(k)-1)/2^{s-1}\} \text{ (for } X(k)<0) \quad (B2)$$

If the Rice parameter s=0, a quotient q(k) is generated as follows.

$$q(k)=2\times X(k)(\text{for } X(k)\geq 0) \quad (B3)$$

$$q(k)=-2\times X(k)-1 \text{ (for } X(k)<0) \quad (B4)$$

If the Rice parameter s>0, sub(k) is generated as follows, $$\text{sub}(k)=X(k)-2^{s-1}\times q(k)+2^{s-1} \text{ (for } X(k)\geq 0) \quad (B5)$$

$$\text{sub}(k)=(-X(k)-1)-2^{s-1}\times q(k)(\text{for } X(k)<0) \quad (B6)$$

If the Rice parameter s=0, sub(k) is null (sub(k)=null).

The quotient q(k) can be expressed as follows by combining Formulas (B1) to (B4), where |•| indicates an absolute value of •.

$$q(k)=\text{floor}\{(2\times |X(k)|-z)/2^s\}(z=0 \text{ or } 1 \text{ or } 2) \quad (B7)$$

In the case of Rice coding, prefix(k) is a code obtained by performing unary coding on the quotient q(k), and its code amount can be expressed as follows using Formula (B7).

$$\text{floor}\{(2\times |X(k)|-z)/2^s\}+1 \quad (B8)$$

In the case of Rice coding, sub(k) which specifies the remainder of Formulas (B5) and (B6) is expressed with s bits. Therefore, the total code amount C(s, X(k), Gr1) of the code (prefix (k) and sub(k)) corresponding to the sample X(k) comprised in the sample group Gr1 becomes as follows.

$$C(s, X(k), Gr1) = \sum_{k\in Gr1}[\text{floor}\{(2\times |X(k)|-z)/2^s\}+1+s] \quad (B9)$$

When floor $\{(2\times|X(k)|-z)/2^s\}=(2\times|X(k)|-z)/2^s$ is approximated, Formula (B9) can be approximated as follows, where |Gr1| is the number of samples X(k) comprised in the sample group Gr1 in one frame.

$$C(s, X(k), Gr1) = 2^{-S}(2\times D - z\times|Gr1|) + (1+s)\times|Gr1| \quad (B10)$$

$$D = \sum_{k\in Gr1}|X(k)|$$

s which makes a partial differential result for s in Formula (B10) 0 is expressed by s'.

$$s'=\log_2\{\ln 2\times(2\times D/|Gr1|-z)\} \quad (B11)$$

when D/|Gr1| is sufficiently greater than z, Formula (B11) can be approximated as follows.

$$s'=\log_2\{\ln 2\times(2\times D/|Gr1|)\} \quad (B12)$$

Because s' which can be obtained by Formula (B12) has not been converted into an integer, a value obtained by quantizing s' into an integer is set as a Rice parameter s. This Rice parameter s corresponds to an average D/|Gr1| of the magnitude of the amplitudes of the samples comprised in the sample group Gr1 (see Formula (B12)), and minimizes the total code amount of the code corresponding to the samples X(k) comprised in the sample group Gr1.

The above also applies to a case where the samples comprised in the sample group Gr2 is subjected to Rice coding. Therefore, by obtaining a Rice parameter for the sample group Gr1 from an average of the magnitude of the amplitudes of the samples comprised in the sample group Gr1 in each frame, obtaining a Rice parameter for the sample group Gr2 from an average of the magnitude of the amplitudes of the samples comprised in the sample group Gr2 and performing Rice coding on the sample groups Gr1 and Gr2 apart, it is possible to minimize the total code amount.

It should be noted that assessment of the total code amount C(s, X(k), Gr1) using the approximated Formula (B10) is more appropriate when fluctuation of the magnitude of the amplitudes of the samples X(k) is smaller. Therefore, particularly, when the magnitude of the amplitudes of the samples comprised in the sample group Gr1 is substantially equal and the magnitude of the amplitudes of the samples comprised in the sample group Gr2 is substantially equal, it is possible to obtain a larger code amount reduction effect.

[Example 1 of Side Information for Specifying Rice Parameter]

When the Rice parameter corresponding to the sample group Gr1 is discriminated from the Rice parameter corresponding to the sample group Gr2, at the decoding side, side information (third side information) for specifying the Rice parameter corresponding to the sample group Gr1 and side information (fourth side information) for specifying the Rice parameter corresponding to the sample group Gr2 are required. Therefore, the variable-length coder 4206 may output the third side information and the fourth side information in addition to the code sequence comprised of the codes obtained by performing Rice coding on the sample sequence for each sample.

[Example 2 of Side Information for Specifying Rice Parameter]

When the acoustic signal is an encoding target, an average of the magnitude of the amplitudes of the samples comprised in the sample group Gr1 is greater than an average of the magnitude of the amplitudes of the samples comprised in the sample group Gr2, and the Rice parameter corresponding to the sample group Gr1 is greater than the Rice parameter corresponding to the sample group Gr2. This can be utilized to reduce a code amount of the side information for specifying the Rice parameter.

For example, it is defined that the Rice parameter corresponding to the sample group Gr1 is greater than the Rice parameter corresponding to the sample group Gr2 by a fixed value (for example, 1). That is, it is assumed that a relationship of "the Rice parameter corresponding to the sample group Gr1=the Rice parameter corresponding to the sample group Gr2+a fixed value" is satisfied in a fixed manner. In this case, the variable-length coder 4206 only has to output one of the third side information and the fourth side information in addition to the code sequence.

[Example 3 of Side Information for Specifying Rice Parameter]

It is also possible to set information which can be used alone to specify the Rice parameter corresponding to the sample group Gr1 as fifth side information, and set information which can be used to specify a difference between the Rice parameter corresponding to the sample group Gr1 and the Rice parameter corresponding to the sample group Gr2 as sixth side information. Inversely, it is also possible to set information which can be used alone to specify the Rice parameter corresponding to the sample group Gr2 as the sixth side information and set information which can be used to specify the difference between the Rice parameter corresponding to the sample group Gr1 and the Rice parameter corresponding to the sample group Gr2 as the fifth side information. It should be noted that because it is known that the Rice parameter corresponding to the sample group Gr1 is greater than the Rice parameter corresponding to the sample group Gr2, side information (such as information indicating positive or negative) indicating a magnitude relationship between the Rice parameter corresponding to the sample group Gr1 and the Rice parameter corresponding to the sample group Gr2 is not required.

[Example 4 of Side Information for Specifying Rice Parameter]

When the number of code bits assigned to the whole frame is defined, the value of the gain is considerably restricted, and a possible range of the amplitudes of the samples is also considerably restricted. In this case, it is possible to estimate an average of the magnitude of the amplitudes of the samples with some degree of accuracy from the number of code bits assigned to the whole frame. The variable-length coder 4206 may perform Rice coding using the Rice parameter estimated from an estimate value of the average of the magnitude of the amplitudes of the samples.

For example, the variable-length coder 4206 may use a value obtained by adding a first positive difference value (for example, 1) to the estimated Rice parameter as the Rice parameter corresponding to the sample group Gr1 and may use the estimated Rice parameter as the Rice parameter corresponding to the sample group Gr2. Alternatively, the variable-length coder 4206 may use the estimated Rice parameter as the Rice parameter corresponding to the sample group Gr1 and may use a value obtained by subtracting a positive second difference value (for example, 1) from the estimated Rice parameter as the Rice parameter corresponding to the sample group Gr2.

The variable-length coder 4206 in these cases, may output side information (seventh side information) for specifying the first difference value and side information (eighth side information) for specifying the second difference value in addition to the code sequence.

[Example 5 of Side Information for Specifying Rice Parameter]

Even when the magnitude of the amplitudes of the samples comprised in the sample group Gr1 is not equal, or when the magnitude of the amplitudes of the samples comprised in the sample group Gr2 is not equal, it is possible to estimate a Rice parameter which can realize a larger code amount reduction effect based on envelope information of the amplitude of the sample sequence $X(1)/W(1)^\beta, \ldots, X(N)/W(N)^\beta$. For example, when the magnitude of the amplitudes of the samples is larger for a higher frequency, by increasing a Rice parameter corresponding to samples at a higher frequency side among the samples comprised in the sample group Gr1 in a fixed manner, and increasing a Rice parameter corresponding to samples at a higher frequency side among the samples comprised in the sample group Gr2 in a fixed manner, it is possible to reduce a code amount. A specific example will be described below.

TABLE 1

| Envelope information | Rice parameter corresponding to sample group Gr1 | Rice parameter corresponding to sample group Gr2 |
| --- | --- | --- |
| Amplitude is equal | s1 | s2 |
| Amplitude is larger in higher frequency | s1 (for $1 \le k < k1$)<br>s1 + const. 1 (for $k1 \le k \le N$) | s2 (for $1 \le k < k1$)<br>s2 + const. 2 (for $k1 \le k \le N$) |
| Amplitude is smaller in higher frequency | s1 + const. 3 (for $1 \le k < k1$)<br>s1 (for $k1 \le k \le N$) | s2 + const. 4 (for $1 \le k < k1$)<br>(for $k1 \le k \le N$) |
| Amplitude is larger in mid frequency than in higher and lower frequency | s1 (for $1 \le k < k3$)<br>s1 + const. 5 (for $k3 \le k < k4$)<br>s1 (for $k4 \le k \le N$) | s2 (for $1 \le k < k3$)<br>s2 + const. 6 (for $k3 \le k < k4$)<br>s2 (for $k4 \le k \le N$) |
| Amplitude is smaller in mid frequency than in higher and lower frequency | s1 + const. 7 (for $1 \le k < k3$)<br>s1 (for $k3 \le k < k4$)<br>s1 + const. 8 (for $k4 \le k \le N$) | s2 + const. 9 (for $1 \le k < k3$)<br>(for $k3 \le k < k4$)<br>s2 + const. 10 (for $k4 \le k \le N$) | where s1 and s2 are Rice parameters respectively corresponding to the sample groups Gr1 and Gr2 illustrated in [Examples 1 to 4 of side information for specifying Rice parameter]. const. 1 to const. 10 are positive integers defined in advance. In this example, the variable-length coder 4206 only has to output side information (ninth side information) which specifies envelope information in addition to the code sequence and the side information illustrated in Examples 2 and 3 of Rice parameter. When the envelope information is known at the decoding side, the variable-length coder 4206 does not have to output the seventh side information.

A relationship of an encoding method to be executed (an encoding method based on periodicity or an encoding method which is not based on periodicity) and an index indicating a degree of periodicity is inverse between the second variable-length coder 432 in FIG. 11 and the variable-length coder 4206 in FIG. 12. That is, the second variable-length coder 432 receives input of the quantized and normalized coefficient sequence $X_Q(1), \ldots, X_Q(N)$ output from the gain adjustment coder 420, and, when the index indicating appropriateness of rearrangement is equal to or less than a threshold (the index indicating the degree of periodicity represents that the periodicity is low), performs encoding based on periodicity on the quantized and normalized coefficient sequence $X_Q(1), \ldots, X_Q(N)$, and, otherwise, performs the same processing as the variable-length coder 1206 in FIG. 3 on the quantized and normalized coefficient sequence $X_Q(1), \ldots, X_Q(N)$. Here, the encoding method based on periodicity in the second variable-length coder 432 is the same as the encoding method based on periodicity in the above-described variable-length coder 4206.

In a similar manner, instead of the "encoding method based on periodicity" in the modified example of the first embodiment, it is also possible to use an encoding method in which the sample sequence is not rearranged. The configuration of an encoder 400' in this case is illustrated in FIG. 13.

Figure 13:
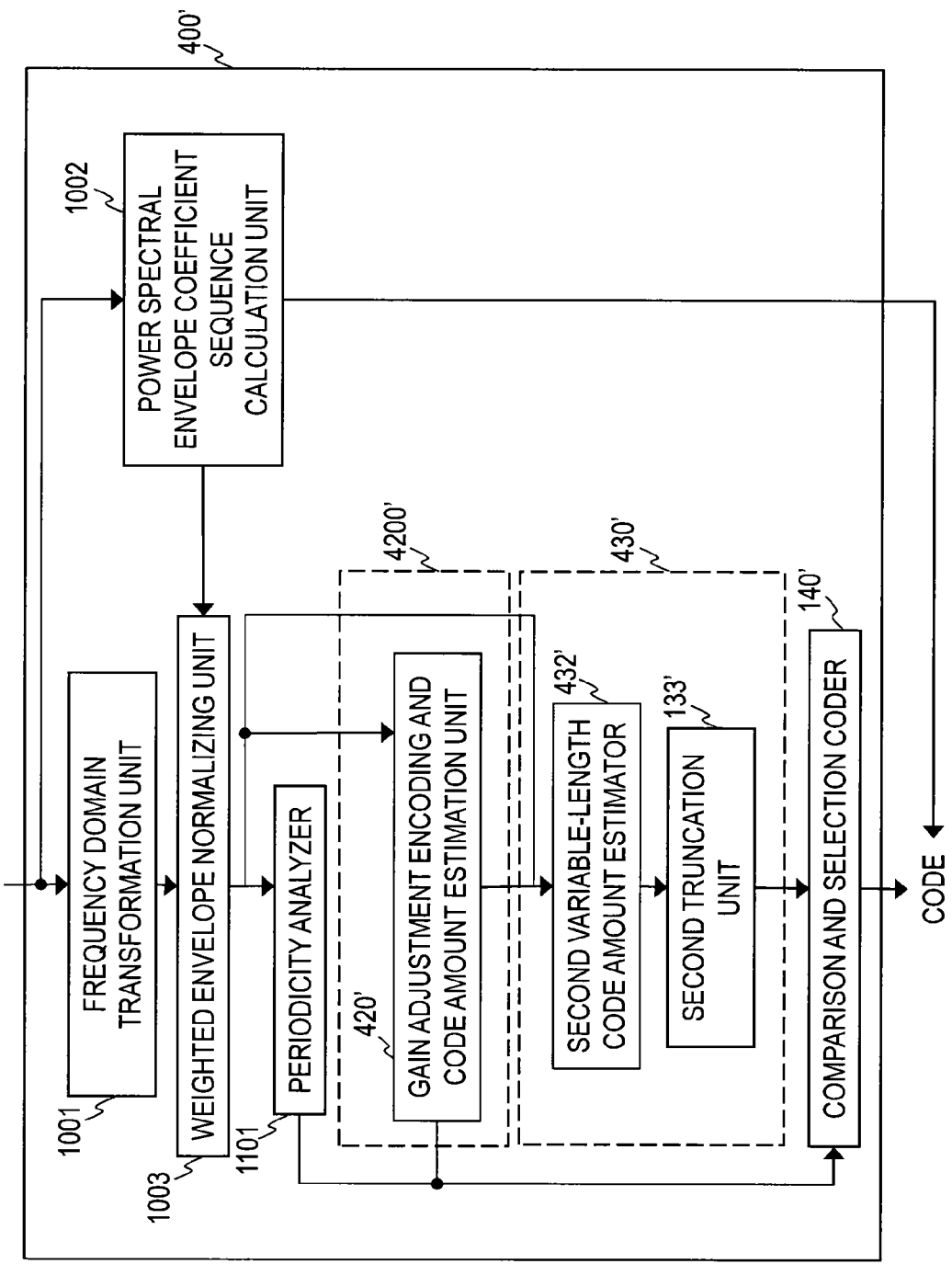
FIG. 13 is a block diagram illustrating a configuration of an encoder of an embodiment.

In the encoder 400' illustrated in FIG. 13, the first coder 1200 in the encoder 100 illustrated in FIG. 10 is replaced by a first code amount estimator 4200' and the second coder 130 is replaced by a second code amount estimator 430'. The first code amount estimator 4200' comprises a gain adjustment encoding and code amount estimation unit 420', and the second code amount estimator 430' comprises a second variable-length code amount estimator 432' and a second truncation unit 133', but does not have a rearrangement processor or an inverse rearrangement unit.

Figure 14:
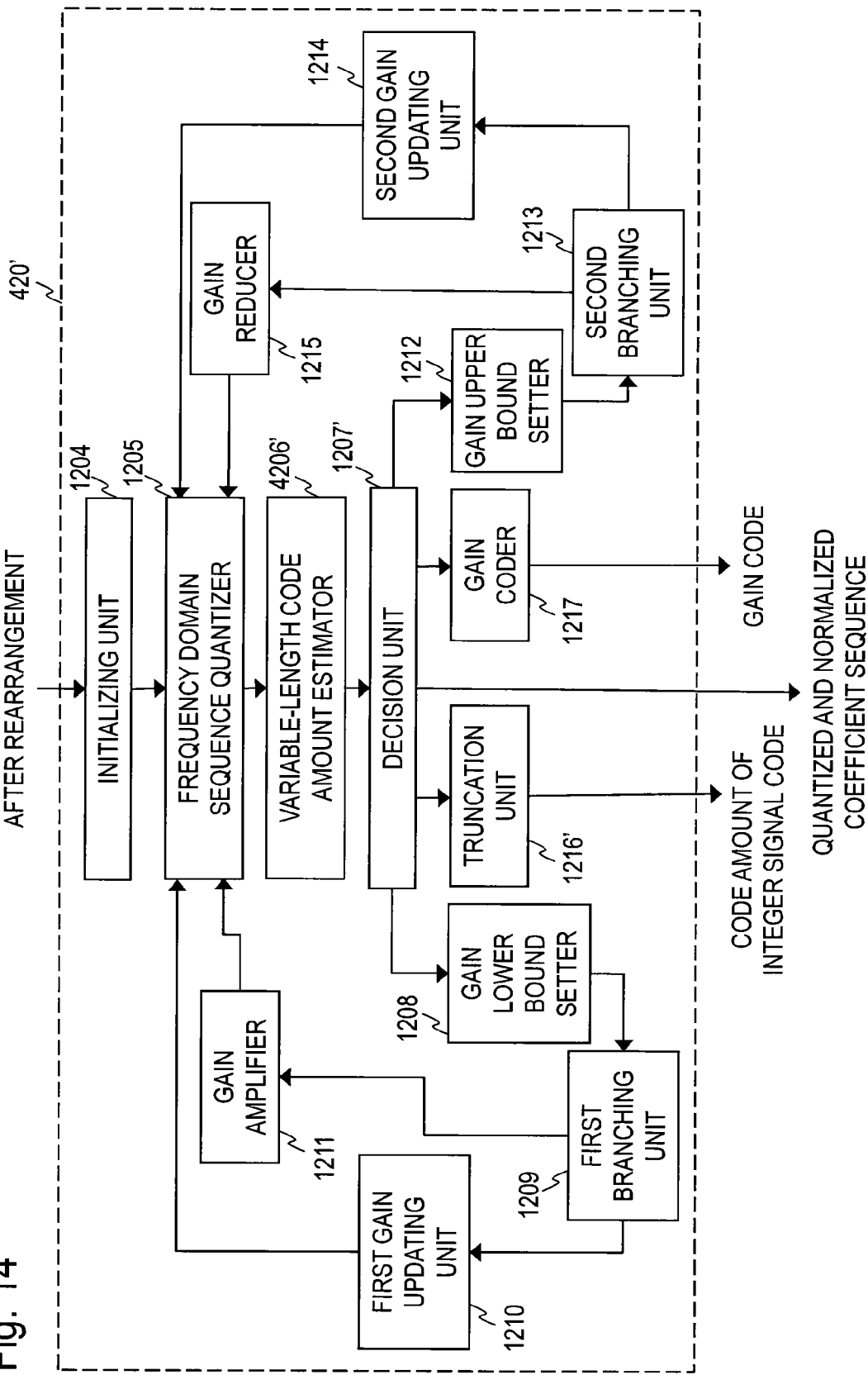
FIG. 14 is a block diagram illustrating a configuration of the gain adjustment coder of an embodiment.

A detailed configuration of the gain adjustment encoding and code amount estimation unit 420' in FIG. 13 is illustrated in FIG. 14. When the index indicating appropriateness of rearrangement is greater than a threshold (when the index indicating a degree of periodicity represents that periodicity is high), the variable-length code amount estimator 4206' in FIG. 14 obtains an estimate value of the code amount when encoding based on periodicity is performed on the input sample sequence in the frequency domain, and, otherwise, obtains an estimate value of the code amount when encoding is performed on the input sample sequence in the frequency domain.

Concerning a value of the code amount when an encoding method based on periodicity at the variable-length coder 4206 in FIG. 14 is assumed as the encoding method based on periodicity, when, for example, Rice coding for each sample is used as variable-length encoding, it is possible to estimate a total code amount from a Rice parameter and the number of samples by calculating a Rice parameter s1 favorable for the sample group Gr1 and a Rice parameter s2 favorable for the sample group Gr2 and assuming that the values of the samples conform to given exponential distribution, without actually performing variable-length encoding. Specifically, it is possible to set $\tilde{C}(s1, X(k), Gr1)$ obtained by replacing D in the Formula (B10) by an estimate value $\tilde{D}1$ assuming that the values of the samples $X(k)$ comprised in the sample group Gr1 conform to exponential distribution and replacing s by s1 as an estimate value of the code amount of the sample group Gr1. For example, the estimate value $\tilde{D}1$ is a value obtained by multiplying an expected value of the values of the samples according to the above-described exponential distribution by the number of samples $X(k)$ comprised in the sample group Gr1. Concerning the estimate value of the code amount of the sample group Gr2, it is possible to set an estimate value $\tilde{C}(s2, X(k), Gr2)$ obtained using a similar method by replacing Gr1 in the Formula (B10) by Gr2 and replacing D by an estimate value $\tilde{D}2$ assuming that the values of the samples $X(k)$ comprised in the sample group Gr2 conform to exponential distribution and replacing s by s2 as the estimate value of the code amount of the sample group Gr2. For example, the estimate value $\tilde{D}2$ is a value obtained by multiplying the expected value of the values of the samples according to the above-described exponential distribution by the number of samples $X(k)$ comprised in the sample group Gr2. The estimate value of the code amount when the encoding based on periodicity is performed on the input sample sequence in the frequency domain is a sum of the estimate values of these code amounts, $\tilde{C}(s1, X(k), Gr1)+\tilde{C}(s2, X(k), Gr2)$.

Further, concerning the estimate value of the code amount when the input sample sequence in the frequency domain is encoded, an estimate value of the code amount when the input sample sequence in the frequency domain is subjected to Rice coding is obtained. For example, it is only necessary to set $\tilde{C}(s, X(k), Gr)$ obtained by using the whole input sample sequence (Gr) in the frequency domain in place of the sample group Gr1 in the Formula (B10), replacing D by the estimate value $\tilde{D}$ assuming that the values of the samples $X(k)$ comprised in the input sample sequence in the frequency domain conform to exponential distribution, and setting s as a favorable Rice parameter for the whole sample sequence Gr as the estimate value of the code amount. For example, the estimate value $\tilde{D}$ is a value obtained by multiplying an expected value of the values of the samples conforming to the above-described exponential distribution by the number of samples $X(k)$ comprised in the whole sample sequence Gr.

A relationship of the implemented encoding method (an encoding method based on periodicity or an encoding method which is not based on periodicity) and an index indicating a degree of periodicity is inverse between the second variable-length code amount estimator 432' and the variable-length code amount estimator 4206' in FIG. 14. That is, the second variable-length code amount estimator 432' receives input of the quantized and normalized coefficient sequence $X_Q(1), \ldots, X_Q(N)$ output from the gain adjustment encoding and code amount estimation unit 420', and, when the index indicating appropriateness of rearrangement is equal to or less than a threshold (when the index indicating the degree of periodicity represents that the periodicity is low), performs code amount estimation of encoding based on periodicity on the quantized and normalized coefficient sequence $X_Q(1), \ldots, X_Q(N)$, and, otherwise, performs the same processing as in the variable-length code amount estimator 1206' in FIG. 5 on the quantized and normalized coefficient sequence $X_Q(1), X_Q(N)$.

The above-described various types of processing are not only executed in time series in the order in which they are described, but also may be executed in parallel or independently as necessary or according to performance of devices which perform the processing. Alternatively, it goes without saying that various modification can be made as appropriate without departing from the scope of the present invention.

When the above-described configuration is implemented by computers, processing of the function of each device is described using a program. This program is executed on the computer to thereby realize the above-described processing function. The program describing the processing can be recorded in a computer readable recording medium. Examples of the computer readable recording medium comprise a non-transitory recording medium. Examples of such a recording medium comprise a magnetic recording device, an optical disk, a magnetooptical disk and a semiconductor memory.

The program is allocated by, for example, selling, transferring, or lending a portable recording medium on which the program is recorded, such as a DVD or a CD-ROM. The program may be stored on a storage device of a server computer and transferred from the server computer to other computers over a network, thereby distributing the program.

A computer that executes the program first, for example, stores the program recorded on a portable recording medium or transferred from a server computer into a storage device of the computer. When the computer executes the processing, the computer reads the program stored on the recording medium of the computer and executes the processing according to the read program. In another mode of execution of the program, the computer may read the program directly from a portable recording medium and execute the processing according to the program or may execute the processing according to the program each time the program is transferred from the server computer to the computer. Alternatively, the above-described processing may be executed using a so-called ASP (Application Service Provider) service in which the program is not transferred from a server computer to the computer but processing functions are implemented by instructions to execute the program and acquisition of the results of the execution.

While in the above-described embodiments, the processing functions of the device are implemented by a predetermined program being executed on the computer, at least part of these processing functions may be implemented by hardware.

DESCRIPTION OF REFERENCE NUMERALS 100, 100', 200, 200', 300, 300', 400, 400' Encoder

What is claimed is:

1. An encoding method comprising:
a frequency domain sample sequence generation step of obtaining a sample sequence in a frequency domain deriving from an acoustic signal for each predetermined time segment;
a periodicity analysis step of calculating an index indicating a degree of periodicity of the sample sequence in the frequency domain;
a first encoding step of
when the index represents that the periodicity is high, obtaining through loop processing, a gain code corresponding to a gain used for dividing each sample of the sample sequence in the frequency domain and an integer signal code obtained by encoding a sequence comprised of integer value samples obtained by dividing each sample of the sample sequence in the frequency domain by the gain using an encoding method based on periodicity, and
otherwise, obtaining through loop processing, a gain code corresponding to a gain used for dividing each sample of the sample sequence in the frequency domain and an integer signal code obtained by encoding a sequence comprised of integer value samples obtained by dividing each sample of the sample sequence in the frequency domain by the gain using an encoding method which is not based on periodicity;
a second encoding step of
when the index represents that the periodicity is high, obtaining a second integer signal code obtained by encoding a sequence comprised of integer value samples obtained by dividing each sample of the sample sequence in the frequency domain by the gain corresponding to the gain code obtained in the first encoding step using an encoding method which is not based on periodicity, and
otherwise, obtaining a second integer signal code obtained by encoding a sequence comprised of integer value samples obtained by dividing each sample of the sample sequence in the frequency domain by the gain corresponding to the gain code obtained in the first encoding step using an encoding method based on periodicity; and
a comparison and selection step of
when a code amount of the integer signal code obtained in the first encoding step is greater than a code amount of the second integer signal code obtained in the second encoding step, outputting the second integer signal code obtained in the second encoding step and the gain code, and
when the code amount of the integer signal code obtained in the first encoding step is smaller than the code amount of the second integer signal code obtained in the second encoding step, outputting the integer signal code obtained in the first encoding step and the gain code.

2. An encoding method comprising:
a frequency domain sample sequence generation step of obtaining a sample sequence in a frequency domain deriving from an acoustic signal for each predetermined time segment;
a periodicity analysis step of calculating an index indicating a degree of periodicity of the sample sequence in the frequency domain;
a first code amount estimation step of
when the index represents that the periodicity is high, obtaining through loop processing, an estimate value of a code amount of an integer signal code obtained by encoding a sequence comprised of integer value samples obtained by dividing each sample of the sample sequence in the frequency domain by a gain using an encoding method based on periodicity, and
otherwise, obtaining through loop processing, an estimate value of a code amount of an integer signal code obtained by encoding a sequence comprised of integer value samples obtained by dividing each sample of the sample sequence in the frequency domain by a gain using an encoding method which is not based on periodicity;
a second code amount estimation step of
when the index represents that the periodicity is high, obtaining an estimate value of a code amount of a second integer signal code obtained by encoding a sequence comprised of integer value samples obtained in the first code amount estimation step using an encoding method which is not based on periodicity, and
otherwise, obtaining an estimate value of a code amount of a second integer signal code obtained by encoding a sequence comprised of integer value samples obtained in the first code amount estimation step using an encoding method based on periodicity; and
a comparison and selection encoding step of
when the index represents that the periodicity is high and the estimate value of the code amount of the integer signal code obtained in the first code amount estimation step is greater than the estimate value of the code amount of the second integer signal code obtained in the second code amount estimation step, outputting a second integer signal code obtained by encoding a sequence comprised of integer value samples obtained in the first code amount estimation step using an encoding method which is not based on periodicity,
when the index represents that the periodicity is high and the estimate value of the code amount of the integer signal code obtained in the first code amount estimation step is smaller than the estimate value of the code amount of the second integer signal code obtained in the second code amount estimation step, outputting an integer signal code obtained by encoding a sequence comprised of integer value samples obtained in the first code amount estimation step using an encoding method based on periodicity,
when the index represents that the periodicity is low and the estimate value of the code amount of the integer signal code obtained in the first code amount estimation step is greater than the estimate value of the code amount of the second integer signal code obtained in the second code amount estimation step, outputting a second integer signal code obtained by encoding a sequence comprised of integer value samples obtained in the first code amount estimation step using an encoding method based on periodicity, and
when the index represents that the periodicity is low and the estimate value of the code amount of the integer signal code obtained in the first code amount estimation step is smaller than the estimate value of the code amount of the second integer signal code obtained in the second code amount estimation step, outputting an integer signal code obtained by encoding a sequence comprised of integer value samples obtained in the first code amount estimation step using an encoding method which is not based on periodicity.

3. An encoding method comprising:
a frequency domain sample sequence generation step of obtaining a sample sequence in a frequency domain deriving from an acoustic signal for each predetermined time segment;
a periodicity analysis step of calculating an index indicating a degree of periodicity of the sample sequence in the frequency domain;
a first encoding step of
when the index represents that the periodicity is high, obtaining through loop processing, a gain code corresponding to a gain used for dividing each sample of the sample sequence in the frequency domain and an integer signal code having a code amount equal to or smaller than an amount of allocated code determined in advance, the integer signal code being obtained by encoding a sequence comprised of integer value samples obtained by dividing each sample of the sample sequence in the frequency domain by the gain using an encoding method based on periodicity, and
otherwise, obtaining through loop processing, a gain code corresponding to a gain used for dividing each sample of the sample sequence in the frequency domain and an integer signal code having a code amount equal to or smaller than the amount of allocated code, the integer signal code being obtained by encoding a sequence comprised of integer value samples obtained by dividing each sample of the sample sequence in the frequency domain by the gain using an encoding method which is not based on periodicity;
a second encoding step of
when the index represents that the periodicity is high, obtaining a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first encoding step using an encoding method which is not based on periodicity, and
otherwise, obtaining a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first encoding step using an encoding method based on periodicity; and
a comparison and selection step of
when the index represents that the periodicity is high and an evaluation indicator $G1=-FA\times(B-CA)+FB\times(B-CB)$ is positive, where B is the amount of allocated code, CA is a code amount of a code comprising the integer signal code obtained in the first encoding step, CB is a code amount of a code comprising the second integer signal code obtained in the second encoding step, FA is a sum of absolute values of amplitudes of integer value samples corresponding to the integer signal code, and FB is a sum of absolute values of amplitudes of integer value samples corresponding to the second integer signal code, outputting the second integer signal code obtained in the second encoding step and the gain code, when the index represents that the periodicity is high and the evaluation indicator G1 is negative, outputting the integer signal code obtained in the first encoding step and the gain code, when the index represents that the periodicity is low and a second evaluation indicator $G1=-FA\times(B-CA)+FB\times(B-CB)$ is negative, where B is the amount of allocated code, CB is a code amount of a code comprising the integer signal code obtained in the first encoding step, CA is a code amount of a code comprising the second integer signal code obtained in the second encoding step, FB is a sum of absolute values of amplitudes of integer value samples corresponding to the integer signal code, and FA is a sum of absolute values of amplitudes of integer value samples corresponding to the second integer signal code, outputting the second integer signal code obtained in the second encoding step and the gain code, and when the index represents that the periodicity is low and the second evaluation indicator G1 is positive, outputting the integer signal code obtained in the first encoding step and the gain code.

4. An encoding method comprising:
a frequency domain sample sequence generation step of obtaining a sample sequence in a frequency domain deriving from an acoustic signal for each predetermined time segment;
a periodicity analysis step of calculating an index indicating a degree of periodicity of the sample sequence in the frequency domain;
a first encoding step of sample of the sample sequence in the frequency domain by the gain corresponding to the gain code obtained in the first encoding step using an encoding method based on periodicity, a code corresponding to a code amount by which a code amount of the code obtained by encoding exceeds the amount of allocated code; and
a comparison and selection step of
when the index represents that the periodicity is high and an evaluation indicator $G2=DA-DB+\gamma(CB-CA)$ is positive, where B is the amount of allocated code, CA is a code amount of a code comprising the integer signal code obtained in the first encoding step, CB is a code amount of a code comprising the second integer signal code obtained in the second encoding step, DA is a sum of absolute values of amplitudes of integer value samples corresponding to a code removed in the first encoding step, the code corresponding to the code amount by which the code amount of the code obtained by encoding exceeds the amount of allocated code, DB is a sum of absolute values of amplitudes of integer value samples corresponding to the code removed in the second encoding step, the code corresponding to the code amount by which the code amount of the code obtained by encoding exceeds the amount of allocated code, and γ is a positive value defined in advance, outputting the second integer signal code obtained in the second encoding step and the gain code, when the index represents that the periodicity is high and the evaluation indicator G2 is negative, outputting the integer signal code obtained in the first encoding step and the gain code, when the index represents that the periodicity is low and a second evaluation indicator $G2=DA-DB+\gamma(CB-CA)$ is negative, where B is the amount of allocated code, CB is a code amount of a code comprising the integer signal code obtained in the first encoding step, CA is a code amount of a code comprising the second integer signal code obtained in the second when the index represents that the periodicity is high, obtaining through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code determined in advance, and otherwise, obtaining through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

a second encoding step of when the index represents that the periodicity is high, obtaining a second integer signal code by removing from a code obtained by encoding a sequence comprised of integer value samples obtained by dividing each sample of the sample sequence in the frequency domain by the gain corresponding to the gain code obtained in the first encoding step using an encoding method which is not based on periodicity, a code corresponding to a code amount by which a code amount of the code obtained by encoding exceeds the amount of allocated code, and otherwise, obtaining a second integer signal code by removing from a code obtained by encoding a sequence comprised of integer value samples obtained by dividing each encoding step, DB is a sum of absolute values of amplitudes of integer value samples corresponding to the code removed in the first encoding step, the code corresponding to the code amount by which the code amount of the code obtained by encoding exceeds the amount of allocated code, DA is a sum of absolute values of amplitudes of integer value samples corresponding to the code removed in the second encoding step, the code corresponding to the code amount by which the code amount of the code obtained by encoding exceeds the amount of allocated code, and γ is a positive value defined in advance, outputting the second integer signal code obtained in the second encoding step and the gain code, and when the index represents that the periodicity is low and the second evaluation indicator G2 is positive, outputting the integer signal code obtained in the first encoding step and the gain code.

5. An encoding method comprising:

a frequency domain sample sequence generation step of obtaining a sample sequence in a frequency domain deriving from an acoustic signal for each predetermined time segment;

a periodicity analysis step of calculating an index indicating a degree of periodicity of the sample sequence in the frequency domain;

a first code amount estimation step of when the index represents that the periodicity is high, obtaining through loop processing, a gain code corresponding to a gain used for dividing each sample of the sample sequence in the frequency domain and an estimate value of a code amount of an integer signal code having a code amount equal to or smaller than an amount of allocated code defined in advance, the integer signal code being obtained by encoding a sequence comprised of integer value samples obtained by dividing each sample of the sample sequence in the frequency domain by the gain using an encoding method based on periodicity, and otherwise, obtaining through loop processing, a gain code corresponding to a gain used for dividing each sample of the sample sequence in the frequency domain and an estimate value of a code amount of an integer signal code having a code amount equal to or smaller than the amount of allocated code, the integer signal code being obtained by encoding a sequence comprised of integer value samples obtained by dividing each sample of the sample sequence in the frequency domain by the gain using an encoding method which is not based on periodicity;

a second code amount estimation step of when the index represents that the periodicity is high, obtaining an estimate value of a code amount of a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first code amount estimation step using an encoding method which is not based on periodicity, and otherwise, obtaining an estimate value of a code amount of a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first code amount estimation step using an encoding method based on periodicity; and a comparison and selection step of when the index represents that the periodicity is high and an evaluation indicator G1=−FA×(B−CA) FB×(B−CB) is positive, where B is the amount of allocated code, CA is a value obtained from the estimate value of the code amount of the integer signal code obtained in the first code amount estimation step, CB is a value obtained from the estimate value of the code amount of the second integer signal code obtained in the second code amount estimation step, FA is a sum of absolute values of amplitudes of integer value samples corresponding to the integer signal code, and FB is a sum of absolute values of amplitudes of integer value samples corresponding to the second integer signal code, outputting a second integer signal code having a code amount equal to or smaller than the amount of allocated code and the gain code obtained in the first code amount estimation step, the second integer signal code being obtained by encoding a sequence comprised of integer value samples obtained by dividing each sample of the sample sequence in the frequency domain by the gain corresponding to the gain code using an encoding method which is not based on periodicity, when the index represents that the periodicity is high and the evaluation indicator G1 is negative, outputting an integer signal code having a code amount equal to or smaller than the amount of allocated code and the gain code obtained in the first code amount estimation step, the integer signal code being obtained by encoding a sequence comprised of integer value samples obtained by dividing each sample of the sample sequence in the frequency domain by the gain corresponding to the gain code using an encoding method based on periodicity, when the index represents that the periodicity is low and an evaluation indicator G1=−FA×(B−CA)+FB×(B−CB) is negative, where B is the amount of allocated code, CB is a value obtained from the estimate value of the code amount of the integer signal code obtained in the first code amount estimation step, CA is a value obtained from the estimate value of the code amount of the second integer signal code obtained in the second code amount estimation step, FB is a sum of absolute values of amplitudes of integer value samples corresponding to the integer signal code, and FA is a sum of absolute values of amplitudes of integer value samples corresponding to the second integer signal code, outputting a second integer signal code having a code amount equal to or smaller than the amount of allocated code and the gain code obtained in the first code amount estimation step, the second integer signal code being obtained by encoding a sequence comprised of integer value samples obtained by dividing each sample of the sample sequence in the frequency domain by the gain corresponding to the gain code using an encoding method based on periodicity, and when the index represents that the periodicity is low, and the second evaluation indicator G1 is positive, outputting an integer signal code having a code amount equal to or smaller than the amount of allocated code and the gain code obtained in the first code amount estimation step, the integer signal code being obtained by encoding a sequence comprised of integer value samples obtained by dividing each sample of the sample sequence in the frequency domain by the gain corresponding to the gain code using an encoding method which is not based on periodicity.

6. An encoding method comprising:

a frequency domain sample sequence generation step of obtaining a sample sequence in a frequency domain deriving from an acoustic signal for each predetermined time segment;

a periodicity analysis step of calculating an index indicating a degree of periodicity of the sample sequence in the frequency domain;

a first code amount estimation step of when the index represents that the periodicity is high, obtaining through loop processing, a gain code corresponding to a gain used for dividing each sample of the sample sequence in the frequency domain and an estimate value of a code amount of an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code defined in advance, and otherwise, obtaining through loop processing, a gain code corresponding to a gain used for dividing each sample of the sample sequence in the frequency domain and an estimate value of a code amount of an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

a second code amount estimation step of when the index represents that the periodicity is high, obtaining an estimate value of a code amount of a second integer signal code obtained by removing from a code obtained by encoding a sequence comprised of integer value samples obtained by dividing each sample of the sample sequence in the frequency domain by the gain corresponding to the gain code obtained in the first code amount estimation step using an encoding method which is not based on periodicity, a code corresponding to a code amount by which a code amount of the code obtained by encoding exceeds the amount of allocated code, and otherwise, obtaining an estimate value of a code amount of a second integer signal code obtained by removing from a code obtained by encoding a sequence comprised of integer value samples obtained by dividing each sample of the sample sequence in the frequency domain by the gain corresponding to the gain code obtained in the first code amount estimation step using an encoding method based on periodicity, a code corresponding to a code amount by which a code amount of the code obtained by encoding exceeds the amount of allocated code; and a comparison and selection step of when the index represents that the periodicity is high, and an evaluation indicator G2=DA−DB+γ(CB−CA) is positive, where B is the amount of allocated code, CA is a value obtained from the estimate value of the code amount of the integer signal code obtained in the first code amount estimation step, CB is a value obtained from the estimate value of the code amount of the second integer signal code obtained in the second code amount estimation step, DA is a sum of absolute values of amplitudes of integer value samples corresponding to the code removed to obtain the integer signal code, the code corresponding to the code amount by which the code amount of the code obtained by encoding exceeds the amount of allocated code, DB is a sum of absolute values of amplitudes of integer value samples corresponding to the code removed to obtain the second integer signal code, the code corresponding to the code amount by which the code amount of the code obtained by encoding exceeds the amount of allocated code, and γ is a positive value defined in advance, outputting a second integer signal code and the gain code obtained in the first code amount estimation step, the second integer signal code being obtained by removing from a code obtained by encoding a sequence comprised of integer value samples obtained by dividing each sample of the sample sequence in the frequency domain by the gain corresponding to the gain code using an encoding method which is not based on periodicity, a code corresponding to the code amount by which a code amount of the code obtained by encoding exceeds the amount of allocated code, when the index represents that the periodicity is high and the evaluation indicator G2 is negative, outputting an integer signal code and the gain code obtained in the first code amount estimation step, the integer signal code being obtained by removing from a code obtained by encoding a sequence comprised of integer value samples obtained by dividing each sample of the sample sequence in the frequency domain by the gain corresponding to the gain code using an encoding method based on periodicity, a code corresponding to the code amount by which the code amount of the code obtained by encoding exceeds the amount of allocated code, when the index represents that the periodicity is low and a second evaluation indicator G2=DA−DB+γ(CB−CA) is negative, where B is the amount of allocated code, CB is a value obtained from the estimate value of the code amount of the integer signal code obtained in the first code amount estimation step, CA is a value obtained from the estimate value of the code amount of the second integer signal code obtained in the second code amount estimation step, DB is a sum of absolute values of amplitudes of integer value samples corresponding to the code removed to obtain the integer signal code, the code corresponding to the code amount by which the code amount of the code obtained by encoding exceeds the amount of allocated code, DA is a sum of absolute values of amplitudes of integer value samples corresponding to the code removed to obtain the second integer signal code, the code corresponding to the code amount by which the code amount of the code obtained by encoding exceeds the amount of allocated code, and γ is a positive value defined in advance, outputting a second integer signal code and the gain code obtained in the first code amount estimation step, the second integer signal code being obtained by removing from a code obtained by encoding a sequence comprised of integer value samples obtained by dividing each sample of the sample sequence in the frequency domain by the gain corresponding to the gain code using an encoding method based on periodicity, a code corresponding to the code amount by which the code amount of the code obtained by encoding exceeds the amount of allocated code, and when the index represents that the periodicity is low and the second evaluation indicator G2 is positive, outputting an integer signal code and the gain code obtained in the first code amount estimation step, the integer signal code being obtained by removing from a code obtained by encoding a sequence comprised of integer value samples obtained by dividing each sample of the sample sequence in the frequency domain by the gain corresponding to the gain code using an encoding method which is not based on periodicity, the code corresponding to the code amount by which the code amount of the code obtained by encoding exceeds the amount of allocated code.

7. The encoding method according to any of claims 1, 3, 4, 5, and 6, further comprising an additional encoding step of outputting an additional code obtained by encoding information corresponding to neither the integer signal code or the second integer signal code output in the comparison and selection step nor the gain code among information comprised in the sample sequence in the frequency domain.

8. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first coder that when the index represents that the periodicity is high, obtains through loop processing, a gain code corresponding to a gain used for dividing each sample of the sample sequence in the frequency domain and an integer signal code obtained by encoding a sequence comprised of integer value samples obtained by dividing each sample of the sample sequence in the frequency domain by the gain using an encoding method based on periodicity, and otherwise, obtains through loop processing, a gain code corresponding to a gain used for dividing each sample of the sample sequence in the frequency domain and an integer signal code obtained by encoding a sequence comprised of integer value samples obtained by dividing each sample of the sample sequence in the frequency domain by the gain using an encoding method which is not based on periodicity;

a second coder that when the index represents that the periodicity is high, obtains a second integer signal code obtained by encoding a sequence comprised of integer value samples obtained by dividing each sample of the sample sequence in the frequency domain by the gain corresponding to the gain code obtained in the first coder using an encoding method which is not based on periodicity, and otherwise, obtains a second integer signal code obtained by encoding a sequence comprised of integer value samples obtained by dividing each sample of the sample sequence in the frequency domain by the gain corresponding to the gain code obtained in the first coder using an encoding method based on periodicity; and a comparison selector that when a code amount of the integer signal code obtained in the first coder is larger than a code amount of the second integer signal code obtained in the second coder, outputs the second integer signal code obtained in the second coder and the gain code, and when the code amount of the integer signal code obtained in the first coder is smaller than the code amount of the second integer signal code obtained in the second coder, outputs the integer signal code obtained in the first coder and the gain code.

9. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first code amount estimator that when the index represents that the periodicity is high, obtains through loop processing, an estimate value of a code amount of an integer signal code obtained by encoding a sequence comprised of integer value samples obtained by dividing each sample of the sample sequence in the frequency domain by a gain using an encoding method based on periodicity, and otherwise, obtains through loop processing, an estimate value of a code amount of an integer signal code obtained by encoding a sequence comprised of integer value samples obtained by dividing each sample of the sample sequence in the frequency domain by a gain using an encoding method which is not based on periodicity;

a second code amount estimator that when the index represents that the periodicity is high, obtains an estimate value of a code amount of a second integer signal code obtained by encoding a sequence comprised of integer value samples obtained in the first code amount estimator using an encoding method which is not based on periodicity, and otherwise, obtains an estimate value of a code amount of a second integer signal code obtained by encoding a sequence comprised of integer value samples obtained in the first code amount estimator using an encoding method based on periodicity; and a comparison and selection coder that when the index represents that the periodicity is high and the estimate value of the code amount of the integer signal code obtained in the first code amount estimator is greater than the estimate value of the code amount of the second integer signal code obtained in the second code amount estimator, outputs a second integer signal code obtained by encoding a sequence comprised of integer value samples obtained in the first code amount estimator using an encoding method which is not based on periodicity, when the index represents that the periodicity is high and the estimate value of the code amount of the integer signal code obtained in the first code amount estimator is smaller than the estimate value of the code amount of the second integer signal code obtained in the second code amount estimator, outputs an integer signal code obtained by encoding a sequence comprised of integer value samples obtained in the first code amount estimator using an encoding method based on periodicity, when the index represents that the periodicity is low and the estimate value of the code amount of the integer signal code obtained in the first code amount estimator is greater than the estimate value of the code amount of the second integer signal code obtained in the second code amount estimator, outputs a second integer signal code obtained by encoding a sequence comprised of integer value samples obtained in the first code amount estimator using an encoding method based on periodicity, and when the index represents that the periodicity is low and the estimate value of the code amount of the integer signal code obtained in the first code amount estimator is smaller than the estimate value of the code amount of the second integer signal code obtained in the second code amount estimator, outputs an integer signal code obtained by encoding a sequence comprised of integer value samples obtained in the first code amount estimator using an encoding method which is not based on periodicity.

10. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first coder that when the index represents that the periodicity is high, obtains through loop processing, a gain code corresponding to a gain used for dividing each sample of the sample sequence in the frequency domain and an integer signal code having a code amount equal to or smaller than an amount of allocated code defined in advance, the integer signal code being obtained by encoding a sequence comprised of integer value samples obtained by dividing each sample of the sample sequence in the frequency domain by the gain using an encoding method based on periodicity, and otherwise, obtains through loop processing, a gain code corresponding to a gain used for dividing each sample of the sample sequence in the frequency domain and an integer signal code having a code amount equal to or smaller than the amount of allocated code, the integer signal code being obtained by encoding a sequence comprised of integer value samples obtained by dividing each sample of the sample sequence in the frequency domain by the gain using an encoding method which is not based on periodicity;

a second coder that when the index represents that the periodicity is high, obtains a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first coder using an encoding method which is not based on periodicity, and otherwise, obtains a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first coder using an encoding method based on periodicity; and a comparison selector that when the index represents that the periodicity is high and an evaluation indicator $G1=-FA \times (B-CA)+FB \times (B-CB)$ is positive, where B is the amount of allocated code, CA is a code amount of a code comprising the integer signal code obtained in the first coder, CB is a code amount of a code comprising the second integer signal code obtained in the second coder, FA is a sum of absolute values of amplitudes of integer value samples corresponding to the integer signal code, and FB is a sum of absolute values of amplitudes of integer value samples corresponding to the second integer signal code, outputs the second integer signal code obtained in the second coder and the gain code, when the index represents that the periodicity is high and the evaluation indicator G1 is negative, outputs the integer signal code obtained in the first coder and the gain code, when the index represents that the periodicity is low and a second evaluation indicator G1=−FA×(B−CA)+FB×(B−CB) is negative, where B is the amount of allocated code, CB is a code amount of a code comprising the integer signal code obtained in the first coder, CA is a code amount of a code comprising the second integer signal code obtained in the second coder, FB is a sum of absolute values of amplitudes of integer value samples corresponding to the integer signal code, and FA is a sum of absolute values of amplitudes of integer value samples corresponding to the second integer signal code, outputs the second integer signal code obtained in the second coder and the gain code, and when the index represents that the periodicity is low and the second evaluation indicator G1 is positive, outputs the integer signal code obtained in the first coder and the gain code.

11. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first coder that when the index represents that the periodicity is high, obtains through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code defined in advance, and otherwise, obtains through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

a second coder that when the index represents that the periodicity is high, obtains a second integer signal code by removing from a code obtained by encoding a sequence comprised of integer value samples obtained by dividing each sample of the sample sequence in the frequency domain by the gain corresponding to the gain code obtained in the first coder using an encoding method which is not based on periodicity, a code corresponding to a code amount by which a code amount of the code obtained by encoding exceeds the amount of allocated code, and otherwise, obtains a second integer signal code by removing from a code obtained by encoding a sequence comprised of integer value samples obtained by dividing each sample of the sample sequence in the frequency domain by the gain corresponding to the gain code obtained in the first coder using an encoding method based on periodicity, a code corresponding to a code amount by which a code amount of the code obtained by encoding exceeds the amount of allocated code; and a comparison selector that when the index represents that the periodicity is high and an evaluation indicator $G2=DA-DB+\gamma(CB-CA)$ is positive, where B is the amount of allocated code, CA is a code amount of a code comprising the integer signal code obtained in the first coder, CB is a code amount of a code comprising the second integer signal code obtained in the second coder, DA is a sum of absolute values of amplitudes of integer value samples corresponding to the code removed in the first coder, the code corresponding to a code amount by which the code amount of the code obtained by encoding exceeds the amount of allocated code, DB is a sum of absolute values of amplitudes of integer value samples corresponding to the code removed in the second coder, the code corresponding to a code amount by which the code amount of the code obtained by encoding exceeds the amount of allocated code, and γ is a positive value defined in advance, outputs the second integer signal code obtained in the second coder and the gain code, when the index represents that the periodicity is high and the evaluation indicator G2 is negative, outputs the integer signal code obtained in the first coder and the gain code, when the index represents that the periodicity is low and a second evaluation indicator $G2=DA-DB+\gamma(CB-CA)$ is negative, where B is the amount of allocated code, CB is a code amount of a code comprising the integer signal code obtained in the first coder, CA is a code amount of a code comprising the second integer signal code obtained in the second coder, DB is a sum of absolute values of amplitudes of integer value samples corresponding to the code removed in the first coder, the code corresponding to a code amount by which the code amount of the code obtained by encoding exceeds the amount of allocated code, DA is a sum of absolute values of amplitudes of integer value samples corresponding to the code removed in the second coder, the code corresponding to a code amount by which the code amount of the code obtained by encoding exceeds the amount of allocated code, and γ is a positive value defined in advance, outputs the second integer signal code obtained in the second coder and the gain code, and when the index represents that the periodicity is low and the second evaluation indicator G2 is positive, outputs the integer signal code obtained in the first coder and the gain code.

12. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first code amount estimator that when the index represents that the periodicity is high, obtains through loop processing, a gain code corresponding to a gain used for dividing each sample of the sample sequence in the frequency domain and an estimate value of a code amount of an integer signal code having a code amount equal to or smaller than an amount of allocated code defined in advance, the integer signal code being obtained by encoding a sequence comprised of integer value samples obtained by dividing each sample of the sample sequence in the frequency domain by the gain using an encoding method based on periodicity, and otherwise, obtains through loop processing, a gain code corresponding to a gain used for dividing each sample of the sample sequence in the frequency domain and an estimate value of a code amount of an integer signal code having a code amount equal to or smaller than the amount of allocated code, the integer signal code being obtained by encoding a sequence comprised of integer value samples obtained by dividing each sample of the sample sequence in the frequency domain by the gain using an encoding method which is not based on periodicity;

a second code amount estimator that when the index represents that the periodicity is high, obtains an estimate value of a code amount of a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first code amount estimator using an encoding method which is not based on periodicity, and otherwise, obtains an estimate value of a code amount of a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first code amount estimator using an encoding method based on periodicity; and a comparison selector that when the index represents that the periodicity is high and an evaluation indicator $G1=-FA \times (B-CA)+FB \times (B-CB)$ is positive, where B is the amount of allocated code, CA is a value obtained from the estimate value of the code amount of the integer signal code obtained in the first code amount estimator, CB is a value obtained from the estimate value of the code amount of the second integer signal code obtained in the second code amount estimator, FA is a sum of absolute values of amplitudes of integer value samples corresponding to the integer signal code, and FB is a sum of absolute values of amplitudes of integer value samples corresponding to the second integer signal code, outputs a second integer signal code having a code amount equal to or smaller than the amount of allocated code and the gain code obtained in the first code amount estimator, the second integer signal code being obtained by encoding a sequence comprised of integer value samples obtained by dividing each sample of the sample sequence in the frequency domain by the gain corresponding to the gain code using an encoding method which is not based on periodicity, when the index represents that the periodicity is high and the evaluation indicator G1 is negative, outputs an integer signal code having a code amount equal to or smaller than the amount of allocated code and the gain code obtained in the first code amount estimator, the integer signal code being obtained by encoding a sequence comprised of integer value samples obtained by dividing each sample of the sample sequence in the frequency domain by the gain corresponding to the gain code using an encoding method based on periodicity, when the index represents that the periodicity is low and an evaluation indicator $G1=-FA \times (B-CA)+FB \times (B-CB)$ is negative, where B is the amount of allocated code, CB is a value obtained from the estimate value of the code amount of the integer signal code obtained in the first code amount estimator, CA is a value obtained from the estimate value of the code amount of the second integer signal code obtained in the second code amount estimator, FB is a sum of absolute values of amplitudes of integer value samples corresponding to the integer signal code, and FA is a sum of absolute values of amplitudes of integer value samples corresponding to the second integer signal code, outputs a second integer signal code having a code amount equal to or smaller than the amount of allocated code and the gain code obtained in the first code amount estimator, the second integer signal code being obtained by encoding a sequence comprised of integer value samples obtained by dividing each sample of the sample sequence in the frequency domain by the gain corresponding to the gain code using an encoding method based on periodicity, and when the index represents that the periodicity is low and the second evaluation indicator G1 is positive, outputs an integer signal code having a code amount equal to or smaller than the amount of allocated code and the gain code obtained in the first code amount estimator, the integer signal code being obtained by encoding a sequence comprised of integer value samples obtained by dividing each sample of the sample sequence in the frequency domain by the gain corresponding to the gain code using an encoding method which is not based on periodicity.

13. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first code amount estimator that when the index represents that the periodicity is high, obtains through loop processing, a gain code corresponding to a gain used for dividing each sample of the sample sequence in the frequency domain and an estimate value of a code amount of an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code defined in advance, and otherwise, obtains through loop processing, a gain code corresponding to a gain used for dividing each sample of the sample sequence in the frequency domain and an estimate value of a code amount of an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

a second code amount estimator that when the index represents that the periodicity is high, obtains an estimate value of a code amount of a second integer signal code obtained by removing from a code obtained by encoding a sequence comprised of integer value samples obtained by dividing each sample of the sample sequence in the frequency domain by the gain corresponding to the gain code obtained in the first code amount estimator using an encoding method which is not based on periodicity, a code corresponding to a code amount by which a code amount of the code obtained by encoding exceeds the amount of allocated code, and otherwise, obtains an estimate value of a code amount of a second integer signal code obtained by removing from a code obtained by encoding a sequence comprised of integer value samples obtained by dividing each sample of the sample sequence in the frequency domain by the gain corresponding to the gain code obtained in the first code amount estimator using an encoding method based on periodicity, a code corresponding to a code amount by which a code amount of the code obtained by encoding exceeds the amount of allocated code; and a comparison selector that when the index represents that the periodicity is high and an evaluation indicator $G2=DA-DB+\gamma(CB-CA)$ is positive, where B is the amount of allocated code, CA is a value obtained from the estimate value of the code amount of the integer signal code obtained in the first code amount estimator, CB is a value obtained from the estimate value of the code amount of the second integer signal code obtained in the second code amount estimator, DA is a sum of absolute values of amplitudes of integer value samples corresponding to the code removed to obtain the integer signal code, the code corresponding to a code amount by which the code amount of the code obtained by encoding exceeds the amount of allocated code, DB is a sum of absolute values of amplitudes of integer value samples corresponding to the code removed to obtain the second integer signal code, the code corresponding to a code amount by which the code amount of the code obtained by encoding exceeds the amount of allocated code, and $\gamma$ is a positive value defined in advance, outputs the second integer signal code and the gain code obtained in the first code amount estimator, the second integer signal code being obtained by removing from a code obtained by encoding a sequence comprised of integer value samples obtained by dividing each sample of the sample sequence in the frequency domain by the gain corresponding to the gain code using an encoding method which is not based on periodicity, a code corresponding to a code amount by which the code amount of the code obtained by encoding exceeds the amount of allocated code, when the index represents that the periodicity is high and the evaluation indicator G2 is negative, outputs an integer signal code and the gain code obtained in the first code amount estimator, the integer signal code being obtained by removing from a code obtained by encoding a sequence comprised of integer value samples obtained by dividing each sample of the sample sequence in the frequency domain by the gain corresponding to the gain code using an encoding method based on periodicity, a code corresponding to a code amount by which the code amount of the code obtained by encoding exceeds the amount of allocated code, when the index represents that the periodicity is low and a second evaluation indicator $G2=DA-DB+\gamma(CB-CA)$ is negative, where B is the amount of allocated code, CB is a value obtained from the estimate value of the code amount of the integer signal code obtained in the first code amount estimator, CA is a value obtained from the estimate value of the code amount of the second integer signal code obtained in the second code amount estimator, DB is a sum of absolute values of amplitudes of integer value samples corresponding to the code removed to obtain the integer signal code, the code corresponding to a code amount by which the code amount of the code obtained by encoding exceeds the amount of allocated code, DA is a sum of absolute values of amplitudes of integer value samples corresponding to the code removed to obtain the second integer signal code, the code corresponding to a code amount by which the code amount of the code obtained by encoding exceeds the amount of allocated code, and $\gamma$ is a positive value defined in advance, outputs a second integer signal code and the gain code obtained in the first code amount estimator, the second integer signal code being obtained by removing from a code obtained by encoding a sequence comprised of integer value samples obtained by dividing each sample of the sample sequence in the frequency domain by the gain corresponding to the gain code using an encoding method based on periodicity, a code corresponding to a code amount by which the code amount of the code obtained by encoding exceeds the amount of allocated code, and when the index represents that the periodicity is low, and the second evaluation indicator G2 is positive, outputs an integer signal code and the gain code obtained in the first code amount estimator, the integer signal code being obtained by removing from a code obtained by encoding a sequence comprised of integer value samples obtained by dividing each sample of the sample sequence in the frequency domain by the gain corresponding to the gain code using an encoding method which is not based on periodicity, a code corresponding to a code amount by which the code amount of the code obtained by encoding exceeds the amount of allocated code.

14. The encoder according to any of claims 8, 10, 11, 12, and 13, further comprising an additional coder that outputs an additional code obtained by encoding information corresponding to neither the integer signal code or the second integer signal code output from the comparison selector nor the gain code among information comprised in the sample sequence in the frequency domain.

15. A non-transitory computer readable recording medium storing a program for causing a computer to execute each step of the encoding method according to any of claims 1, 3, 4, 5, and 6.

16. An encoder comprising:

processing circuitry configured to obtain a sample sequence in a frequency domain deriving from an acoustic signal for each predetermined time segment;

calculate an index indicating a degree of periodicity of the sample sequence in the frequency domain;

implement a first coder that
when the index represents that the periodicity is high, obtains through loop processing, a gain code corresponding to a gain used for dividing each sample of the sample sequence in the frequency domain and an integer signal code obtained by encoding a sequence comprised of integer value samples obtained by dividing each sample of the sample sequence in the frequency domain by the gain using an encoding method based on periodicity, and otherwise, obtains through loop processing, a gain code corresponding to a gain used for dividing each sample of the sample sequence in the frequency domain and an integer signal code obtained by encoding a sequence comprised of integer value samples obtained by dividing each sample of the sample sequence in the frequency domain by the gain using an encoding method which is not based on periodicity;

implement a second coder that
when the index represents that the periodicity is high, obtains a second integer signal code obtained by encoding a sequence comprised of integer value samples obtained by dividing each sample of the sample sequence in the frequency domain by the gain corresponding to the gain code obtained in the first coder using an encoding method which is not based on periodicity, and otherwise, obtains a second integer signal code obtained by encoding a sequence comprised of integer value samples obtained by dividing each sample of the sample sequence in the frequency domain by the gain corresponding to the gain code obtained in the first coder using an encoding method based on periodicity; and implement a comparison selector that
when a code amount of the integer signal code obtained in the first coder is larger than a code amount of the second integer signal code obtained in the second coder, outputs the second integer signal code obtained in the second coder and the gain code, and when the code amount of the integer signal code obtained in the first coder is smaller than the code amount of the second integer signal code obtained in the second coder, outputs the integer signal code obtained in the first coder and the gain code.

17. An encoder comprising:
processing circuitry configured to
obtain a sample sequence in a frequency domain deriving from an acoustic signal for each predetermined time segment;

calculate an index indicating a degree of periodicity of the sample sequence in the frequency domain;

implement a first code amount estimator that
when the index represents that the periodicity is high, obtains through loop processing, an estimate value of a code amount of an integer signal code obtained by encoding a sequence comprised of integer value samples obtained by dividing each sample of the sample sequence in the frequency domain by a gain using an encoding method based on periodicity, and otherwise, obtains through loop processing, an estimate value of a code amount of an integer signal code obtained by encoding a sequence comprised of integer value samples obtained by dividing each sample of the sample sequence in the frequency domain by a gain using an encoding method which is not based on periodicity;

implement a second code amount estimator that
when the index represents that the periodicity is high, obtains an estimate value of a code amount of a second integer signal code obtained by encoding a sequence comprised of integer value samples obtained in the first code amount estimator using an encoding method which is not based on periodicity, and otherwise, obtains an estimate value of a code amount of a second integer signal code obtained by encoding a sequence comprised of integer value samples obtained in the first code amount estimator using an encoding method based on periodicity; and implement a comparison and selection coder that
when the index represents that the periodicity is high and the estimate value of the code amount of the integer signal code obtained in the first code amount estimator is greater than the estimate value of the code amount of the second integer signal code obtained in the second code amount estimator, outputs a second integer signal code obtained by encoding a sequence comprised of integer value samples obtained in the first code amount estimator using an encoding method which is not based on periodicity, when the index represents that the periodicity is high and the estimate value of the code amount of the integer signal code obtained in the first code amount estimator is smaller than the estimate value of the code amount of the second integer signal code obtained in the second code amount estimator, outputs an integer signal code obtained by encoding a sequence comprised of integer value samples obtained in the first code amount estimator using an encoding method based on periodicity, when the index represents that the periodicity is low and the estimate value of the code amount of the integer signal code obtained in the first code amount estimator is greater than the estimate value of the code amount of the second integer signal code obtained in the second code amount estimator, outputs a second integer signal code obtained by encoding a sequence comprised of integer value samples obtained in the first code amount estimator using an encoding method based on periodicity, and when the index represents that the periodicity is low and the estimate value of the code amount of the integer signal code obtained in the first code amount estimator is smaller than the estimate value of the code amount of the second integer signal code obtained in the second code amount estimator, outputs an integer signal code obtained by encoding a sequence comprised of integer value samples obtained in the first code amount estimator using an encoding method which is not based on periodicity.

18. An encoder comprising:
processing circuitry configured to
obtain a sample sequence in a frequency domain deriving from an acoustic signal for each predetermined time segment;

calculate an index indicating a degree of periodicity of the sample sequence in the frequency domain;

implement a first coder that
when the index represents that the periodicity is high, obtains through loop processing, a gain code corresponding to a gain used for dividing each sample of the sample sequence in the frequency domain and an integer signal code having a code amount equal to or smaller than an amount of allocated code defined in advance, the integer signal code being obtained by encoding a sequence comprised of integer value samples obtained by dividing each sample of the sample sequence in the frequency domain by the gain using an encoding method based on periodicity, and otherwise, obtains through loop processing, a gain code corresponding to a gain used for dividing each sample of the sample sequence in the frequency domain and an integer signal code having a code amount equal to or smaller than the amount of allocated code, the integer signal code being obtained by encoding a sequence comprised of integer value samples obtained by dividing each sample of the sample sequence in the frequency domain by the gain using an encoding method which is not based on periodicity;

implement a second coder that when the index represents that the periodicity is high, obtains a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first coder using an encoding method which is not based on periodicity, and otherwise, obtains a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first coder using an encoding method based on periodicity; and implement a comparison selector that when the index represents that the periodicity is high and an evaluation indicator $G1=-FA\times(B-CA)+FB\times(B-CB)$ is positive, where B is the amount of allocated code, CA is a code amount of a code comprising the integer signal code obtained in the first coder, CB is a code amount of a code comprising the second integer signal code obtained in the second coder, FA is a sum of absolute values of amplitudes of integer value samples corresponding to the integer signal code, and FB is a sum of absolute values of amplitudes of integer value samples corresponding to the second integer signal code, outputs the second integer signal code obtained in the second coder and the gain code, when the index represents that the periodicity is high and the evaluation indicator $G1$ is negative, outputs the integer signal code obtained in the first coder and the gain code, when the index represents that the periodicity is low and a second evaluation indicator $G1=-FA\times(B-CA)+FB\times(B-CB)$ is negative, where B is the amount of allocated code, CA is a code amount of a code comprising the integer signal code obtained in the first coder, CA is a code amount of a code comprising the second integer signal code obtained in the second coder, FB is a sum of absolute values of amplitudes of integer value samples corresponding to the integer signal code, and FA is a sum of absolute values of amplitudes of integer value samples corresponding to the second integer signal code, outputs the second integer signal code obtained in the second coder and the gain code, and when the index represents that the periodicity is low and the second evaluation indicator $G1$ is positive, outputs the integer signal code obtained in the first coder and the gain code.

19. An encoder comprising:

processing circuitry configured to obtain a sample sequence in a frequency domain deriving from an acoustic signal for each predetermined time segment;

calculate an index indicating a degree of periodicity of the sample sequence in the frequency domain;

implement a first coder that when the index represents that the periodicity is high, obtains through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code defined in advance, and otherwise, obtains through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

implement a second coder that when the index represents that the periodicity is high, obtains a second integer signal code by removing from a code obtained by encoding a sequence comprised of integer value samples obtained by dividing each sample of the sample sequence in the frequency domain by the gain corresponding to the gain code obtained in the first coder using an encoding method which is not based on periodicity, a code corresponding to a code amount by which a code amount of the code obtained by encoding exceeds the amount of allocated code, and otherwise, obtains a second integer signal code by removing from a code obtained by encoding a sequence comprised of integer value samples obtained by dividing each sample of the sample sequence in the frequency domain by the gain corresponding to the gain code obtained in the first coder using an encoding method based on periodicity, a code corresponding to a code amount by which a code amount of the code obtained by encoding exceeds the amount of allocated code; and implement a comparison selector that
when the index represents that the periodicity is high and an evaluation indicator G2=DA−DB+γ(CB−CA) is positive, where B is the amount of allocated code, CA is a code amount of a code comprising the integer signal code obtained in the first coder, CB is a code amount of a code comprising the second integer signal code obtained in the second coder, DA is a sum of absolute values of amplitudes of integer value samples corresponding to the code removed in the first coder, the code corresponding to a code amount by which the code amount of the code obtained by encoding exceeds the amount of allocated code, DB is a sum of absolute values of amplitudes of integer value samples corresponding to the code removed in the second coder, the code corresponding to a code amount by which the code amount of the code obtained by encoding exceeds the amount of allocated code, and γ is a positive value defined in advance, outputs the second integer signal code obtained in the second coder and the gain code,
when the index represents that the periodicity is high and the evaluation indicator G2 is negative, outputs the integer signal code obtained in the first coder and the gain code,
when the index represents that the periodicity is low and a second evaluation indicator G2=DA−DB+γ(CB−CA) is negative, where B is the amount of allocated code, CB is a code amount of a code comprising the integer signal code obtained in the first coder, CA is a code amount of a code comprising the second integer signal code obtained in the second coder, DB is a sum of absolute values of amplitudes of integer value samples corresponding to the code removed in the first coder, the code corresponding to a code amount by which the code amount of the code obtained by encoding exceeds the amount of allocated code, DA is a sum of absolute values of amplitudes of integer value samples corresponding to the code removed in the second coder, the code corresponding to a code amount by which the code amount of the code obtained by encoding exceeds the amount of allocated code, and γ is a positive value defined in advance, outputs the second integer signal code obtained in the second coder and the gain code, and
when the index represents that the periodicity is low and the second evaluation indicator G2 is positive, outputs the integer signal code obtained in the first coder and the gain code.

20. An encoder comprising:
processing circuitry configured to
obtain a sample sequence in a frequency domain deriving from an acoustic signal for each predetermined time segment;
calculate an index indicating a degree of periodicity of the sample sequence in the frequency domain;
implement a first code amount estimator that
when the index represents that the periodicity is high, obtains through loop processing, a gain code corresponding to a gain used for dividing each sample of the sample sequence in the frequency domain and an estimate value of a code amount of an integer signal code having a code amount equal to or smaller than an amount of allocated code defined in advance, the integer signal code being obtained by encoding a sequence comprised of integer value samples obtained by dividing each sample of the sample sequence in the frequency domain by the gain using an encoding method based on periodicity, and
otherwise, obtains through loop processing, a gain code corresponding to a gain used for dividing each sample of the sample sequence in the frequency domain and an estimate value of a code amount of an integer signal code having a code amount equal to or smaller than the amount of allocated code, the integer signal code being obtained by encoding a sequence comprised of integer value samples obtained by dividing each sample of the sample sequence in the frequency domain by the gain using an encoding method which is not based on periodicity;
implement a second code amount estimator that
when the index represents that the periodicity is high, obtains an estimate value of a code amount of a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first code amount estimator using an encoding method which is not based on periodicity, and
otherwise, obtains an estimate value of a code amount of a second integer signal code having a code amount equal to or smaller than the amount of allocated code, the second integer signal code being obtained by encoding a sequence comprised of integer value samples obtained by dividing each sample of the sample sequence in the frequency domain by the gain corresponding to the gain code obtained in the first code amount estimator using an encoding method based on periodicity; and
implement a comparison selector that
when the index represents that the periodicity is high and an evaluation indicator G1=−FA×(B−CA)+FB×(B−CB) is positive, where B is the amount of allocated code, CA is a value obtained from the estimate value of the code amount of the integer signal code obtained in the first code amount estimator, CB is a value obtained from the estimate value of the code amount of the second integer signal code obtained in the second code amount estimator, FA is a sum of absolute values of amplitudes of integer value samples corresponding to the integer signal code, and FB is a sum of absolute values of amplitudes of integer value samples corresponding to the second integer signal code, outputs a second integer signal code having a code amount equal to or smaller than the amount of allocated code and the gain code obtained in the first code amount estimator, the second integer signal code being obtained by encoding a sequence comprised of integer value samples obtained by dividing each sample of the sample sequence in the frequency domain by the gain corresponding to the gain code using an encoding method which is not based on periodicity,
when the index represents that the periodicity is high and the evaluation indicator G1 is negative, outputs an integer signal code having a code amount equal to or smaller than the amount of allocated code and the gain code obtained in the first code amount estimator, the integer signal code being obtained by encoding a sequence comprised of integer value samples obtained by dividing each sample of the sample sequence in the frequency domain by the gain corresponding to the gain code using an encoding method based on periodicity, when the index represents that the periodicity is low and an evaluation indicator G1=−FA×(B−CA)+FB×(B−CB) is negative, where B is the amount of allocated code, CB is a value obtained from the estimate value of the code amount of the integer signal code obtained in the first code amount estimator, CA is a value obtained from the estimate value of the code amount of the second integer signal code obtained in the second code amount estimator, FB is a sum of absolute values of amplitudes of integer value samples corresponding to the integer signal code, and FA is a sum of absolute values of amplitudes of integer value samples corresponding to the second integer signal code, outputs a second integer signal code having a code amount equal to or smaller than the amount of allocated code and the gain code obtained in the first code amount estimator, the second integer signal code being obtained by encoding a sequence comprised of integer value samples obtained by dividing each sample of the sample sequence in the frequency domain by the gain corresponding to the gain code using an encoding method based on periodicity, and when the index represents that the periodicity is low and the second evaluation indicator G1 is positive, outputs an integer signal code having a code amount equal to or smaller than the amount of allocated code and the gain code obtained in the first code amount estimator, the integer signal code being obtained by encoding a sequence comprised of integer value samples obtained by dividing each sample of the sample sequence in the frequency domain by the gain corresponding to the gain code using an encoding method which is not based on periodicity.

21. An encoder comprising:
processing circuitry configured to
obtain a sample sequence in a frequency domain deriving from an acoustic signal for each predetermined time segment;
calculate an index indicating a degree of periodicity of the sample sequence in the frequency domain;
implement a first code amount estimator that
when the index represents that the periodicity is high, obtains through loop processing, a gain code corresponding to a gain used for dividing each sample of the sample sequence in the frequency domain and an estimate value of a code amount of an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code defined in advance, and otherwise, obtains through loop processing, a gain code corresponding to a gain used for dividing each sample of the sample sequence in the frequency domain and an estimate value of a code amount of an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

implement a second code amount estimator that
when the index represents that the periodicity is high, obtains an estimate value of a code amount of a second integer signal code obtained by removing from a code obtained by encoding a sequence comprised of integer value samples obtained by dividing each sample of the sample sequence in the frequency domain by the gain corresponding to the gain code obtained in the first code amount estimator using an encoding method which is not based on periodicity, a code corresponding to a code amount by which a code amount of the code obtained by encoding exceeds the amount of allocated code, and otherwise, obtains an estimate value of a code amount of a second integer signal code obtained by removing from a code obtained by encoding a sequence comprised of integer value samples obtained by dividing each sample of the sample sequence in the frequency domain by the gain corresponding to the gain code obtained in the first code amount estimator using an encoding method based on periodicity, a code corresponding to a code amount by which a code amount of the code obtained by encoding exceeds the amount of allocated code; and implement a comparison selector that
when the index represents that the periodicity is high and an evaluation indicator G2=DA−DB+γ(CB−CA) is positive, where B is the amount of allocated code, CA is a value obtained from the estimate value of the code amount of the integer signal code obtained in the first code amount estimator, CB is a value obtained from the estimate value of the code amount of the second integer signal code obtained in the second code amount estimator, DA is a sum of absolute values of amplitudes of integer value samples corresponding to the code removed to obtain the integer signal code, the code corresponding to a code amount by which the code amount of the code obtained by encoding exceeds the amount of allocated code, DB is a sum of absolute values of amplitudes of integer value samples corresponding to the code removed to obtain the second integer signal code, the code corresponding to a code amount by which the code amount of the code obtained by encoding exceeds the amount of allocated code, and γ is a positive value defined in advance, outputs the second integer signal code and the gain code obtained in the first code amount estimator, the second integer signal code being obtained by removing from a code obtained by encoding a sequence comprised of integer value samples obtained by dividing each sample of the sample sequence in the frequency domain by the gain corresponding to the gain code using an encoding method which is not based on periodicity, a code corresponding to a code amount by which the code amount of the code obtained by encoding exceeds the amount of allocated code, when the index represents that the periodicity is high and the evaluation indicator G2 is negative, outputs an integer signal code and the gain code obtained in the first code amount estimator, the integer signal code being obtained by removing from a code obtained by encoding a sequence comprised of integer value samples obtained by dividing each sample of the sample sequence in the frequency domain by the gain corresponding to the gain code using an encoding method based on periodicity, a code corresponding to a code amount by which the code amount of the code obtained by encoding exceeds the amount of allocated code, when the index represents that the periodicity is low and a second evaluation indicator G2=DA−DB+γ (CB−CA) is negative, where B is the amount of allocated code, CB is a value obtained from the estimate value of the code amount of the integer signal code obtained in the first code amount estimator, CA is a value obtained from the estimate value of the code amount of the second integer signal code obtained in the second code amount estimator, DB is a sum of absolute values of amplitudes of integer value samples corresponding to the code removed to obtain the integer signal code, the code corresponding to a code amount by which the code amount of the code obtained by encoding exceeds the amount of allocated code, DA is a sum of absolute values of amplitudes of integer value samples corresponding to the code removed to obtain the second integer signal code, the code corresponding to a code amount by which the code amount of the code obtained by encoding exceeds the amount of allocated code, and γ is a positive value defined in advance, outputs a second integer signal code and the gain code obtained in the first code amount estimator, the second integer signal code being obtained by removing from a code obtained by encoding a sequence comprised of integer value samples obtained by dividing each sample of the sample sequence in the frequency domain by the gain corresponding to the gain code using an encoding method based on periodicity, a code corresponding to a code amount by which the code amount of the code obtained by encoding exceeds the amount of allocated code, and when the index represents that the periodicity is low, and the second evaluation indicator G2 is positive, outputs an integer signal code and the gain code obtained in the first code amount estimator, the integer signal code being obtained by removing from a code obtained by encoding a sequence comprised of integer value samples obtained by dividing each sample of the sample sequence in the frequency domain by the gain corresponding to the gain code using an encoding method which is not based on periodicity, a code corresponding to a code amount by which the code amount of the code obtained by encoding exceeds the amount of allocated code.

22. The encoder according to any of claims 16, 18, 19, 20, and 21, the processing circuitry being further configured to implement an additional coder that outputs an additional code obtained by encoding information corresponding to neither the integer signal code or the second integer signal code output from the comparison selector nor the gain code among information comprised in the sample sequence in the frequency domain.

23. An encoding method comprising:
a frequency domain sample sequence generation step of obtaining a sample sequence in a frequency domain deriving from an acoustic signal for each predetermined time segment;
a periodicity analysis step of calculating an index indicating a degree of periodicity of the sample sequence in the frequency domain;
a first code amount estimation step of
when the index represents that the periodicity is high, obtaining through loop processing, an estimate value of a code amount of an integer signal code obtained by encoding a sequence comprised of integer value samples obtained by dividing each sample of the sample sequence in the frequency domain by a gain using an encoding method based on periodicity, and
otherwise, obtaining through loop processing, an estimate value of a code amount of an integer signal code obtained by encoding a sequence comprised of integer value samples obtained by dividing each sample of the sample sequence in the frequency domain by a gain using an encoding method which is not based on periodicity;
a second code amount estimation step of
when the index represents that the periodicity is high, obtaining an estimate value of a code amount of a second integer signal code obtained by encoding a sequence comprised of integer value samples obtained in the first code amount estimation step using an encoding method which is not based on periodicity, and
otherwise, obtaining an estimate value of a code amount of a second integer signal code obtained by encoding a sequence comprised of integer value samples obtained in the first code amount estimation step using an encoding method based on periodicity; and
a comparison and selection encoding step of
when the index represents that the periodicity is high and a value obtained by adding a code amount of side information to the estimate value of the code amount of the integer signal code obtained in the first code amount estimation step is greater than the estimate value of the code amount of the second integer signal code obtained in the second code amount estimation step, outputting a second integer signal code obtained by encoding a sequence comprised of integer value samples obtained in the first code amount estimation step using an encoding method which is not based on periodicity, wherein the side information includes at least one of information representing periodicity of the acoustic signal, information representing basic frequency, or information representing an interval between a sample corresponding to the periodicity or the basic frequency of the acoustic signal and a sample corresponding to an integral multiple of the periodicity or the basic frequency of the acoustic signal,
when the index represents that the periodicity is high and the value obtained by adding the code amount of the side information to the estimate value of the code amount of the integer signal code obtained in the first code amount estimation step is smaller than the estimate value of the code amount of the second integer signal code obtained in the second code amount estimation step, outputting an integer signal code obtained by encoding a sequence comprised of integer value samples obtained in the first code amount estimation step using an encoding method based on periodicity,
when the index represents that the periodicity is low and the estimate value of the code amount of the integer signal code obtained in the first code amount estimation step is greater than a value obtained by adding the code amount of the side information to the estimate value of the code amount of the second integer signal code obtained in the second code amount estimation step, outputting a second integer signal code obtained by encoding a sequence comprised of integer value samples obtained in the first code amount estimation step using an encoding method based on periodicity, and when the index represents that the periodicity is low and the estimate value of the code amount of the integer signal code obtained in the first code amount estimation step is smaller than the value obtained by adding the code amount of the side information to the estimate value of the code amount of the second integer signal code obtained in the second code amount estimation step, outputting an integer signal code obtained by encoding a sequence comprised of integer value samples obtained in the first code amount estimation step using an encoding method which is not based on periodicity.

24. An encoder comprising:

a frequency domain sample sequence generation part that obtains a sample sequence in a frequency domain deriving from an acoustic signal for each predetermined time segment;

a periodicity analyzer that calculates an index indicating a degree of periodicity of the sample sequence in the frequency domain;

a first code amount estimator that when the index represents that the periodicity is high, obtains through loop processing, an estimate value of a code amount of an integer signal code obtained by encoding a sequence comprised of integer value samples obtained by dividing each sample of the sample sequence in the frequency domain by a gain using an encoding method based on periodicity, and otherwise, obtains through loop processing, an estimate value of a code amount of an integer signal code obtained by encoding a sequence comprised of integer value samples obtained by dividing each sample of the sample sequence in the frequency domain by a gain using an encoding method which is not based on periodicity;

a second code amount estimator that when the index represents that the periodicity is high, obtains an estimate value of a code amount of a second integer signal code obtained by encoding a sequence comprised of integer value samples obtained in the first code amount estimator using an encoding method which is not based on periodicity, and otherwise, obtains an estimate value of a code amount of a second integer signal code obtained by encoding a sequence comprised of integer value samples obtained in the first code amount estimator using an encoding method based on periodicity; and a comparison and selection coder that when the index represents that the periodicity is high and a value obtained by adding a code amount of side information to the estimate value of the code amount of the integer signal code obtained in the first code amount estimator is greater than the estimate value of the code amount of the second integer signal code obtained in the second code amount estimator, outputs a second integer signal code obtained by encoding a sequence comprised of integer value samples obtained in the first code amount estimator using an encoding method which is not based on periodicity, wherein the side information includes at least one of information representing periodicity of the acoustic signal, information representing basic frequency, or information representing an interval between a sample corresponding to the periodicity or the basic frequency of the acoustic signal and a sample corresponding to an integral multiple of the periodicity or the basic frequency of the acoustic signal, when the index represents that the periodicity is high and the value obtained by adding the code amount of the side information to the estimate value of the code amount of the integer signal code obtained in the first code amount estimator is smaller than the estimate value of the code amount of the second integer signal code obtained in the second code amount estimator, outputs an integer signal code obtained by encoding a sequence comprised of integer value samples obtained in the first code amount estimator using an encoding method based on periodicity, when the index represents that the periodicity is low and the estimate value of the code amount of the integer signal code obtained in the first code amount estimator is greater than a value obtained by adding the code amount of the side information to the estimate value of the code amount of the second integer signal code obtained in the second code amount estimator, outputs a second integer signal code obtained by encoding a sequence comprised of integer value samples obtained in the first code amount estimator using an encoding method based on periodicity, and when the index represents that the periodicity is low and the estimate value of the code amount of the integer signal code obtained in the first code amount estimator is smaller than the value obtained by adding the code amount of the side information to the estimate value of the code amount of the second integer signal code obtained in the second code amount estimator, outputs an integer signal code obtained by encoding a sequence comprised of integer value samples obtained in the first code amount estimator using an encoding method which is not based on periodicity.

25. An encoder comprising:

processing circuitry configured to obtain a sample sequence in a frequency domain deriving from an acoustic signal for each predetermined time segment;

calculate an index indicating a degree of periodicity of the sample sequence in the frequency domain;

implement a first code amount estimator that when the index represents that the periodicity is high, obtains through loop processing, an estimate value of a code amount of an integer signal code obtained by encoding a sequence comprised of integer value samples obtained by dividing each sample of the sample sequence in the frequency domain by a gain using an encoding method based on periodicity, and otherwise, obtains through loop processing, an estimate value of a code amount of an integer signal code obtained by encoding a sequence comprised of integer value samples obtained by dividing each sample of the sample sequence in the frequency domain by a gain using an encoding method which is not based on periodicity;

implement a second code amount estimator that
  when the index represents that the periodicity is high, obtains an estimate value of a code amount of a second integer signal code obtained by encoding a sequence comprised of integer value samples obtained in the first code amount estimator using an encoding method which is not based on periodicity, and
  otherwise, obtains an estimate value of a code amount of a second integer signal code obtained by encoding a sequence comprised of integer value samples obtained in the first code amount estimator using an encoding method based on periodicity; and
implement a comparison and selection coder that
  when the index represents that the periodicity is high and a value obtained by adding a code amount of side information to the estimate value of the code amount of the integer signal code obtained in the first code amount estimator is greater than the estimate value of the code amount of the second integer signal code obtained in the second code amount estimator, outputs a second integer signal code obtained by encoding a sequence comprised of integer value samples obtained in the first code amount estimator using an encoding method which is not based on periodicity, wherein the side information includes at least one of information representing periodicity of the acoustic signal, information representing basic frequency, or information representing an interval between a sample corresponding to the periodicity or the basic frequency of the acoustic signal and a sample corresponding to an integral multiple of the periodicity or the basic frequency of the acoustic signal,
  when the index represents that the periodicity is high and the value obtained by adding the code amount of the side information to the estimate value of the code amount of the integer signal code obtained in the first code amount estimator is smaller than the estimate value of the code amount of the second integer signal code obtained in the second code amount estimator, outputs an integer signal code obtained by encoding a sequence comprised of integer value samples obtained in the first code amount estimator using an encoding method based on periodicity,
  when the index represents that the periodicity is low and the estimate value of the code amount of the integer signal code obtained in the first code amount estimator is greater than a value obtained by adding the code amount of the side information to the estimate value of the code amount of the second integer signal code obtained in the second code amount estimator, outputs a second integer signal code obtained by encoding a sequence comprised of integer value samples obtained in the first code amount estimator using an encoding method based on periodicity, and
  when the index represents that the periodicity is low and the estimate value of the code amount of the integer signal code obtained in the first code amount estimator is smaller than the value obtained by adding the code amount of the side information to the estimate value of the code amount of the second integer signal code obtained in the second code amount estimator, outputs an integer signal code obtained by encoding a sequence comprised of integer value samples obtained in the first code amount estimator using an encoding method which is not based on periodicity.

26. The encoding method according to claim 2 or 23, further comprising
  an additional encoding step of outputting an additional code obtained by encoding information corresponding to neither the integer signal code or the second integer signal code output in the comparison and selection encoding step among information comprised in the sample sequence in the frequency domain.

27. The encoder according to claim 9 or 24, further comprising
  an additional coder that outputs an additional code obtained by encoding information corresponding to neither the integer signal code or the second integer signal code output from the comparison and selection coder among information comprised in the sample sequence in the frequency domain.

28. The encoder according to claim 17 or 25, the processing circuitry being further configured to implement
  an additional coder that outputs an additional code obtained by encoding information corresponding to neither the integer signal code or the second integer signal code output from the comparison and selection coder among information comprised in the sample sequence in the frequency domain.

* * * * *

UNITED STATES PATENT AND TRADEMARK OFFICE
CERTIFICATE OF CORRECTION

PATENT NO. : 9,524,725 B2
APPLICATION NO. : 14/423581
DATED : December 20, 2016
INVENTOR(S) : Takehiro Moriya et al.

It is certified that error appears in the above-identified patent and that said Letters Patent is hereby corrected as shown below:

In the Claims

Column 54, Line 31, Claim 4, insert after "first encoding step of" the following text:
--when the index represents that the periodicity is high, obtaining through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code determined in advance, and
    otherwise, obtaining through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;
    a second encoding step of
    when the index represents that the periodicity is high, obtaining a second integer signal code by removing from a code obtained by encoding a sequence comprised of integer value samples obtained by dividing each sample of the sample sequence in the frequency domain by the gain corresponding to the gain code obtained in the first encoding step using an encoding method which is not based on periodicity, a code corresponding to a code amount by which a code amount of the code obtained by encoding exceeds the amount of allocated code, and
    otherwise, obtaining a second integer signal code by removing from a code obtained by encoding a sequence comprised of integer value samples obtained by dividing each--.

Signed and Sealed this
Twenty-third Day of October, 2018

Andrei Iancu
*Director of the United States Patent and Trademark Office*

CERTIFICATE OF CORRECTION (continued)
U.S. Pat. No. 9,524,725 B2

Column 55, Lines 3-42, Claim 4, delete the following text in its entirety:
"when the index represents that the periodicity is high, obtaining through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method based on periodicity, a code corresponding to a code amount by which a code amount of the code obtained by encoding exceeds an amount of allocated code determined in advance, and otherwise, obtaining through loop processing, a gain code corresponding to a gain used for dividing each sample of the sample sequence in the frequency domain and an integer signal code obtained by removing from a code obtained by encoding a sequence comprised of integer value samples obtained by dividing each sample of the sample sequence in the frequency domain by the gain using an encoding method which is not based on periodicity, a code corresponding to a code amount by which a code amount of the code obtained by encoding exceeds the amount of allocated code;

a second encoding step of
   when the index represents that the periodicity is high, obtaining a second integer signal code by removing from a code obtained by encoding a sequence comprised of integer value samples obtained by dividing each sample of the sample sequence in the frequency domain by the gain corresponding to the gain code obtained in the first encoding step using an encoding method which is not based on periodicity, a code corresponding to a code amount by which a code amount of the code obtained by encoding exceeds the amount of allocated code, and otherwise, obtaining a second integer signal code by removing from a code obtained by encoding a sequence comprised of integer value samples obtained by dividing each".

Column 56, Line 49, Claim 5, change "G1=–FA×(B–CA)FB×(B–CB)" to
--G1=–FA×(B–CA)+FB×(B–CB)--.

Column 68, Line 61, Claim 15, change "step of the encoding method according to any of claims 1," to --step of the encoding method according to any of claims 1, 2,--.